United States Patent [19]
Kobayashi et al.

[11] Patent Number: 5,257,053
[45] Date of Patent: Oct. 26, 1993

[54] POSITION DETECTING DEVICE

[75] Inventors: Takeo Kobayashi, Tokyo; Yasushi Tabata, Chiba; Norio Numako, Tochigi; Katsutoshi Nagai, Saitama, all of Japan

[73] Assignee: Asahi Kogaku Kogyo Kabushiki Kaisha, Tokyo, Japan

[21] Appl. No.: 877,399

[22] Filed: Apr. 30, 1992

Related U.S. Application Data

[63] Continuation of Ser. No. 374,347, Jun. 30, 1989, abandoned.

[30] Foreign Application Priority Data

| Jun. 30, 1988 | [JP] | Japan | 63-87118 |
| Jun. 30, 1988 | [JP] | Japan | 63-87119 |
| Jun. 30, 1988 | [JP] | Japan | 63-87120 |
| Jun. 30, 1988 | [JP] | Japan | 63-163895 |
| Jun. 30, 1988 | [JP] | Japan | 63-163896 |
| Jun. 30, 1988 | [JP] | Japan | 63-163897 |
| Jun. 30, 1988 | [JP] | Japan | 63-163898 |
| Jun. 30, 1988 | [JP] | Japan | 63-163899 |

[51] Int. Cl.⁵ .......................... G03B 1/18; G03B 13/00
[52] U.S. Cl. ................ 354/195.1; 354/289.1; 354/195.12
[58] Field of Search ........... 354/195.1, 195.11, 195.12, 354/286, 289.1, 484, 289.11, 289.12, 195.13, 471, 474, 475

[56] References Cited

U.S. PATENT DOCUMENTS

| 4,397,533 | 8/1983 | Naruse et al. | 354/289.1 |
| 4,540,262 | 9/1985 | Nakai et al. | 354/195.13 |
| 4,575,212 | 3/1986 | Kitaura et al. | 354/409 |
| 4,639,108 | 1/1987 | Sakai et al. | 354/289.1 |
| 4,724,465 | 2/1988 | Ishimura et al. | 354/484 |
| 4,740,064 | 4/1988 | Kono et al. | 350/429 |
| 4,864,344 | 9/1989 | Arakawa et al. | 354/195.1 |

FOREIGN PATENT DOCUMENTS

| 3611784 | 1/1987 | Fed. Rep. of Germany . |
| 58-208733 | 5/1983 | Japan . |
| 930582 | 7/1963 | United Kingdom . |
| 1307017 | 2/1973 | United Kingdom . |
| 2010034 | 6/1979 | United Kingdom . |
| 1590922 | 6/1981 | United Kingdom . |

*Primary Examiner*—Michael L. Gellner
*Assistant Examiner*—Cassandra Spyrou
*Attorney, Agent, or Firm*—Sandler Greenblum & Bernstein

[57] ABSTRACT

A position detecting arrangement for detecting the position of a movable member relative to a reference position. The arrangement is particularly adapted for use in connection with electronically controlled cameras which include a zoom lens and includes a code information carrier which is able to transmit information indicative of a plurality of codes, at least one of the codes being used a plurality of times for identifying more than one position of the zoom lens, i.e., more than one focal length of the lens. The use of such "relative" codes permits the camera to be made more compact. However, the disclosed invention includes an arrangement for retaining a given number of "position" codes which correspond to the actual position of the lens, to thereby enable the camera to retain a given degree of accuracy in its object-distance-measuring unit for focusing the zoom lens.

50 Claims, 40 Drawing Sheets

Fig. 28

Distance-Measuring Steps, Lens Latches & Focusing Positions

| Distance-measuring step | (m) | (ZOOM) LENS LATCH | (m) | (TELE/MACRO) LENS LATCH | (m) |
|---|---|---|---|---|---|
| 1 | 5 | ZOOM 1 | 9 | TELE 1 | 9 |
| 2 | 3.7 | ZOOM 3 | 4 | TELE 3 | 4 |
| 3 | 3.0 | ZOOM 4 | : | TELE 4 | : |
| 4 | | ZOOM 5 | : | TELE 5 | : |
| 5 | | ZOOM 6 | : | TELE 6 | : |
| 6 | | ZOOM 7 | : | TELE 7 | : |
| 7 | | ZOOM 8 | : | TELE 8 | : |
| 8 | | ZOOM 9 | : | TELE 9 | : |
| 9 | | ZOOM 10 | : | TELE 10 | : |
| 10 | | ZOOM 11 | : | TELE 11 | : |
| 11 | | ZOOM 12 | : | TELE 12 | : |
| 12 | | ZOOM 13 | : | TELE 13 | : |
| 13 | | ZOOM 14 | : | TELE 14 | : |
| 14 | | ZOOM 15 | : | TELE 15 | : |
| 15 | 1.0 | ZOOM 16 | : | TELE 16 | : |
| 16 | | ZOOM 17 | : | MACRO 1 | 0.96 |
| 17 | | ZOOM 18 | : | MACRO 1 | 0.96 |
| 18 | 0.90 | ZOOM 19 | 0.92 | MACRO 2 | 0.92 |
| 19 | | Warning & release lock | | MACRO 3 | : |
| 20 | | Warning & release lock | | MACRO 4 | : |
| 21 | | Warning & release lock | | MACRO 5 | : |
| 22 | | Warning & release lock | | MACRO 6 | : |
| 23 | | Warning & release lock | | MACRO 7 | : |
| 24 | | Warning & release lock | | MACRO 8 | : |
| 25 | | Warning & release lock | | MACRO 9 | : |
| 26 | | Warning & release lock | | MACRO 10 | : |
| 27 | | Warning & release lock | | MACRO 11 | : |
| 28 | | Warning & release lock | | MACRO 12 | : |
| 29 | | Warning & release lock | | MACRO 13 | : |
| 30 | | Warning & release lock | | MACRO 14 | : |
| 31 | | Warning & release lock | | MACRO 15 | : |
| 32 | | Warning & release lock | | MACRO 16 | : |
| 33 | | Warning & release lock | | MACRO 17 | : |
| 34 | | Warning & release lock | | MACRO 18 | : |
| 35 | 0.5 | Warning & release lock | | MACRO 19 | 0.5 |
| 36 | | Warning & release lock | | Warning MACRO 19 | 0.5 |

POSITION DETECTING DEVICE

This application is a continuation of application Ser. No. 07/374,347, filed Jun. 30, 1989, now abandoned.

BACKGROUND OF THE DISCLOSURE

1. Field of the Invention

The present invention relates to a position detecting arrangement for detecting the position of a movable member relative to a reference position and, more particularly, the present invention relates to an electrically moved zoom lens of a camera having a lens position detecting device for electrically detecting changes in the focal length of the zoom lens associated with a zooming operation.

2. Discussion of Background Information

In a camera equipped with a zoom lens, it is necessary to know the F-number of the zoom lens so that a proper exposure can be calculated. In addition, if the camera has a power zoom lens, the focal length setting must be known so that the camera can control the zooming operation.

A conventional solution to the above problems has been to provide the zoom lens with a code plate located on a cam ring for driving the zoom lens for integral rotation therewith. In such an arrangement, brushes are provided in slidable contact with the code plate for generating a position code that corresponds to the focal length of the lens in dependence upon the zoom code detected as a result of a conductive state between a ground brush that is normally in contact with the conductive pattern of the code plate and code brushes that come into contact with the code plate during switching between conductive areas and non-conductive areas of the code plate as the cam ring is rotated.

Each code brush generates a 1-bit signal that depends on the conductive and non-conductive state of the code plate so that when several such brushes are employed, a multi-bit zoom code signal is produced. However, since the brushes and the code plate form a mechanical configuration, the code brushes can become separated from the code plate and not make proper electrical contact due to external causes, such as vibrations or dust, dirt, or other foreign matter on the contact surfaces. In such a case, the resulting position code that is calculated from the detected zoom code will not correspond to the actual lens position.

In addition, in determining the position code of the lens (i.e., the focal length of the lens), the exposure control is likely to be improperly set if the position code is not accurately stepped. For example, in a camera having a lens with a range of approximately 35 mm to 60 mm, the camera should preferably have about fifteen position codes to ensure that the exposure is properly calculated.

In a conventional camera, one zoom code corresponds to one position code. That is, an absolute code system is used in which each step of the zoom code has a unique value that is specific to that step and, therefore, is specific to a particular position of the zoom lens.

However, a problem associated with such an arrangement is that if the zoom code is set as an absolute code over the entire range of the zoom lens, the number of brushes that are used in association with the code plate must be increased, resulting in a more complicated code plate structure.

For instance, if information in fifteen steps is to be detected, at least four-bits of information are necessary for the generation of the zoom code. Thus, five brushes would be required, which includes one brush for ground, to cooperate with the code plate. While it is desirable to minimize the number of brushes that are required, so as to produce a more compact camera, it is not practical to reduce the number of steps of the position code.

Some electronically controlled cameras include macro and normal photographing functions which are switchable between a macro mode and a normal mode by a manual switch operation. In either mode, photographing is accomplished by autofocus in accordance with distance measuring information. A particular camera of this type is one in which the normal mode is constituted by a zoom mode and the camera is switchable between the zoom mode and the macro mode, whereby the lens moves to and stops at a macro position when the macro mode is selected by means of the manual switch and whereby the zoom lens moves to and stops within the zoom range when the zoom mode is selected by means of the manual switch. When the lens is in the zoom mode, operation of a wide switch or a tele switch moves the zoom lens accordingly toward the wide extremity of the zoom range or toward the tele extremity of the zoom range, respectively.

The distance between the subject to be photographed and the camera, as well as the subject light intensity, are measured when the zoom lens is set to a desired position and the shutter button is operated. Based upon the result of the distance measurement, autofocus is effected in both the macro mode and the zoom mode. Photographing is also done in dependence upon the result of the light measurement.

In conventional electronically controlled cameras, if the subject is found to lie within a range where focusing is impossible while in the macro mode, which is set by the manual switch thereby placing the zoom lens in the macro position, photographing can only be effected by manually switching from the macro mode to the zoom mode. This requirement, of course, creates a considerable inconvenience since a quick response is virtually impossible to achieve which can be necessary to obtain the photograph which had been composed.

Applicants have recognized, therefore, that when the distance measurement is made when the lens is placed in the macro position by operation of the manual switch, it would be desirable to automatically effect switching from the macro mode to the zoom mode so that a subject which cannot be photographed in the macro mode can be automatically photographed in the zoom mode.

A problem encountered with such automatic switching, however, is that if the lens is shifted from a macro position to a normal position (zoom position, e.g.), a desired photograph which had been composed in the macro mode cannot be obtained due to the parallax which exists between the lens and the viewfinder of the camera.

Another problem encountered with automatic cameras which are designed to perform autofocus photographing in either a macro mode or a zoom mode is the possibility of not being able to accomplish photographing in either mode due to subject distance measurement errors.

For example, assume that autofocus is designed to be performed in the zoom mode for a subject distance range of 0.90 meters to infinity (i.e., 0.90 m−∞). and in the macro mode for a subject distance range of 0.50 m–0.90 m. Further, assume that the lens is set to the zoom position by means of the manual switch and that the distance measurement made by the camera is 0.89 m for an object positioned at that distance. In such a case, the object distance is outside of the aforementioned focusing range, so that a photograph cannot be obtained. In this situation, conventional cameras provide the photographer with a warning indication that a properly focused photograph cannot be obtained, instructing the photographer to switch to the macro mode, or a release lock is operated to prevent release of the shutter, even if the shutter button is operated.

In response the photographer switches the camera to the macro mode by means of the manual switch. However, for the object positioned at the same distance of 0.89 m, it is conceivable that the distance measurement made by the camera can erroneously result in a value of 0.91 m. In this case, the photographer is warned that a properly focused photograph cannot be made, or is prevented from releasing the shutter due to a release lock operation, even in the macro mode.

This predicament is, of course, not desirable and is particularly serious when the automatic camera is provided with a release lock capability which renders impossible the taking of photographs within a certain subject distance range.

Another problem relates to cameras having a built-in strobe unit. A recent trend is to provide a camera with a so-called auto strobe capability in which the camera judges whether to cause the strobe to flash automatically when an exposure value is below a preset level.

Such auto strobe cameras are typically designed to illuminate a red lamp indicator during the charging operation so that the user is warned to wait until the charging is finished, or merely to warn the user that the charging is not yet done and that the strobe is not ready when the shutter button is depressed.

An ideal arrangement would be to provide an auto strobe camera in which the photographer is allowed to shoot pictures without having to pay attention to the charging of the strobe. In practice, a red lamp indicator is either kept lit during the charging cycle regardless of whether the photographer actually intends to take a picture, or turned on if the strobe is not ready at the time when the shutter button is operated and kept lit regardless of whether the charging of the strobe has been finished. That is, the problem has been such that the red lamp indicator is illuminated to inform the photographer to wait for shooting, even when the photographer has no intention in pressing the shutter button for shooting, or that there is no indication of when shooting is ready, although the photographer is waiting for the strobe to become ready.

Still another problem with prior electronically controlled cameras concerns the liquid crystal display which indicates the different operating states of the camera. Such an indicator provides information on the frame number of the film loaded in the camera, the focal length of the zoom lens, the picture taking mode of the camera, the status of the battery in the camera, and the status of the film loading operation, for example.

However, only a limited amount of space is available on the camera body for such an indicator. If one attempts to provide a display panel that can display all of the desired information at one time, each indicator on the display panel would tend to be so small as to be illegible. Thus, some cameras do not display all of the information, and merely display the information that the camera manufacturer considers to be the most important to the average photographer. However, this practice deprives some photographers who prefer to have all necessary information available to them prior to taking a photograph.

Some electronically controlled cameras are equipped with a back cover closing detector switch which detects the closing of the back cover after the cover is opened and film is loaded in the camera. In response to the detection of the closing of the back cover, the main CPU of the camera drives the film advance motor to effect the "blank-shot" advance of a certain number of film frames.

Problems exist with back cover closing switches, particularly with regard to manufacturing difficulties and operational unreliability. Applicants have determined that it is preferable to use a software substitute for minimizing the number of parts such as switches that are required for film travel for enabling an improved assembling efficiency, while also making the operation of the blank-shot film advance more reliable.

SUMMARY OF THE INVENTION

In view of the state of the prior art as discussed above, it is an object of the present invention is to reduce the number of brushes that are required in determining the position of a camera zoom lens, without decreasing the number of position code steps, by employing a relative code system in which a given zoom code corresponds to a plurality of position codes. Such a system does not permit one position code to correspond to one focal length. Consequently, a means is provided whereby a current position code is determined by sequentially rewriting the position code that is stored in a memory by dynamically detecting changes in the zoom code that are counted from the range where the zoom code is an absolute code.

With a camera that would employ a relative zoom code system, however, if the battery in the camera is removed or the battery voltage drops below a predetermined level, the position code data stored in the memory could be lost and determining the correct focal length of the lens, i.e., the correct position code, would present a problem.

Accordingly, an additional object of the present invention is to design a relative zoom code system in which the camera can automatically determine a correct position code even if the data that was stored in the memory is lost.

The present invention has, as a still further object, the provision of a zoom position detecting device for a zoom lens which can detect the generation of an erroneous zoom code and take corrective action so as not to use the erroneously generated zoom code.

In order to achieve this object, a control means uses a presently identified zoom code to estimate a zoom code to be obtained when the lens is moved to a wide extremity or a tele extremity. The control circuit examines whether a zoom code generated from the code brushes coincides with the estimated change. If the estimated change is equal to the zoom code generated by the brushes, the lens has been moved to a position that corresponds to the zoom code after the change due to the zooming operation. If the estimated zoom code differs from the code brush generated zoom code, the zoom code generated after the zooming operation may be due to a separation of at least one brush from the code plate. If it is determined that a brush is separated from and not in electrical contact with the code plate, a decision is made that there has been no zoom code change.

In view of the above, the present invention comprises a position detecting arrangement for detecting the position of a movable member relative to a reference position, the position detecting device including a code information carrier having means associated therewith indicative of a plurality of codes, each of the codes including more than one bit of information, and means indicative of at least one unique position having a predetermined positional relation to the means indicative of a plurality of codes; a code identifying device being operatively associated with the code information carrier for movement relative thereto for identifying one of the codes of the means indicative of a plurality of relative codes of the code information carrier; and means for recognizing changes of code information identified by the code identifying device as the movable member moves relative to the reference position, wherein one of the code information carrier and the code identifying device is relatively fixed, thereby defining the reference position, and the other of the code information carrier and the code identifying device is fixed for movement with the movable member for relative movement with respect to the one.

According to a particular aspect of the invention, the means for recognizing changes of code information includes means for counting changes of code information.

According to an additional aspect of the invention, the code identifying device is a pick-up member and the operative association of the code identifying device and the code information carrier comprises the pick-up member being in slidable contact with the code information carrier.

According to a still further aspect of the invention, the means for recognizing changes of code information includes means for recognizing the position of each piece of code information relative to the means indicative of a unique position.

Still further, the invention includes means for inhibiting the movable member from being stopped in at least one of the unique positions.

Still further, the invention includes means for controlling movement of the movable member to a predetermined initial position in response to a code identified by the code identifying device, the means for controlling including (i) means for temporarily storing a position value of the movable member with respect to the reference position, based upon code information identified by the code identifying device; (ii) means for controlling the movable member to move in a predetermined manner to the initial position, based upon the value of the code information temporarily stored; (iii) means for updating the value of the position value to a value corresponding to the initial position; (iv) means for determining whether the temporarily stored position value corresponds to one of the at least one unique position and, if the temporarily stored position value does correspond, the means for controlling the movable member does not move the movable member and, if the temporarily stored position value does not correspond, the means for controlling the movable member moves the movable member to the initial position.

The invention still further includes means for determining whether the temporarily stored position value coincides with an actual position of the movable member with respect to the reference position; means for indicating the actual position of the movable member with respect to the reference position; and means for inhibiting the means for indicating the actual position of the movable member if the value of the temporarily stored information does not coincide with the actual position of the movable member with respect to the reference position.

Still further, the invention includes means for verifying the identification of code information identified by the code identifying device, wherein the code identifying device further includes means for repeatedly identifying code information, wherein the means for verifying the identification of code information further includes means for comparing the code information repeatedly identified a plurality of times until the information identified coincides a predetermined plurality of times.

Additionally, the invention includes means for assigning a value of a position code, which is indicative of a predetermined position of the movable member with respect to the reference position, in response to changes recognized by the means for recognizing changes of code information during movement of the movable member.

In a still further aspect of the invention, the means for recognizing changes of code information includes means (i) for temporarily storing an estimated predetermined code value and (ii) for determining whether the value of a code identified by the code identifying device, after the value is changed during movement of the movable member, coincides with the estimated code value, wherein the means for assigning a value of a position code further includes assigning a position code value when the changed code value coincides with the estimated code value.

The present invention further includes means for displaying the indication of any of a plurality of predetermined positions of the movable member with respect to the reference position; means for inhibiting operation of the means for displaying the indication when the changed code value does not coincide with the estimated code value; means for determining, if the changed code value does not coincide with the estimated code value, whether the changed value is indicative of one the at least one unique position; and means for assigning a position code value which is indicative of a particular position of the movable member with respect to the reference position if the changed value is indicative of one of the at least one unique position.

Still further, the invention includes means for determining, if the changed value is not indicative of one of the at least one unique position, thereby defining an error, whether the error is a result of a malfunction of the code identifying device.

The present invention can be further defined as a position detecting arrangement for detecting the position of a movable member relative to a reference position, the position detecting device including a code information carrier having means associated therewith for indicative of a plurality of codes, at least one of the codes being indicative of more than one position of the movable member relative to the reference position.

Additionally, the present invention is directed to the code information carrier itself which includes: (a) means indicative of a plurality of relative codes, each of the relative codes including more than one bit; and (b) means indicative of an absolute code being located in a predetermined positional relation to the means indicative of a plurality of relative codes.

Still further, the present invention is defined as a position detecting arrangement for detecting the position of a movable member relative to a reference position, the position detecting device including: (a) a code information carrier including: (a)(i) means indicative of a plurality of relative codes, each of the relative codes including more than one bit; and (a)(ii) means indicative of an absolute code being located in a predetermined positional relation to the means indicative of a plurality of relative codes; (b) a code identifying device being operatively associated with the code information carrier for movement relative thereto for identifying one of the relative codes and the absolute code; and (c) means for recognizing changes of code information identified by the code identifying device as the movable member moves relative to the reference position, wherein one of the code information carrier and the code identifying device is relatively fixed, thereby defining the reference position, and the other of the code information carrier and the code identifying device is fixed for movement with the movable member for relative movement with respect to the one.

In a further aspect of the invention, the means indicative of a plurality of relative codes has at least one boundary, and wherein the means indicative of an absolute code which is located proximate the one boundary of the means indicative of a plurality of relative codes.

In an additional aspect of the invention, the means indicative of a plurality of relative codes includes a repeating pattern of code information in which at least one piece of code information is repeated a plurality of times on the code information carrier, and wherein the means for recognizing changes of code information includes means for recognizing the position of the at least one piece of code information relative to the means indicative of an absolute code.

In a still further aspect of the invention, the means indicative of a plurality of relative codes includes a lengthwise extending series of relative codes having a first end and a second end, and the means indicative of an absolute code includes means located proximate each of the one end and the second end of the means indicative of a plurality of relative codes, for identifying a respective unique reference position of the movable member.

The present invention is further defined as a position detecting arrangement for detecting the position of a movable member relative to a reference position, the movement being identifiable in terms of incremental steps of movement, the position detecting device including: (a) a code information carrier having means associated therewith indicative of a plurality of codes, each of the codes including more than one bit of information, and means indicative of at least one unique position having a predetermined positional relation to the means indicative of a plurality of codes; (b) a code identifying device being operatively associated with the code information carrier for movement relative thereto for identifying one of the codes of the means indicative of a plurality of relative codes of the code information carrier; (c) means for recognizing changes of code information identified by the code identifying device as the movable member moves relative to the reference position, wherein one of the code information carrier and the code identifying device is relatively fixed, thereby defining the reference position, and the other of the code information carrier and the code identifying device is fixed for movement with the movable member for relative movement with respect to the one; and (d) means for indicating each of the incremental steps of movement of the movable member relative to the reference position.

The present invention, in a further aspect, includes a memory for storing positional information obtained by the means for recognizing changes of code information; means for determining whether the positional information stored in the memory is lost therefrom; and means for moving the movable member to the unique position in case the positional information in the memory is lost therefrom.

In a still further aspect of the invention, the present invention includes a memory for storing positional information obtained by the means for recognizing changes of code information; means for determining whether the positional information stored in the memory is lost therefrom; and means for providing a warning indication in case to the information in the memory is lost therefrom.

In a particular aspect of the invention, a removable battery is provided as a power source, and the means for determining whether the information stored in the memory is lost includes means for determining whether a predetermined time has elapsed after removal of the battery.

The present invention is still further defined as a position detecting arrangement for detecting the position of a movable member relative to a reference position, including: (a) a code information carrier having means associated therewith indicative of a plurality of codes, each of the codes including more than one bit of information, the means indicative of a plurality of relative codes being arranged in a predetermined pattern of changes as the movable member moves relative to the reference position, and means indicative of a unique position having a predetermined positional relation to the means indicative of a plurality of codes; (b) a code identifying device being operatively associated with the code information carrier for movement relative thereto for identifying one of the codes of the means indicative of a plurality of relative codes of the code information carrier; and (c) means for recognizing changes of code information identified by the code identifying device as the movable member moves relative to the reference position, wherein one of the code information carrier and the code identifying device is relatively fixed, thereby defining the reference position, and the other of the code information carrier and the code identifying device is fixed for movement with the movable member for relative movement with respect to the one, and wherein the means for recognizing changes of code information identified by the code identifying device as the movable member moves relative to the reference position further includes means for detecting whether the change in the code identified by the code identifying device is consistent with the predetermined pattern.

According to a further aspect of the invention, a means is included for converting a recognized change of code information to a respective position code which corresponds to a respective particular position of the movable member relative to the reference position, whereby the recognized change of code information is converted to a respective position code only if the identified code change is consistent with the predetermined pattern.

Still further according to the invention, a means for indicating the position code and means for inhibiting operation of the means for indicating the position code if the identified code change is not consistent with the predetermined pattern are included.

The present invention is particularly adapted for incorporation or use with cameras. Accordingly, the present invention includes a position detecting arrangement for detecting the position of a movable member which moves in accordance with the variation of the focal length of a zoom lens of a camera, relative to a reference position which is predetermined on the camera, the position detecting arrangement including a code information carrier and a code identifying device, wherein the code information carrier includes (i) means indicative of a plurality of codes, each of the codes including more than one bit of information, and (ii) means indicative of at least one unique position having a predetermined positional relation to the means indicative of a plurality of codes; wherein the code identifying device is operatively associated with the code information carrier for movement relative thereto for identifying one of the codes of the means indicative of a plurality of relative codes of the code information carrier; and wherein the position detecting arrangement further includes means for recognizing changes of code information identified by the code identifying device as the zoom lens moves relative to the reference position.

Likewise, the present invention includes a position detecting arrangement for detecting the position of a zoom lens of a camera relative to a reference position, the camera including a cam ring which rotates to effect a variation in the focal length of the zoom lens, the position detecting device including a code information carrier having means associated therewith indicative of a plurality of codes, at least one of the codes being indicative of more than one position of the zoom lens relative to the reference position.

The present invention additionally includes a position detecting arrangement for detecting the position of a movable member which moves in accordance with the variation of the focal length of a zoom lens of a camera, relative to a reference position which is predetermined on the camera, the position detecting arrangement including a code information carrier and a code identifying device, wherein the code information carrier includes: (i) means indicative of a plurality of relative codes, each of the relative codes including more than one bit; and (ii) means indicative of an absolute code being located in a predetermined positional relation to the means indicative of a plurality of relative codes; wherein the code identifying device is operatively associated with the code information carrier for movement relative thereto for identifying one of the relative codes and the absolute code; and wherein the position detecting arrangement further includes means for recognizing changes of code information identified by the code identifying device as the zoom lens moves relative to the reference position.

Further, the present invention additionally includes a position detecting arrangement for detecting the position of a movable member which moves in accordance with the variation of the focal length of a zoom lens of a camera, relative to a reference position which is predetermined on the camera, in which the movement of the movable member is identifiable in terms of incremental steps of movement, the position detecting arrangement including a code information carrier and a code identifying device, wherein the code information carrier includes (i) means indicative of a plurality of codes, each of the codes including more than one bit of information, and (ii) means indicative of at least one unique position having a predetermined positional relation to the means indicative of a plurality of codes; wherein the code identifying device is operatively associated with the code information carrier for movement relative thereto for identifying one of the codes of the means indicative of a plurality of relative codes of the code information carrier; and wherein the position detecting arrangement further includes: (a) means for recognizing changes of code information identified by the code identifying device as the zoom lens moves relative to the reference position; and (b) means for indicating each of the incremental steps of movement of the zoom lens relative to the reference position.

The present invention, still further, includes a position detecting arrangement for detecting the position of a movable member which moves in accordance with the variation of the focal length of a zoom lens of a camera, relative to a reference position which is predetermined on the camera, the position detecting arrangement including a code information carrier and a code identifying device, wherein the code information carrier includes (i) means indicative of a plurality of codes, each of the codes including more than one bit of information, and (ii) means indicative of at least one unique position having a predetermined positional relation to the means indicative of a plurality of codes; wherein the code identifying device is operatively associated with the code information carrier for movement relative thereto for identifying one of the codes of the means indicative of a plurality of relative codes of the code information carrier; wherein the position detecting arrangement further includes: (a) means for recognizing changes of code information identified by the code identifying device as the zoom lens moves relative to the reference position, thereby determining the position of the zoom lens with respect to the reference position; (b) a memory for storing positional information obtained by the means for recognizing changes of code information; (c) means for determining whether the positional information stored in the memory is lost therefrom; and (d) a zoom motor operatively connected to the cam ring for moving the zoom lens to the unique position in case the positional information in the memory is lost therefrom.

Still further, the present invention additionally includes a position detecting arrangement for detecting the position of a movable member which moves in accordance with the variation of the focal length of a zoom lens of a camera, relative to a reference position which is predetermined on the camera, the position detecting arrangement including a code information carrier and a code identifying device, wherein the code information carrier includes (i) means indicative of a plurality of codes, each of the codes including more than one bit of information, and (ii) means indicative of at least one unique position having a predetermined positional relation to the means indicative of a plurality of codes; wherein the code identifying device is operatively associated with the code information carrier for movement relative thereto for identifying one of the codes of the means indicative of a plurality of relative codes of the code information carrier; wherein the position detecting arrangement further includes: (a) means for recognizing changes of code information identified by the code identifying device as the zoom lens moves relative to the reference position, thereby determining the position of the zoom lens with respect to the reference position; (b) a memory for storing positional information obtained by the means for recognizing changes of code information; (c) means for determining whether the positional information stored in the memory is lost therefrom; and (d) means for providing a warning indication in case to the information in the memory is lost therefrom.

Still further, the present invention additionally includes a position detecting arrangement for detecting the position of a movable member which moves in accordance with the variation of the focal length of a zoom lens of a camera, relative to a reference position which is predetermined on the camera, the position detecting arrangement including a code information carrier and a code identifying device, wherein the code information carrier includes (i) means indicative of a plurality of codes, each of the codes including more than one bit of information, the means indicative of a plurality of relative codes being arranged in a predetermined pattern of changes as the zoom lens moves relative to the reference position, and (ii) means indicative of a unique position which has a predetermined positional relation to the means indicative of a plurality of codes; wherein the code identifying device is operatively associated with the code information carrier for movement relative thereto for identifying one of the codes of the means indicative of a plurality of relative codes of the code information carrier; wherein the position detecting arrangement further includes means for recognizing changes of code information identified by the code identifying device as the zoom lens moves relative to the reference position, thereby determining the position of the zoom lens with respect to the reference position, and wherein the means for recognizing changes of code information identified by the code identifying device as the zoom lens moves relative to the reference position further includes means for detecting whether the change in the code identified by the code identifying device is consistent with the predetermined pattern.

More specifically, the invention is further definable as a power zoom unit for a camera including: (a) a zoom lens provided in an assembly for permitting focal length variation of the zoom lens; (b) a zoom motor; (c) a cam ring operatively connecting the zoom lens and the zoom motor for enabling the zoom motor to effect a variation in the focal length of the zoom lens assembly by changing the position of the zoom lens with respect to a reference position; (d) means for generating a zoom code including: (d)(i) a code plate provided on the cam ring and having a plurality of electrically conductive relative zoom lens position identifying areas and at least one absolute zoom lens position identifying area identifying the reference position; and (d)(ii) a plurality of brushes adapted to be fixedly mounted with respect to the body of the camera in sliding conductive contact with the code plate for generating a zoom code related to the position of the zoom lens; (e) means for counting changes in the zoom code with respect to the reference position identified by the absolute zoom lens position identifying area and for storing the counted changes as a position code corresponding to a predetermined focal length of the zoom lens; (f) switches for operating the zoom motor for driving the zoom lens in a predetermined manner; (g) means for controlling the zoom motor in response to the position code and as a function of the state of each of the switches for operating the zoom motor; and (h) means for correcting the means for controlling the zoom motor by rotating the cam ring to move the zoom lens to the reference position in response to a determination that the position code is lost from the means for storing the counted changes.

Likewise, the present invention is defined as a power zoom unit for a camera including: (a) a zoom lens provided in an assembly for permitting focal length variation of the zoom lens; (b) a zoom motor; (c) a cam ring operatively connecting the zoom lens and the zoom motor for enabling the zoom motor to effect a variation in the focal length of the zoom lens assembly by changing the position of the zoom lens with respect to a reference position; (d) means for generating a zoom code including: (d)(i) a code plate provided on the cam ring and having a plurality of electrically conductive relative zoom lens position identifying areas and at least one absolute zoom lens position identifying area identifying the reference position; and (d)(ii) a plurality of brushes adapted to be fixedly mounted with respect to the body of the camera in sliding conductive contact with the code plate for generating a zoom code related to the position of the zoom lens; (e) means for counting changes in the zoom code with respect to the reference position identified by the absolute zoom lens position identifying area and for storing the counted changes as a position code corresponding to a predetermined focal length of the zoom lens; and (f) means for indicating the predetermined focal lengths incrementally in response to incremental changes being counted by the means for counting changes in the zoom code.

Still further, the present invention is defined as a power zoom unit for a camera including: (a) a zoom lens provided in an assembly for permitting focal length variation of the zoom lens; (b) a zoom motor; (c) a cam ring operatively connecting the zoom lens and the zoom motor for enabling the zoom motor to effect a variation in the focal length of the zoom lens assembly by changing the position of the zoom lens with respect to a reference position; (d) means for generating a zoom code including: (d)(i) a code plate provided on the cam ring and having a plurality of electrically conductive relative zoom lens position identifying areas having a predetermined pattern along the code plate and at least one absolute zoom lens position identifying area identifying the reference position; and (d)(ii) a plurality of brushes adapted to be fixedly mounted with respect to the body of the camera in sliding conductive contact with the code plate for generating a zoom code related to the position of the zoom lens; (e) means for converting the zoom code to a position code which corresponds to respective focal length of the zoom lens; (f) means for storing a pattern of changes in the zoom code as the position of the zoom lens is changed with respect to the reference position; (g) means for determining whether the stored pattern of changes coincides with the predetermined pattern of relative zoom lens position identifying areas along the code plate; (h) means responsive to the determining means for further determining whether, if the stored pattern of changes does not coincide with the predetermined pattern of relative zoom lens position identifying areas along the code plate, the changes are due to any of the plurality of brushes are not in sliding conductive contact with the code plate; and (i) means for inhibiting conversion of the zoom code to the position code in response to the further determining means determining that the changes are due to any of the plurality of brushes not being in sliding conductive contact with the code plate.

Still further, the present invention is defined as a variable focal length lens camera including: (a) a movable lens; (b) a motor for driving the lens for movement through a plurality of positions in a first direction and in a second direction; (c) means for displaying an indication of the position at which the lens is positioned of the plurality of positions; (d) a code information carrier having a plurality of areas associated therewith indicative of a plurality of respective codes, each of the codes being indicative of at least one position of the lens; (e) a code identifying device being operatively associated with the code information carrier for movement relative thereto for identifying one of the codes of the plurality of areas indicative of a plurality of codes of the code information carrier; (f) means for controlling the motor for moving the lens in the first direction and in the second direction, the controlling means further including means for moving the lens a predetermined amount in one of the first direction and the second direction upon the stopping of movement of the lens in the other of the first direction and the second direction; and (g) means for inhibiting, for a predetermined amount of time, the means for displaying an indication of the position at which the lens is positioned upon the identification of one of the codes having crossed a boundary of one of the areas and an adjacent one of the areas once before stopping of the movement of the lens.

BRIEF DESCRIPTION OF THE DRAWINGS

The above and additional objects, characteristics, and advantages of the present invention will be further described in the following detailed description of preferred embodiments, with reference to the accompanying drawings, which are given by way of non-limiting examples, in which:

FIG. 28 is a table that shows the relationship between a distance-measuring step and a lens latch when the camera constructed according to the preferred embodiment is in a zoom mode and a macro mode;

DETAILED DESCRIPTION OF THE PREFERRED EMBODIMENTS

Figure 1A:
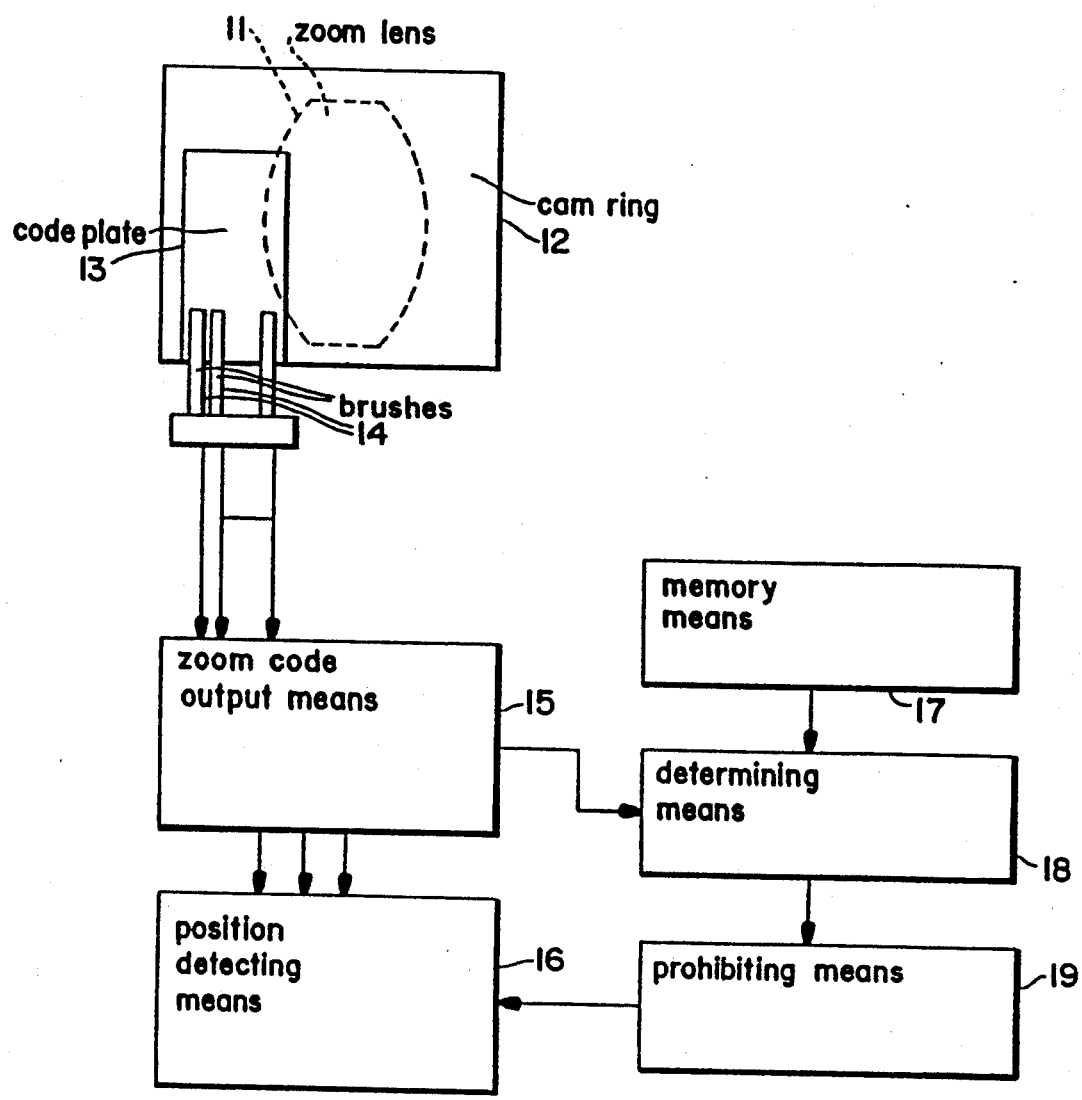
FIG. 1A is a block diagram of a zoom unit constructed according to the present invention.
Figure 1B:
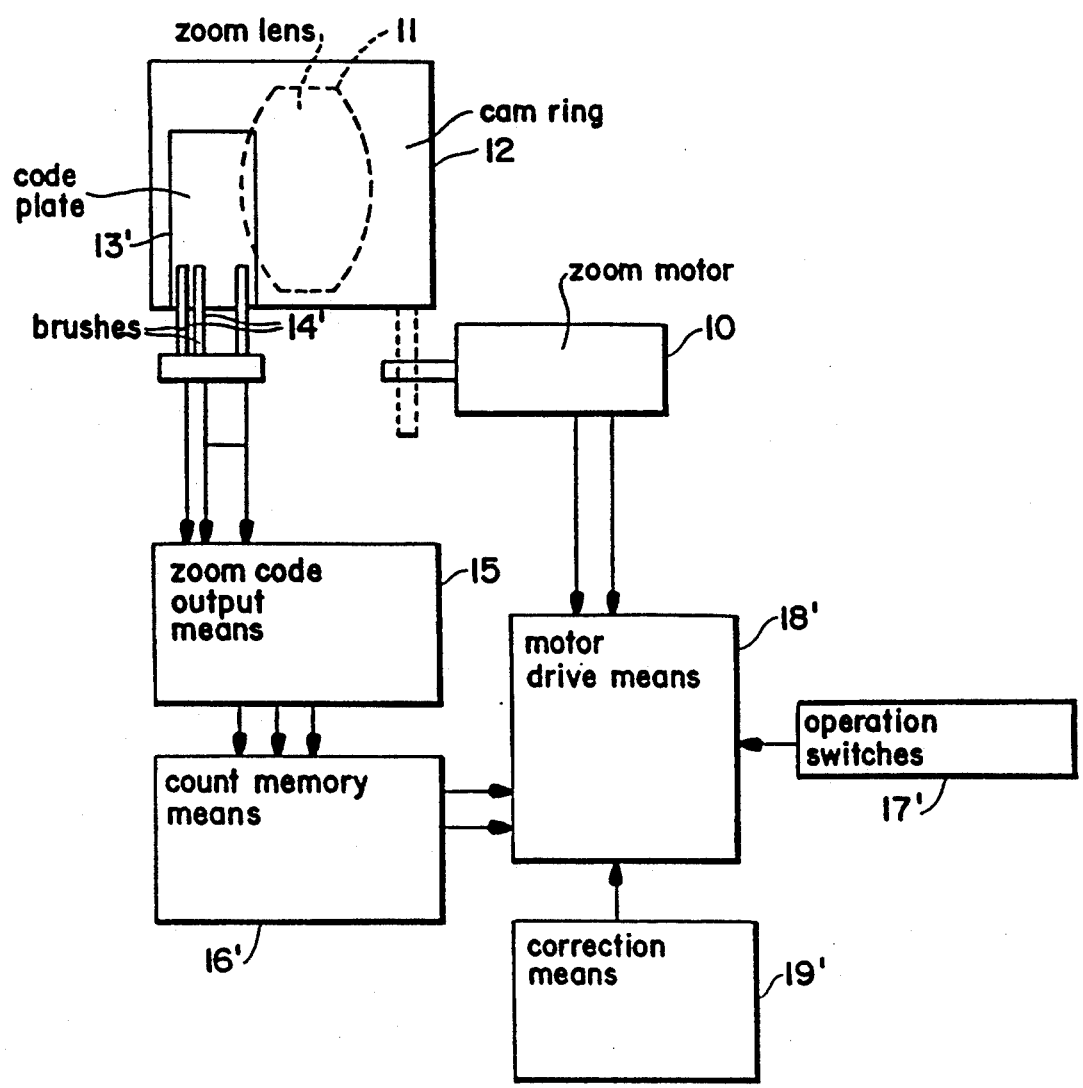
FIG. 1B is a block diagram of the zoom unit of FIG. 1A, wherein the zoom lens is electrically operated.

FIG. 1A schematically illustrates the zoom position detecting device according to the present invention which is described in further detail below. Included is a means 15 for outputting a zoom code; a code plate 13 that is provided on the circumferential surface of a cam ring 12 to effect a change in the focal length of a zoom lens; a plurality of brushes 14 that are mounted on the camera body in slidable contact with the code plate 13 so as to generate a relative zoom code based on the conductive condition of the brushes; means 16 for detecting a position which converts the zoom code to a position code corresponding to the focal length of the zoom lens; means 17 for storing a pattern of changes of the zoom code, the pattern of changes being associated with the zooming operation; means 18 for detecting for detecting changes of the zoom code and determining if the changes coincide with the pattern of changes; and means 19 for prohibiting which examines whether changes of the zoom code are different from the pattern of changes and, if it is different, whether the changes are due to an electrical separation of at least one brush with the code plate, in which case the conversion of the zoom code to a position code is prohibited.

As shown in FIG. IB, the zoom lens of the present invention can also be electrically operated. The electrically operated zoom lens further comprises means 16' for counting and storing changes of the zoom code from the area of the absolute code and storing it in the memory as a position code that corresponds to the focal length of the lens; means 18' for driving the zoom motor 10 so as to change the focal length of the zoom lens 11 by controlling the energization of the zoom motor 10 in accordance with an input from operation switch 17' and the position code stored in the memory; and means 19 for correcting which controls the motor drive means 18' to rotate the cam ring 12 to a position in which the zoom code becomes an absolute code when the position of the count memory means 16' is erased.

In addition, as will be discussed below, the camera includes a means for indicating the focal length of the lens so that an operator of the camera knows the setting of the zoom lens.

Figure 1C:
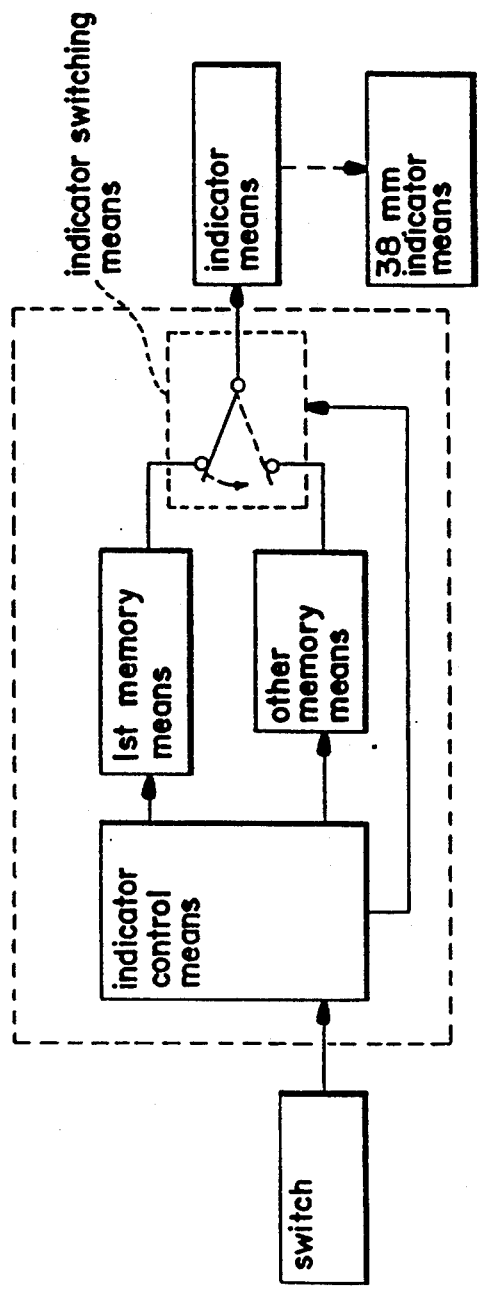
FIG. 1C is a block diagram of an electronically switchable indicator unit that displays information that is relevant to a photographer.
Figure 2:
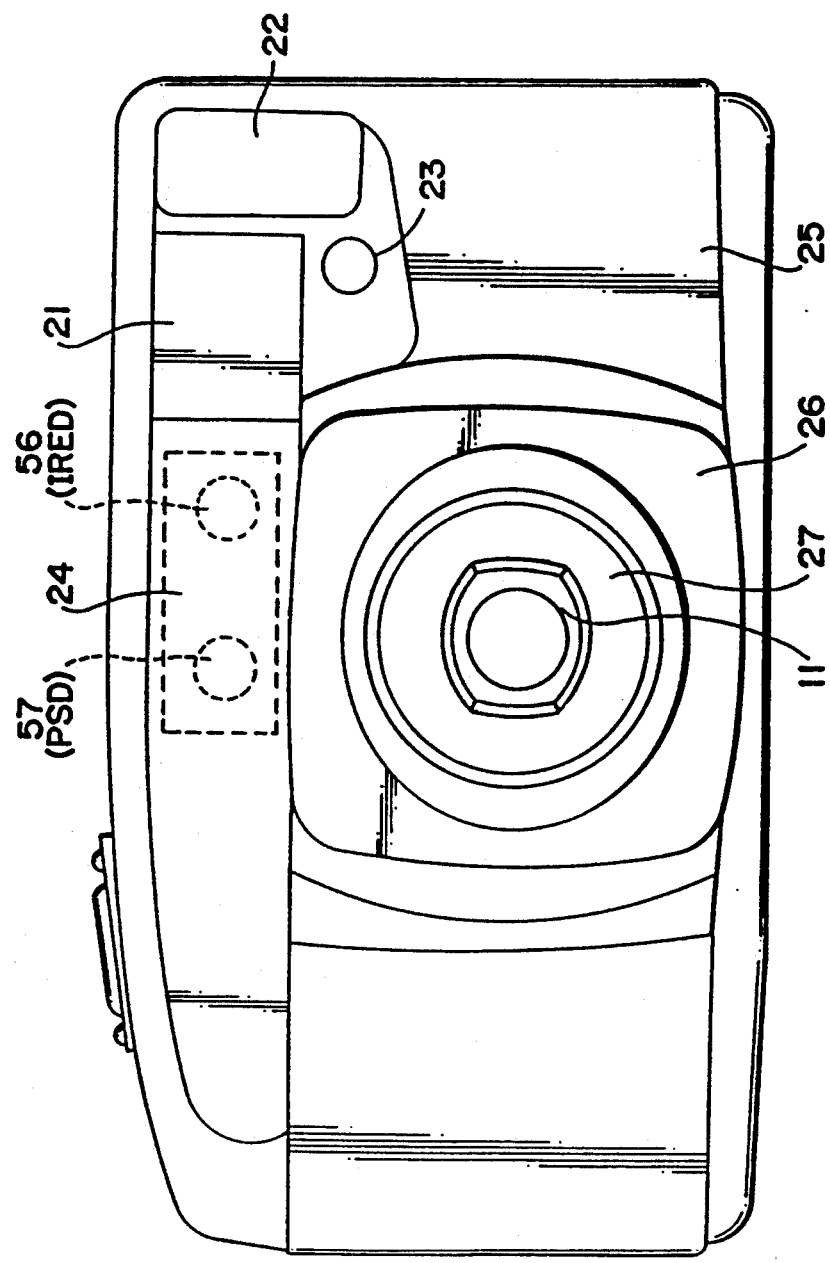
FIG. 2 illustrates a front view of a camera constructed according to the present invention.

For instance, assume the frame number of the film in the camera is given priority for indication purposes on the display as the first piece of updatable information which is stored in the first memory, as shown in FIG. 1C. The indication switching means operates to selectively switch the indication on the display to show the other piece of updatable information, such as the focal length of the zoom lens.

With reference to FIGS. 2–5A, in the preferred embodiment of the invention, the camera comprises a compact type lens shutter camera in which a zoom lens 11 and finder system 21 are independent of each other. The front of the camera houses a strobe 22, a CdS sensor 23 for photometry sensing and a distance measurement device 24, comprising a position sensor (PSD) 57 and an infrared detector (IRED) 56. The strobe 22 illuminates a subject to be photographed, the CdS photo cell 23 measures the brightness of the subject, and the infrared emitting diode (IRED) emits infrared rays onto the subject so that the position sensor PSD outputs a position signal according to the distance from the subject by receiving the infrared light that is reflected from the subject. The zoom lens 11 is associated with a movable lens barrel 27 which moves relative to a fixed lens barrel 26 connected to camera body 25. The movable lens barrel 27 is displaced between a storage position (shown as a broken line in FIG. 3) and a macro extremity (shown by a solid line in FIG. 3). In this embodiment, the focal length of the zoom lens 11 is variable from approximately 38 mm to 60 mm in the zoom range. In addition, the camera of the present invention has a macro position and a lock position.

Figure 3:
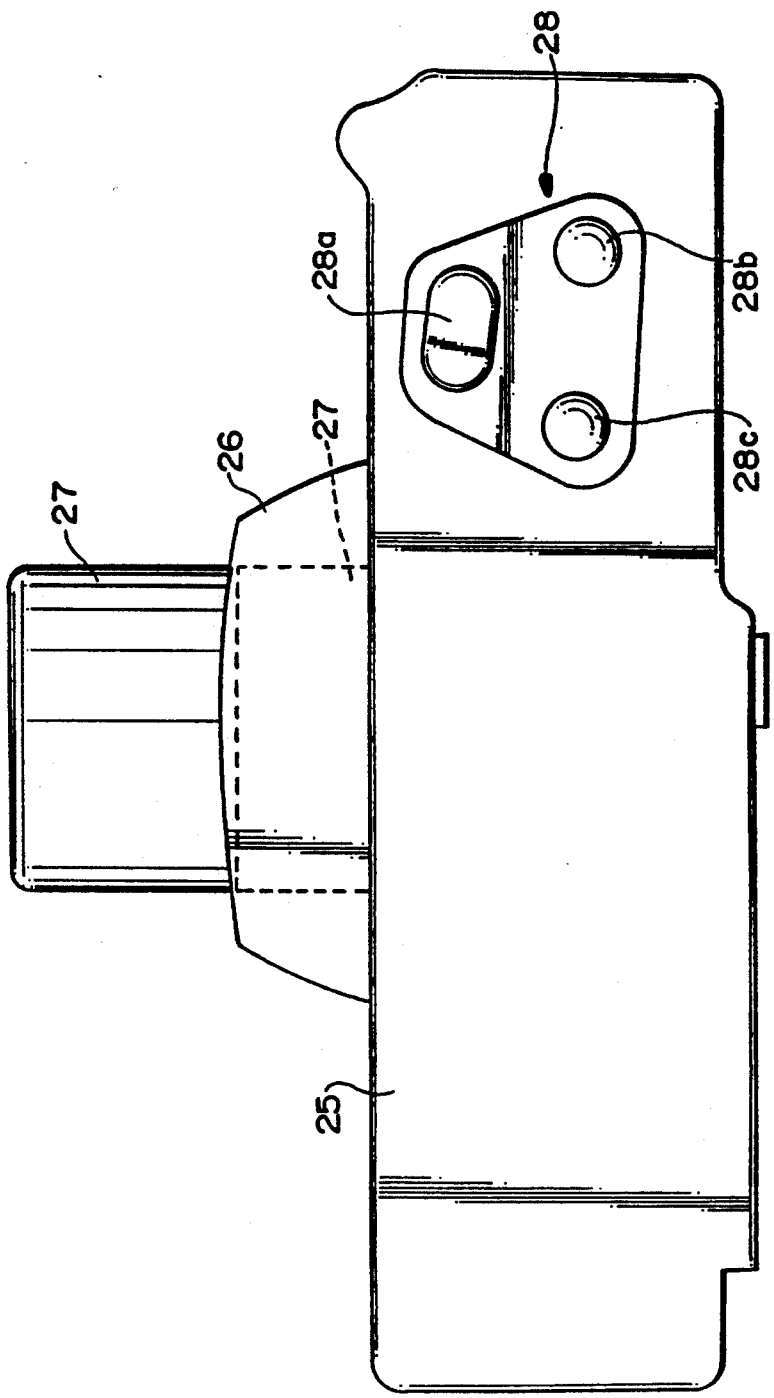
FIG. 3 illustrates a top view of the camera of FIG. 2.

As shown in FIG. 3 in particular, the upper portion of the camera contains a generally triangularly shaped operation button array 28 which is also used as the zoom button. Front part 28a of the operation button array 28 comprises a 2-stage switch that operates as a photometry switch SWS and shutter release switch SWR. One rear button 28b of the operation button array 28 on the rear side comprises a tele switch SWT for controlling the zoom lens 11, while a second rear button 28c of the operation button array 28 comprises a wide switch SWW for controlling the zoom lens 11. These three switches 28a, 28b and 28c are interrelated in such a fashion that when one switch is operated, the other two switches cannot be operated. Depressing the shutter button 28 halfway activates the photometry switch SWS, while fully depressing the shutter button 28 activates the release switch SWR.

By depressing the portion of the operation button array above the tele switch SWT and, consequently, tilting the generally triangular member downwardly thereat, the zoom motor 10 is rotated in a direction that causes the zoom lens 11 to extend from the camera body 1. By depressing the portion of the operation button array above the wide switch SWW the zoom motor 10 is rotated in an opposite direction, such that the zoom lens 11 is retracted into the camera body 1. The rotation of the zoom motor 10 is controlled by the main CPU, which executes a sequence of instructions based upon which switch, SWT or SWW, is depressed.

Figure 4:
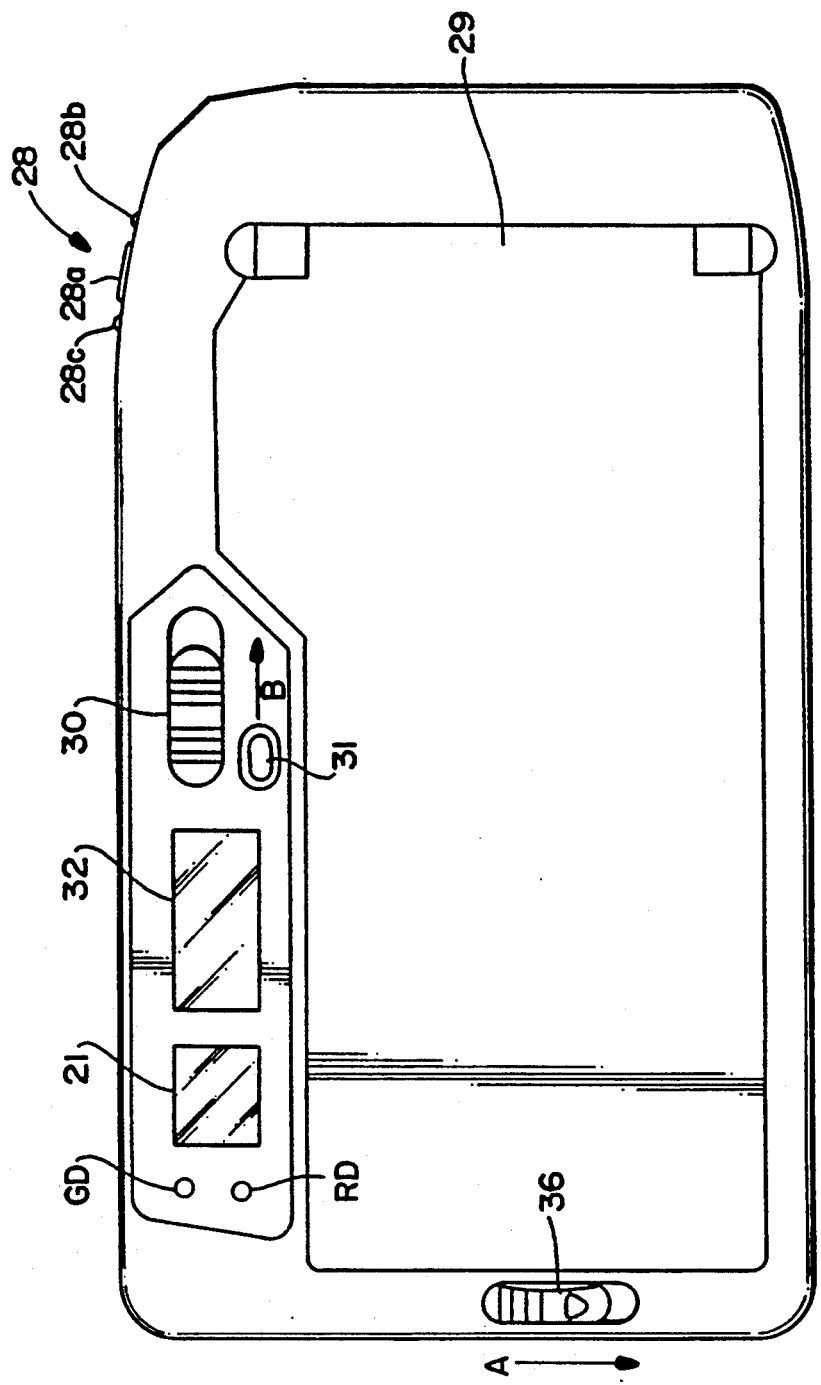
FIG. 4 represents a rear view of the camera of FIG. 2.
Figure 5A:
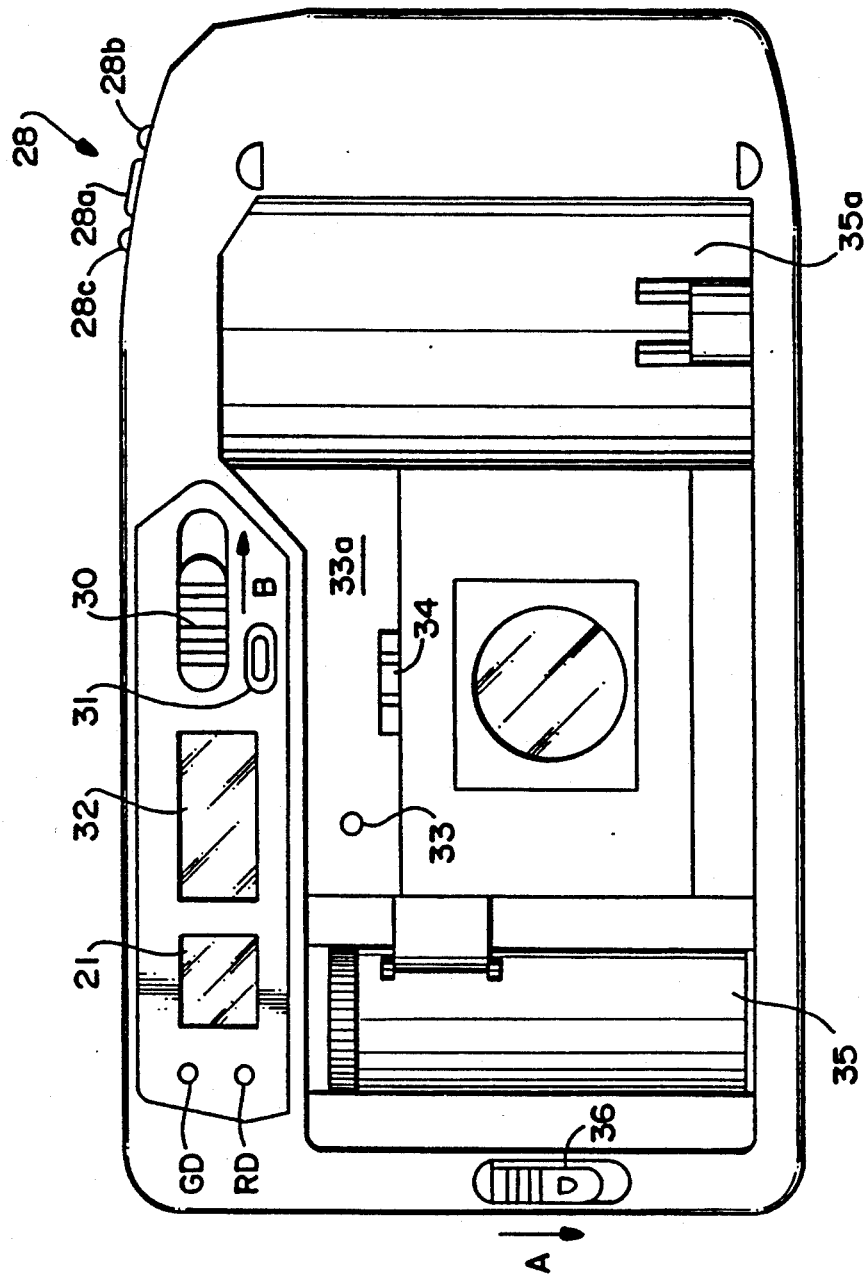
FIG. 5A illustrates the rear of the camera shown in FIG. 4, wherein a back cover of the camera is in an open position.

As shown in FIGS. 4 and 5A in particular, the rear portion of the camera body 25 comprises a back cover 29 (film compartment cover), a main switch 30, a mode switch 31, an LCD panel 32, a back cover open/close lever 36, a red lamp indicator (LED) Rd, and a green lamp indicator (LED) Gd. A film switch 33 is operable to detect the presence of film, while a wind pulse switch 34 is operable to generate a wind pulse in response to the advancing of the film. The film loading detector switch 33 is sunk into wall 33a inside the camera when the film cartridge (patron) is placed in film cartridge compartment 35a, the leading end of the film is put on spool 35 with its perforation in contact with the film advance detector switch 34, and the back cover 3 is closed. The film presence detector switch 33 is turned off when it is fully sunk into the wall 33a. When the film presence detector switch 22 is in the off state, the film is ready to be advanced.

The red lamp indicator Rd blinks when the photometric switch SWS is depressed and strobe emission is needed but is not ready. When the shutter release button SWR is pressed and the strobe 22 emits light, the red lamp indicator Rd is continuously illuminated (that is, the red lamp indicator Rd has a 100 percent ON duty cycle). The green lamp indicator Gd blinks if the subject is too close when the photometric switch SWS is depressed and it is fully illuminated (as described above for the red lamp indicator Rd) when the subject is within the proper distance for the taking of a flash photograph.

The back cover 29 is opened by sliding the back cover open/close lever 36 in the direction of arrow A. The main switch 30 comprises a three position slidable switch, having a lock position SWL, a zoom position SWZ and a macro position SWM. When the main switch 30 is moved in the direction of arrow B, from the lock position SWL to the zoom position SWZ, or from the lock position SWL to the macro position SWM, power for the camera's components, schematically shown in FIG. 8, such as a motor drive circuit 500, strobe circuit 600, etc., are turned on by the application of electrical power to a main CPU 100.

The LCD panel 32 operates under the control of the main CPU and has the capability of displaying a free wind-up mark, which indicates the request for a free film feed; a patron mark, which indicates the loading of the film; the frame number of the film; and a focal length value indicating the position of the zoom lens.

Figure 5B:
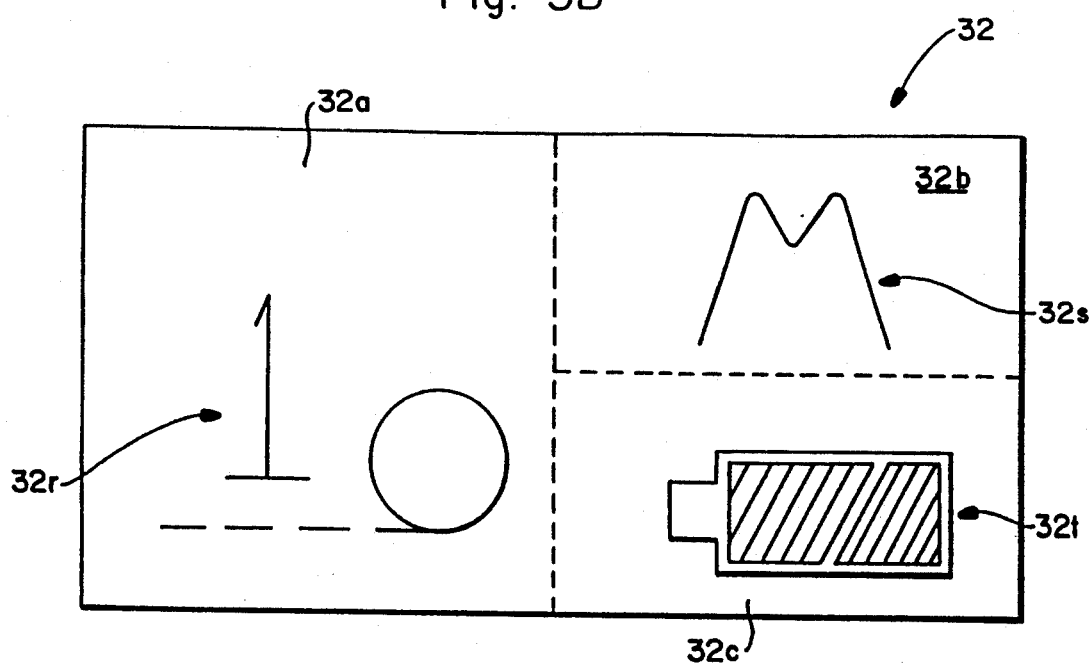
FIG. 5B discloses an LCD display panel that is used with the camera of the preferred embodiment.

A switching operation functions to switch the data that is displayed on the LCD panel 32. For instance, as shown in FIG. 5B, the LCD display panel 32 includes a film status indicator area 32a for indicating film-related information 32r, a mode indicator area 32b for indicating the photographing mode of the camera, such as a normal mode 32s and a battery status indicator area 32c for indicating the condition of camera battery 32t. In the illustration shown in FIG. 5B, the film status indicator 32a serves to initially indicate a blank-shot film advance request $L_d$ (which is a cylindrical film roll case representing the loading of film) when a film is first loaded into the camera, the film frame number, or alternatively, the focal length of the zoom lens 11.

Figure 5C:
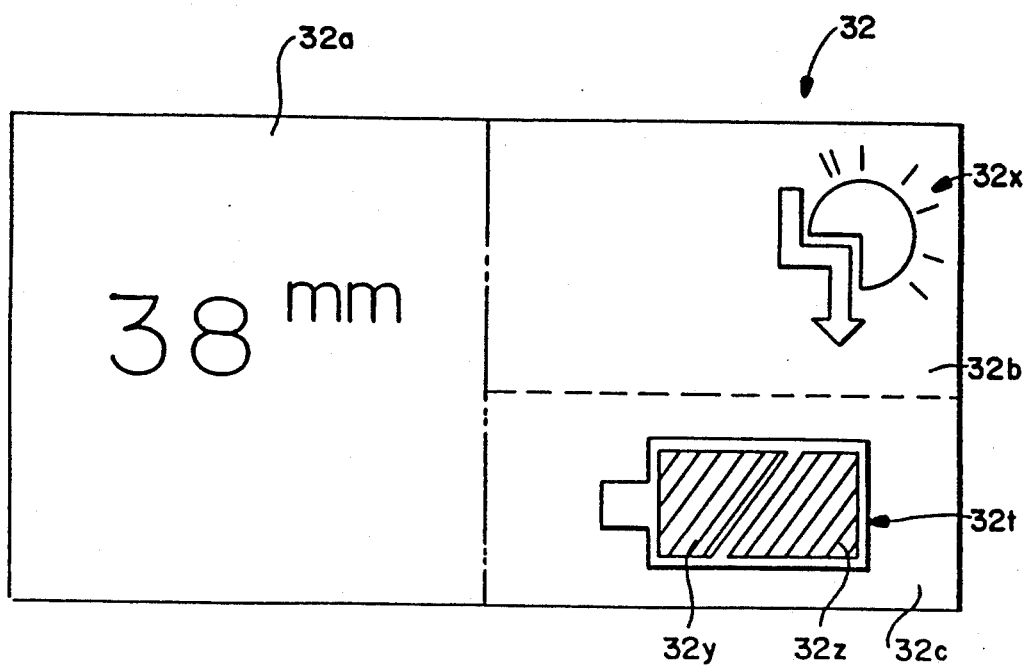
FIG. 5C illustrates the LCD display panel of FIG. 5B displaying alternative photography information.

FIG. 5C illustrates the LCD panel 32 indicating alternative information. In this illustration, the film status indicator area 32a has been changed to indicate the focal length of the zoom lens, while the mode indicator area 32b has been changed to indicate a daytime synchronized mode 32x.

The battery status indicator area 32c indicates the condition of the camera battery to the photographer. The camera battery 32t has two indicators 32y and 32z. When a fully charged battery is inserted into the camera, the outline of the camera battery 32t and the two indicators 32y and 32z are illuminated. When the camera battery is partially discharged, the outline of the camera battery 32t and only one indicator 32z are illuminated. When the camera battery voltage is below a predetermined level (or is fully discharged), every figure displayed in the LCD panel blinks. This blinking feature alerts the photographer to replace the battery.

The main CPU controls a means for indicating a loading request for forcing an indication of the blank-shot film advance request $L_d$ on the liquid crystal panel 32, when the film presence detector switch 33 detects the absence of a film in the camera. The main CPU further controls the liquid crystal panel 32 so as give display priority to the frame number of the film loaded in the camera. With respect to indicating the status of the film and the focal length of the zoom lens 11 on the display panel 32, the main CPU gives priority to the film frame number. This first piece of updatable information is stored in a first memory. The indication of a second function, such as focal length information, comprises a second piece of updatable information that is also stored in a memory means. The display of the second function on the display panel 32 replaces the display of the first function in response to the operation of the tele switch SWT, wide switch SWW or light measuring switch SWS. The main CPU also receives inputs from the film presence detecting switch 33, the film advance detector switch 34, battery loading information from the battery presence switch SWB, zoom code information and DX contact information which indicates the sensitivity of the film.

FIG. 1C schematically illustrates how the various items of information can be displayed in a limited indication area. An indicator control means enables a first type of information to be stored in the first memory and another type of information to be stored in a second memory. The information in the first memory is given priority over that in the second memory so that the information in the first memory is displayed in the limited indication area unless a switch that is responsive to the second type of information is operated.

Figure 8:
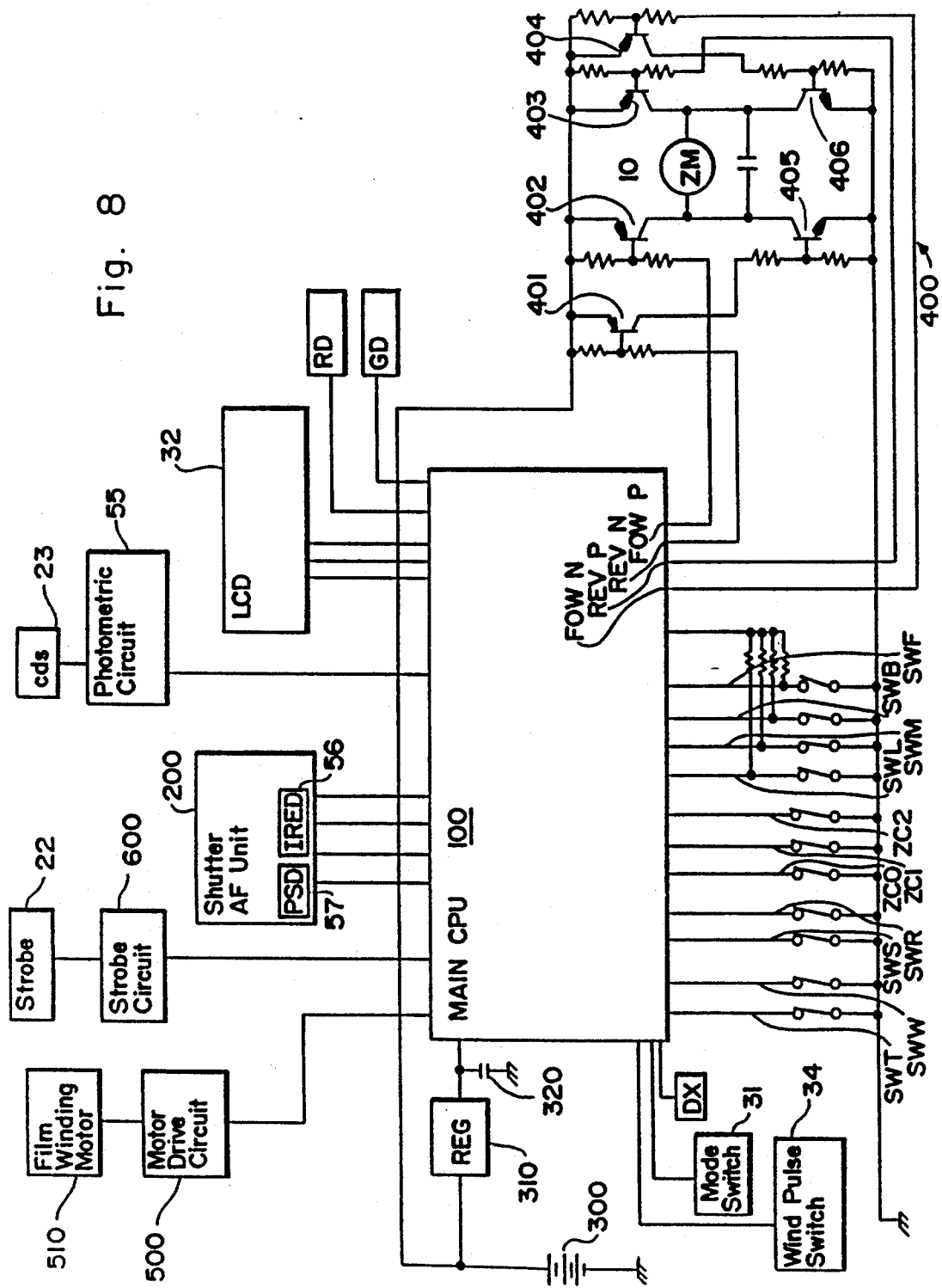
FIG. 8 illustrates a control circuit of the camera constructed according to the present invention.

As shown in FIG. 8, the motor drive circuit 500 controls the zoom motor 10 and a film winding motor 510. The motor drive circuit 500 is controlled by the main CPU 100. The mode select button 31 operates to switch between a normal photographing mode and a daytime synchro photographing mode. When the mode select button 31 is switched to the normal photographing mode, the daytime synchro photographing mode is selected. When the mode select button 31 is switched to the daytime synchro photographing mode, the normal photographing mode is selected. The selected mode is displayed on the LCD panel 32.

As noted above, the main CPU controls the function of advancing the film for a predetermined number of blank-shots when a new roll of film is placed in the camera in accordance with the loading request indication control means, with which the blank-shot film advances are executed by operating a film advance motor 510 in dependence upon the operation of the main switch 30 and the release switch SWR. The operation of the film advance motor 510 is stopped when the predetermined number of blank-shot frames have been taken, in response to the output detection of the film advance detector switch 34.

Winding axis 35 is the spool axis upon which the film is wound on as the film advances from one frame to another.

The main CPU 100 performs the transfer of information with a sub CPU via a drive IC. In the embodiment of the preferred invention, the main CPU, sub CPU, drive IC and autofocus IC have been incorporated into the main CPU using system integrated very large scale integrated circuitry (VLSIC) to create a custom IC. The sub CPU functions to transfer photometry information from a photometric element 23 and distance measurement section 24 to the main CPU 100. In addition, the sub CPU also controls the transfer of information with an autofocus IC. The autofocus IC controls the emission of an infrared light emitting diode (LED) and transfer output information from a position sensor (PSD), which receives the infrared light reflected from a subject to provide distance measurement information to the sub CPU.

As shown in FIG. 8, the camera comprises a photometric switch SWS and a shutter release switch SWR (both of which are activated by depressing the shutter button 28a), a power source 300, and a strobe circuit 600 which causes the strobe 22 to flash. The strobe circuit includes a capacitor (not illustrated) which is charged by a voltage booster circuit and boost circuit. Current charging this capacitor is sent to strobe 22 so that it flashes.

Figure 6:
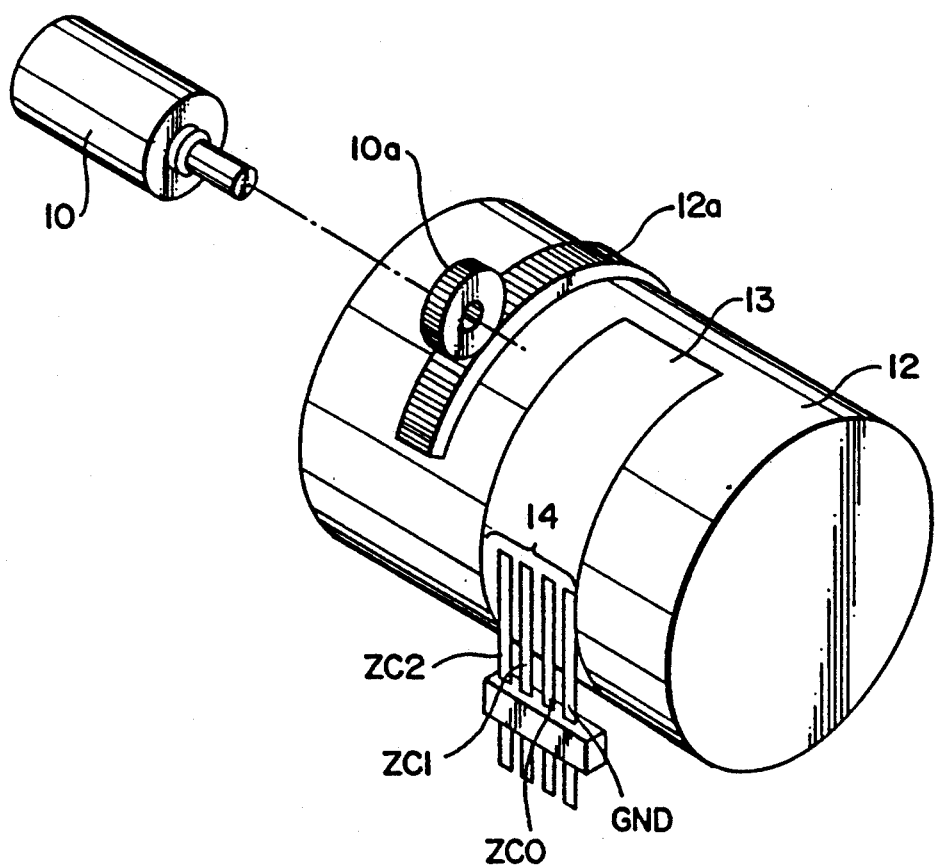
FIG. 6 is a schematic perspective view of a lens assembly used in the camera of FIG. 2, showing the relationship between a cam ring, code plate and a plurality of brushes.

Referring to FIG. 6, cam ring 12 is installed around the zoom lens 11 and is linked to zoom motor 10 through sector gear 12a and pinion 10a, which advances and withdraws the zoom lens 11 according to the rotation of the zoom motor 10 by a cam mechanism, which is not shown in the drawing.

In the camera constructed according to the present invention, information concerning a change in the focal length of the lens 11, a change in the open-aperture F-number according to the focal length change and a determination as to whether the lens is at the wide extremity, the tele extremity, the macro photographing position, or the lock position, is automatically detected for performing various operations according to the detected information. To obtain the required information, the code plate 13 is secured to the circumference of cam ring 12, while four brush terminals 14 (ZC0, ZC1, ZC2, and GND) contact the code plate 13. One brush operates as a ground terminal (GND), while the remaining three brushes (ZC0, ZC1 and ZC2) are used for code detection.

Figure 7:
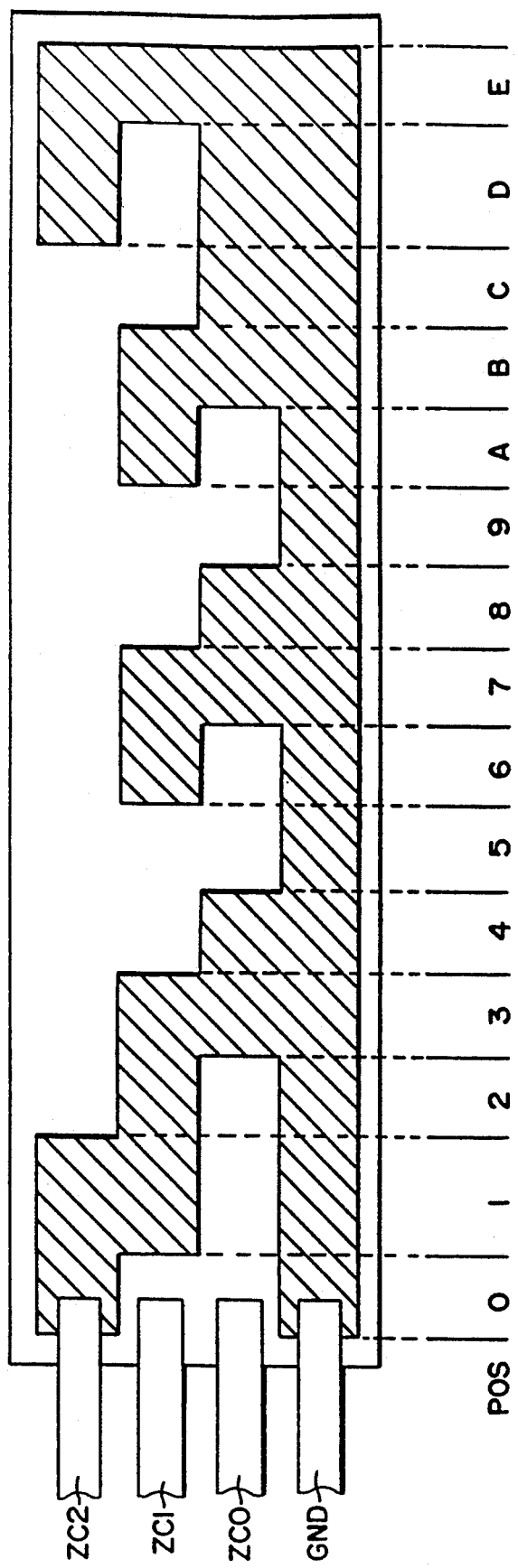
FIG. 7 is an exploded view of the code plate shown on the lens assembly in FIG. 6.

FIG. 7 is an exploded "flattened" view of the code plate 13. When terminals ZC0, ZC1 and ZC2 come in contact with a conductive land of the code plate, shown by hatches in the drawing, a signal "0" is generated, while when a brush does not contact a conductive land, a signal "1" is generated. Thus, a three-bit information detection signal generated by the conductive relationship of the brushes ZC1-ZC3 with the ground brush GND correspond to a zoom code ZC.

Shown below the code plate 13 (in FIG. 7) is a position code POS that corresponds to the zoom code ZC, as shown in Table 1. The position code POS represents a hexadecimal value from "$0_H$" to "$E_H$".

In the camera, there are 15 detection steps that correspond to the focal length of the lens. Hence, there are 15 position codes POS. It should be noted that the focal length indication is set to 6 steps that correspond to the position code POS.

To detect the 15 positions using three brushes, it is necessary to create a relative code which holds the zoom code in common for different step positions. In the embodiment, the absolute code is set by providing a one to one correspondence between the part where the position code POS equals "$0_H$", "$1_H$", "$D_H$" and "$E_H$" and the zoom code ZC equals "0", "1", "2" and "3", while the relative code is set by providing a repeated correspondence between the position code equalling "$2_H$" to "$C_H$" and the zoom code ZC equalling "4" to "7".

When POS equals "$0_H$", the zoom lens 11 is drawn into the fixed lens barrel 26 and the front of the lens 11 is covered by a barrier (not shown) to set the lens to a lock mode. A position code POS of "$2_H$" to "$C_H$" denotes a zoom capable range, while a position code POS of "$E_H$" indicates a macro position that is used for close-up photography. The boundary section between the lock position and the zoom range, as well as the zoom range and the macro position, denotes a stop prohibiting range.

TABLE 1

| POS | 0 | 1 | 2 | 3 | 4 | 5 | 6 | 7 | 8 | 9 | A | B | C | D | E |
|---|---|---|---|---|---|---|---|---|---|---|---|---|---|---|---|
| ZC2 | 0 | 0 | 1 | 1 | 1 | 1 | 1 | 1 | 1 | 1 | 1 | 1 | 1 | 0 | 0 |
| ZC1 | 1 | 0 | 0 | 0 | 1 | 1 | 0 | 0 | 1 | 1 | 0 | 0 | 1 | 1 | 0 |
| ZC0 | 1 | 1 | 1 | 0 | 0 | 1 | 1 | 0 | 0 | 1 | 1 | 0 | 0 | 0 | 0 |
| ZC | 3 | 1 | 5 | 4 | 6 | 7 | 5 | 4 | 6 | 7 | 5 | 4 | 6 | 2 | 0 |
| Indication (mm) | 38 | 38 | 38 | 42 | | 46 | | 50 | | 55 | | 60 | | 60 | 60 |
| LOCK | | STOP prohibited | | | | | Zooming area | | | | | | | STOP prohibited | Macro |
| Absolute Code | | | | | | | Relative code | | | | | | | | Absolute Code |

The circuit configuration used with the camera of the present invention will be further explained with reference to FIG. 8. The operation of the camera will be explained with reference to a plurality of flowcharts, shown in FIGS. 9-23. In the following description, the details for the zoom-related processing concerning this invention is explained, while processing relating to the shutter control or the advancement of the film will only be briefly described.

A main CPU 100 has four serial signal lines. A shutter AF unit, which performs shutter-related processing, is connected to the four serial signal lines. Battery 300 supplies power to the main CPU 100 via a regulator 310. The LCD panel 32, zoom motor 10 and other components of the camera are controlled according to the inputs from the above-mentioned switches. A backup capacitor 320 supplies current to the main CPU 100 when the battery 300 is removed from the camera.

A motor operation circuit 400 comprises a plurality of PNP transistors 401-404, NPN transistors 405 and 406 and multiple biasing resistors, which function to control the forward and reverse rotation of the lens, as well as the stopping of the zoom motor 10 according to four-bit signals FOW N, REV P, REV N and FOW P outputted from the main CPU 100, as shown in Tables 2 and 3.

The zoom motor 10 rotates in a forward direction to cause the zoom lens 11 to extend out of the camera body 25 so as to change the focal length of the lens to the tele range. When the zoom motor rotates in a reverse direction, the zoom lens 11 is drawn into the camera body so as to change the focal length of the lens 11 to the wide extremity.

TABLE 2

| | Normal Rotation | | | |
|---|---|---|---|---|
| | FOW N | FOW P | REV P | REV N | |
| 1 | | | | | Open |
| 2 | ON | ON | | | Normal rotation |
| 3 | | | | | Open |
| 4 | ON | | | ON | Brake |
| 5 | | | | | Open |

TABLE 3

| | Reverse Rotation | | | |
|---|---|---|---|---|
| | FOW N | FOW P | REV P | REV N | |
| 1 | | | | | Open |
| 2 | | | ON | ON | Normal rotation |
| 3 | | | | | Open |
| 4 | ON | | | ON | Brake |
| 5 | | | | | Open |

The following switches provide information to the main CPU 100:

(1) Lock switch SWL, which is set to ON when the main switch 30 is set to the look position;

(2) Macro switch SWM, which is set to ON when the main switch 30 is set to the macro position;

(3) Film switch SWF (element 33 in FIG. 5A), which is depressed by the film loaded into the camera, and being set to OFF when the back cover 29 is closed;

(4) Battery switch SWB, which is set to ON by mechanically detecting the presence of a battery;

(5) Brushes ZC0, ZC1 and ZC2, which come in contact with the code plate 13 to detect zoom codes ZC (these brushes are not technically switches, however, as they perform as switches in the circuit, they are expressed as switches for convenience);

(6) Photometry switch SWS, which is set to ON by depressing the front switch 28a of the operation button array 28 by one step;

(7) Release switch SWR, which is set to ON by depressing the front switch 28a of the operation button array 28 by two steps;

(8) Zoom tele switch SWT, which is set to ON by depressing rear switch 28b of the operation button array 28; and (9) Zoom wide switch SWW, which is set to ON by depressing rear switch 28c of the shutter button 28.

The main CPU 100 performs the following functions by executing stored programs:

(1) Zoom control based on the conductive condition of brushes;

(2) Control the zoom motor 10 according to inputs from the switches and the zoom code;

(3) Hold and store in memory changes in the zoom code as the position code by counting the changes from the absolute code section;

(4) Hold the pattern of changes of code information associated with the zooming operation;

(5) Detect changes in the zoom code and examine whether or not the change coincides with the pattern of changes;

(6) If the change in the zoom code is different from the pattern of changes, determine whether the change is due to a separation of at least one brush from the code plate and, if the change is due to a brush separation, prohibit the conversion of the zoom code to a position code after the detected change; and (7) Control the zoom motor so that the cam ring is turned to a position in which the zoom code becomes an absolute code when the memory for counting is erased.

MAIN Program

Figure 9:
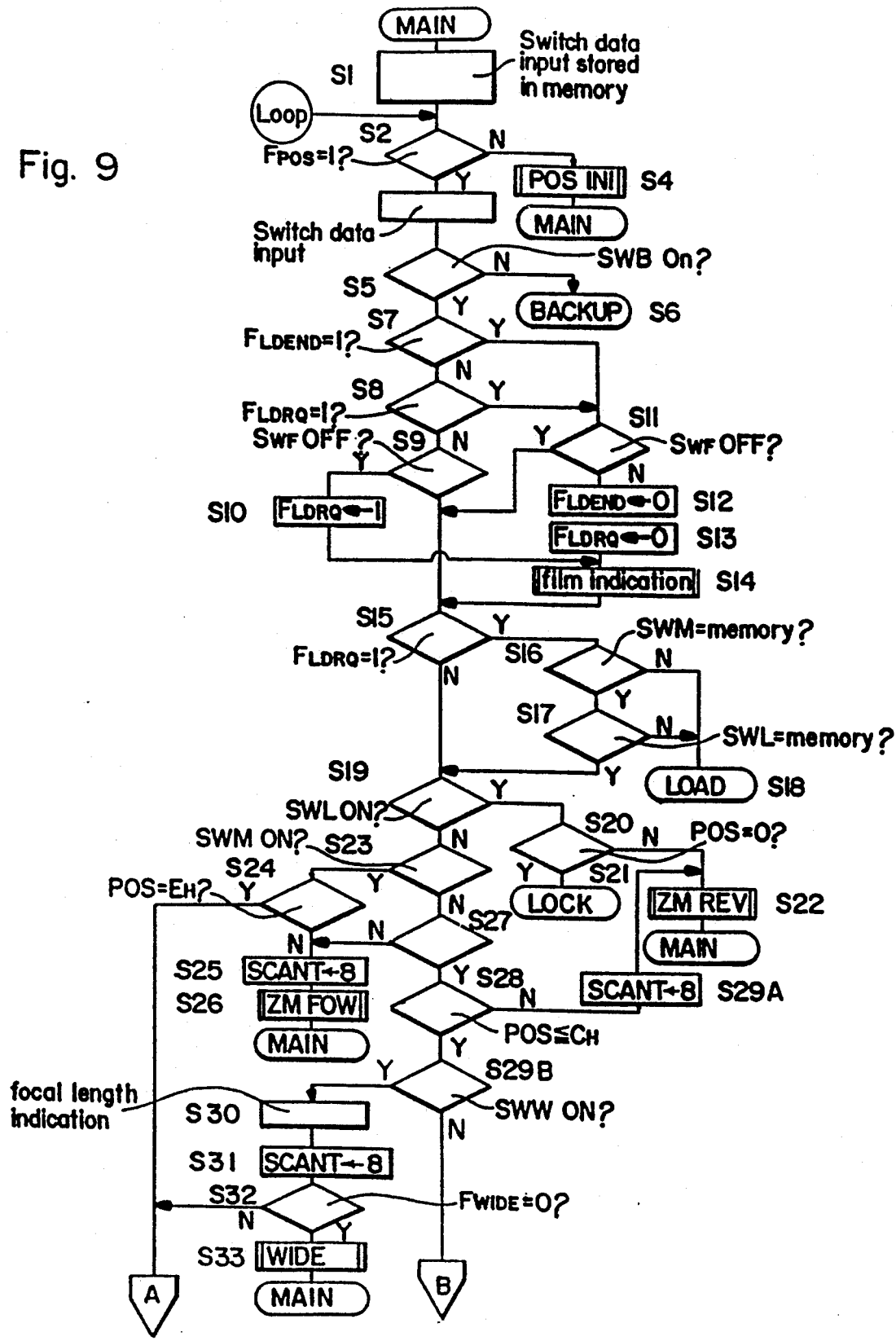
FIGS. 9 and 10 illustrate the computer software flowchart diagram for a MAIN program that is executed by a CPU in the camera of FIG. 2.
Figure 10:
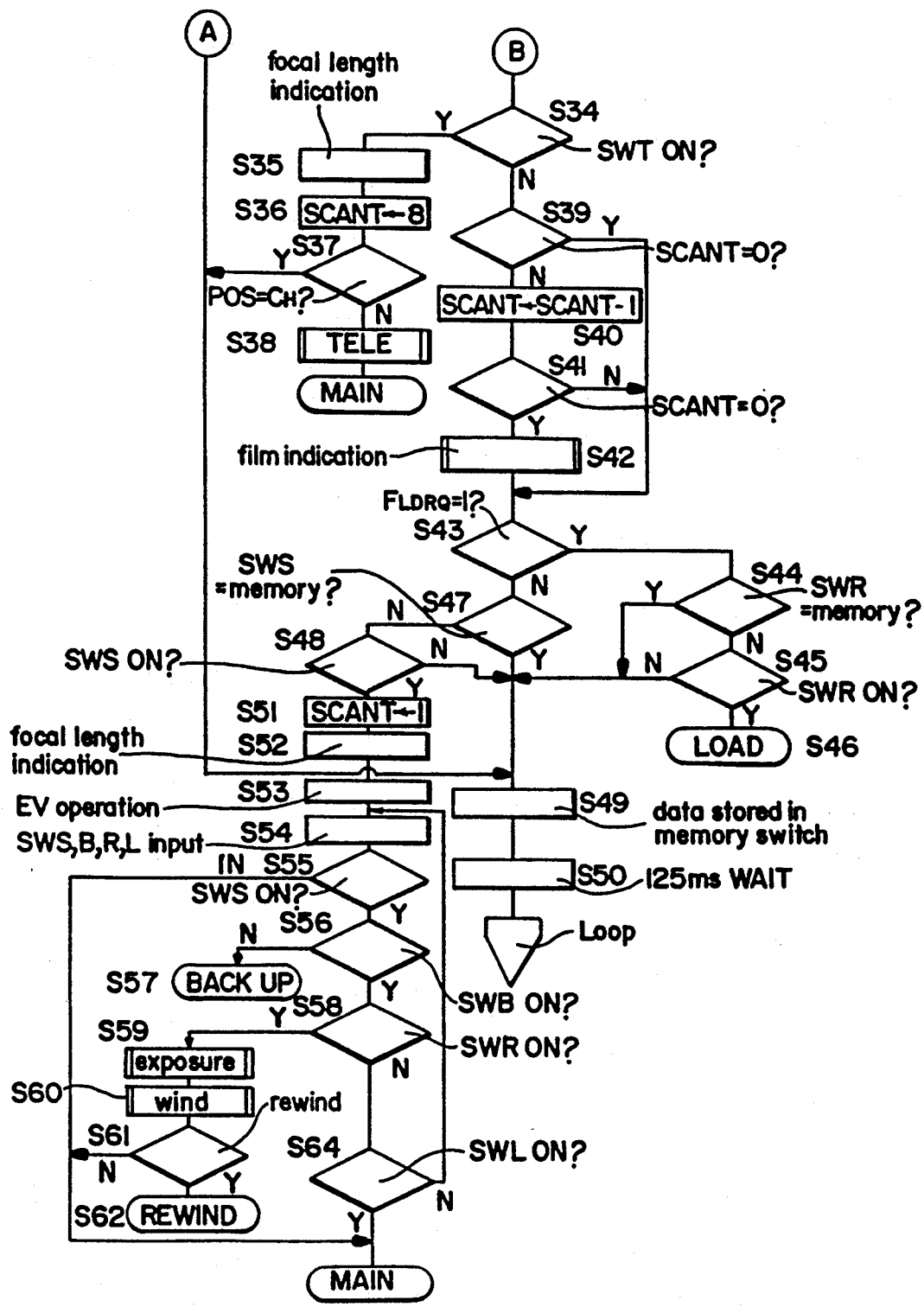
Figure 27A:
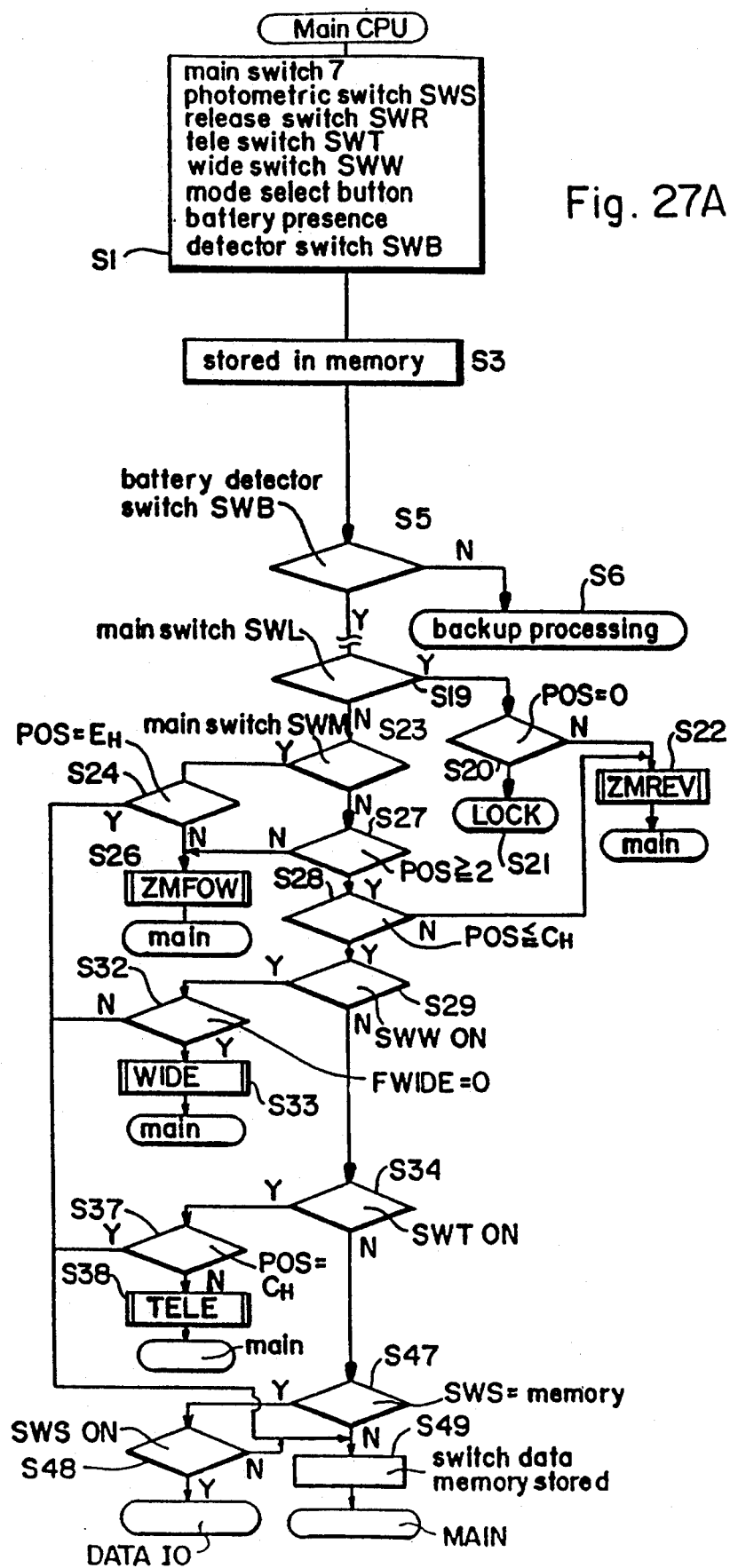
FIG. 27A illustrates a MAIN program which is a summary of the flowchart of the MAIN program shown in FIGS. 9 and 10.

The MAIN program flowchart is illustrated in FIGS. 9 and 10. The MAIN program specifies the basic operation of the camera. Associated programs, called subroutines, are executed after being called by an instruction of the MAIN program. Steps 1-22 of FIG. 27A is a summary flowchart of the MAIN program illustrated in FIGS. 9 and 10. FIG. 27A discloses the instructions necessary to perform a DATA I/O operation, whereas this operation has been summarized in steps 51-64 of FIG. 10. The instructions that are shown in the MAIN program flowchart of FIG. 27A have been labelled such that they correspond to the instructions listed in FIGS. 9 and 10.

In step (referred to in the drawings as "S" before an instruction number) 1, the status of each switch is inputted to the main CPU 100, which stores the detected settings in a memory so as to provide a series of initial switch values. A position flag $F_{POS}$ is examined to determine if the flag has been set to 1. The position flag indicates the reliability of the position code. If the flag is set to 1, processing advances to step 3. If the flag is set to 0, a POSITION CODE INITIALIZATION (POS INI) subroutine is executed at step 4, which will be described below. The POS INI subroutine is run when the relative code is used for the POS detection and has the characteristics of a component specific to this invention.

In step 3, the status of the switches are inputted once more. The purpose of this step is to detect any dynamic changes in the setting of the switches by comparing the re-read settings with the data stored in memory.

In step 5, battery switch SWB is examined to determine if it is set to ON. If this switch is set to OFF, that is, if the battery is removed, processing advances to step 6 to diverge to a BACKUP series of instructions, to be described below. The camera constructed according to the present invention keeps the data stored in memory for a certain period of time if the battery 300 is removed (i.e., due to a battery replacement operation) by means of the energy that is stored in the capacitor 320. When the backup power supply is used (i.e., capacitor 320), operation requiring a large power consumption must be prohibited. This is accomplished by diverging to the BACKUP instructions.

When operating the camera, the first step is to load the film. Automatic film loading is performed by pulling out the film to the point where its tip end is laid on winding axis 35. To control the film loading, a film loading request flag $F_{LDRQ}$ and a loading end flag $F_{LDEND}$ are used. These flag operations are performed in step 257 of the BACKUP instructions (FIG. 18), step 309 of a series of instructions to perform a RESET operation (FIG. 20), step 325 of a series of instructions to perform a REWIND operation (FIG. 22) and steps 358, 360 and 361 of a series of instructions to perform a LOCK operation (FIG. 23), as well as in the MAIN program.

When it has been determined that the battery is loaded (step 5), steps 7–14 are performed to determine whether the film switch SWF is in a condition whereby it can be estimated from the film loading flags. If the condition is different from what was estimated, an indication of the film frame is shown on the LCD panel 32, while if it is the same as what was estimated, the previous indication (namely, either the focal length or film frame indication) is maintained on the LCD panel 32 and processing continues to step 15.

Thus, in step 7, it is determined whether the loading end flag $F_{LDEND}$ is set to 1. This flag is initially set to 0, meaning that the film loading has not yet taken place. If this flag is set to 0, a determination of whether the loading request flag $F_{LDRQ}$ is set to 1 is made in step 8. $F_{LDRQ}$ is initially set to 0.

When it is decided that both flags are negative (i.e., set to 0), the film switch SWF is checked in step 9. When the end of the film is pulled out so that it is placed on the winding axis 35 and the back cover 29 is closed, film switch SWF is set to OFF and the loading request flag $F_{LDRQ}$ is set in step 10 so that the film loading operation is ready to be performed.

When this flag is set and the program loops back to this step again, the test performed in step 8 is positive. When the film loading is complete, the decision of step 7 is positive. Therefore, the same test is made in step 11 as was performed in step 9. The film switch SWF is set to ON after the flags $F_{LDRQ}$ or $F_{LDEND}$ have been set when the back cover 29 is opened or the film has been rewound. In the former case, flags $F_{LDRQ}$ and $F_{LDEND}$ are cleared (steps 12 and 13) and then the film status is indicated on the LCD panel 32 (step 14). The film indication is shown with priority given to the focal length indication, except when the LCD panel is temporarily switched to display another indication.

In step 15, a test is made to determine if the loading request flag $F_{LDRQ}$ is set to 1. If this flag is set to 1, the status for the macro switch SWM and the lock switch SWL are tested (steps 16 and 17) to determine whether they have changed since their setting was stored in memory. If they have changed, processing diverges to a LOAD operation (step 18). If there have been no changes, the MAIN program proceeds to step 19.

In step 19, the status of the lock switch SWL is judged by examining the data input for this switch that was obtained from step 3. The lock switch SWL is set to ON when the camera is placed in a storage or non-use condition. In this case, the position code POS is examined to determine if it is equal to "$O_H$", that is, whether the lens been moved to the lock position (step 20). If the lens is already in the lock position, processing advances to step 21 and the LOCK subroutine is called. If the lens is not in the lock position, a ZM REV subroutine (step 22) is performed so as to reverse the rotation of the zoom motor, retracting the zoom lens into the camera body into the lock position.

When the lock switch SWL is set to OFF, the following operations are performed:

First, in step 23, the status of the macro switch SWM is examined. If the macro switch SWM is set to ON, as is required to set the lens into the position needed for close-up photography, an examination is made of the position code POS (step 24) to determine if it is equal to "$E_H$". When POS equals "$E_H$", the lens is already in the macro position. Therefore, processing advances to point A shown in FIG. 10.

If POS is not equal to "$E_H$", processing advances to steps 25 and 26, wherein an indication related counter SCANT is set to 8 and a ZM FOW subroutine is called to rotate the zoom motor in a forward direction. Step 25 is a timer instruction which causes the focal length of the lens to be displayed on the LCD panel for a period of one second. Thereafter, the MAIN program is re-executed.

When it is determined that the macro switch SWM is set to OFF in step 23, the lens needs to be in the range where POS equals "$2_H$"–"$C_H$". That is, the lens needs to be in the zoom range. Therefore, if the position code POS is greater than or equal to "$2_H$" (step 27), the next question to be answered is whether the position code POS is less than or equal to "$C_H$" (step 28).

When POS is less than "$2_H$" (that is, POS equals "$O_H$" or "$1_H$"), the lens is in the lock position or the boundary area between the lock position and the zoom range. Therefore, to pull the lens out to the zoom range to allow photographing, the above-mentioned operation to set the counter of step 25 is performed. Then, the processing for the zoom motor forward rotation of step 26 is carried out. When POS is larger than "$C_H$", the lens is in the macro position or the boundary area between the macro extremity and the zoom range. Therefore, after the indication counter SCANT is set to "8", in step 29A, the subroutine for the zoom motor reverse rotation is called in step 22.

When the judgment of steps 27 and 28 are both affirmative, the lens is in the zoom range. Thus, the condition of the zoom wide switch SWW is examined (step 29B). When this switch is set to ON, the indication on the LCD panel is switched from the film indication to display the focal length of the lens (step 30) and the indication counter SCANT is set to "8" (step 31). Then, wide extremity flag $F_{WIDE}$ is examined to determine if the lens is at the wide extremity (step 32). The wide extremity flag $F_{WIDE}$ is set to a value in step 116 of the POS INI subroutine (FIG. 11), step 162 of the ZM REV subroutine, steps 185 and 189 of the ZM FOR subroutine and step 211 of a WIDE subroutine. If this flag is set to 1, the lens is already at the wide extremity and cannot be moved any further. Therefore, processing advances to point A, shown in FIG. 10. If the wide extremity flag $F_{WIDE}$ is set to 0, the WIDE subroutine is called at step 33.

When it is determined that the wide switch SWW is set to OFF in step 29B, processing advances to point B, shown in FIG. 10, so that the status of the zoom tele switch SWT can be determined. When the tele switch SWT is set to ON, the LCD display is switched to indicate the focal length of the lens (step 35) and the counter SCANT is set to a value of "8" (step 35). Thereafter, the position code POS is examined to determine if it is equal to "$C_H$". When POS is equal to "$C_H$", the lens is already at the tele extremity. Therefore, processing jumps to step 49. When POS is not equal to "$C_H$", a TELE subroutine is called at step 38 of the MAIN program.

When the tele switch and wide switch are not set to ON, processing advances to step 39. In steps 39-42, the display of the LCD panel is switched according to the indication counter SCANT. In step 39, the counter SCANT is checked to see if it has been set to "0". As described above, SCANT is set to "8" when the zoom switches SWW and SWT are set to ON. If SCANT is not equal to "0", one count is subtracted from the indication counter SCANT (step 40). The MAIN program executes a loop between steps 2 and 50 every 125 milliseconds (ms). Therefore, a period of one second can be counted by successively reducing by "1" the value of the counter SCANT, which has previously been set to a value of "8".

Step 41 determines whether the indication counter SCANT has become "0" as a result of the above subtraction operation. If the counter is "0", one second has passed. When SCANT becomes "0", the indication on the LCD panel is switched from indicating the focal length of the lens to indicating the film frame number (step 42), while when it is not equal to "0", step 42 is skipped and the focal length indication of the lens is kept on the LCD display.

When it is judged that SCANT equals "0" in step 39, steps 40-42 are skipped.

In step 43, the loading request flag $F_{LDRQ}$ is checked to see if it is set to 1. If it is set to 1, the current setting of the release switch SWR is compared to its memory setting to determine if there has been a change (steps 44 and 45). When the release switch SWR has changed from being OFF to being ON, the LOAD instructions are executed by diverging from step 46. When the status of the release switch SWR has not changed or it has changed from ON to OFF, processing returns to the MAIN program. However, when the loading request flag $F_{LDRQ}$ is set to 1, the testing of the status of the photometry switch SWS in step 47 is not performed. Therefore, the operation of the photometry switch SWS has no effect on the camera.

When the loading request flag $F_{LDRQ}$ is set to 0, the setting of the photometry switch SWS is compared to its setting that is stored in memory (step 48) to determine if it has changed. If there is no change, or the setting has changed from ON to OFF, step 49 is executed so as to rewrite the switch data into the memory in step 3, after pausing for a period of 125 ms (step 50) before looping back to step 2.

Also, in the case where the macro switch SWM is set to ON and the lens is in the macro position or the wide switch SWW is set to ON and the lens is in the wide extremity or the tele switch SWT is set to ON and the lens being is in the tele extremity, processing advances to step 49.

When the photometry switch SWS is changed from OFF to ON, the indication counter SCANT is set to "1" (step 51) and the indication on the LCD panel is switched to display the focal length of the lens (step 52).

In step 53, exposure value Ev is calculated from the brightness information of a subject that is obtained from the Cds sensor and the film sensitivity that is calculated from the film DX code.

In steps 54-64, the status of the photometry switch SWS, battery switch SWB, release switch SWR and lock switch SWL are inputted and successively tested to determine if they are ON or OFF. First, in step 55, the status of the photometry switch SWS is determined. If this switch is set to OFF, processing returns to the start of the MAIN program. As the indication counter SCANT was set to "1" in step 51, SCANT becomes "0" in step 40 for the first loop and the focal length indication on the LCD panel is switched to indicate the number of film frames in step 42.

When the photometry switch SWS is ON (step 55), the battery switch SWB is tested to determine if it is ON (step 56). When the battery switch SWB is OFf, the BACKUP instructions are executed by diverging from step 57, while when the switch is ON, step 58 is executed to determine the setting of the release switch SWR.

When the release switch is set to ON, an EXPOSURE subroutine is called in step 59. This subroutine controls the operation of the camera shutter. Thereafter, a WIND subroutine is called in step 60 to advance the film by one frame. After the WIND subroutine has completed, a decision needs to be made as to whether to rewind the film (step 61). When the winding is normally finished, step 61 is negative. Thus, processing returns to the start of the MAIN program. If it is determined that the end of the film has been reached, a series of instructions to execute a REWIND operation are performed by diverging from step 62. If the release switch SWR is determined as being OFF in step 58, the status of the lock switch SWL is checked in step 64. When the lock switch SWL is ON, processing returns to the start of the MAIN program, while when the lock switch is OFF, processing loops back to step 54.

By the above explanation, each step of the MAIN program has been described. The following discussion will explain the operations that are performed by the various subroutines that are called by the MAIN program.

POSITION CODE INITIALIZATION (POS INI) Subroutine

Figure 11:
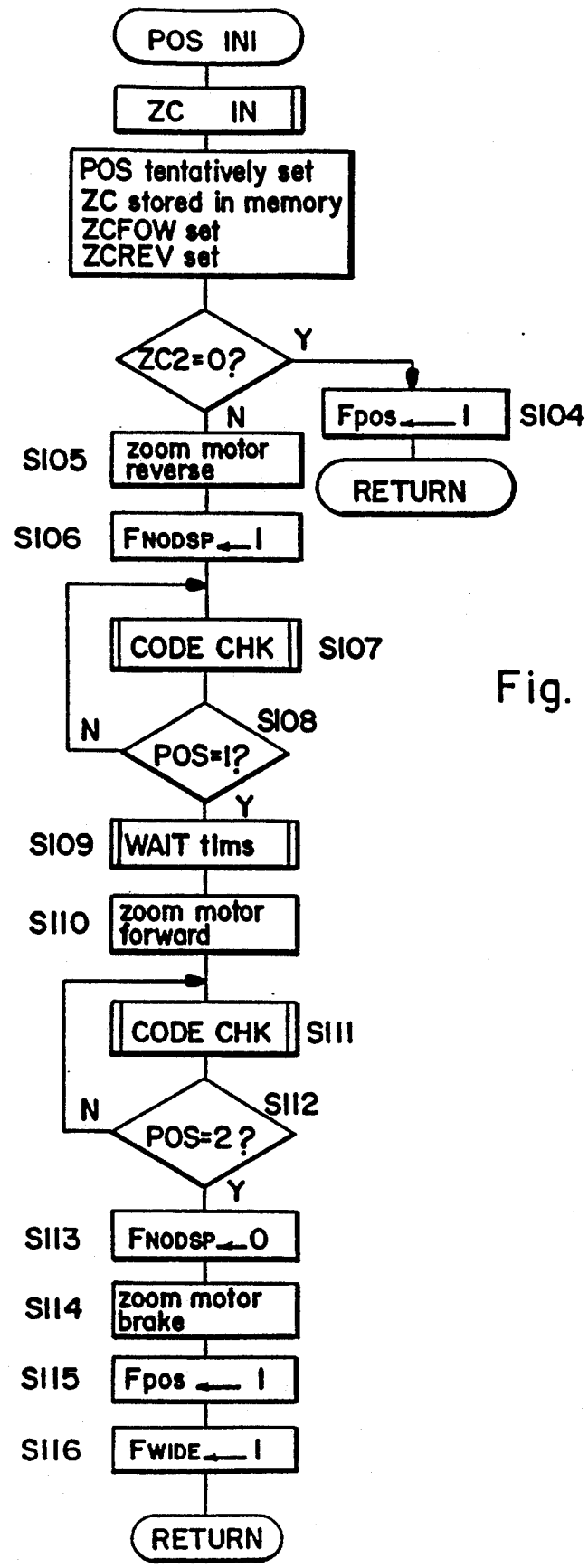
FIG. 11 illustrates a software flowchart diagram for a POSITION CODE INITIALIZATION subroutine which is called by the MAIN program shown in FIGS. 9 and 10.

FIG. 11 illustrates the initialization operations called for in step 4 of the MAIN program. Position code flag $F_{POS}$ is set to 0 when a RESET subroutine (shown in FIG. 20) is called or the zoom code ZC shows an abnormal value during a CODE CHECK subroutine (shown in FIG. 13). In the former case, the subroutine is executed the first time a battery is inserted into the camera, or where the battery is removed from the camera and not replaced within approximately seventeen minutes.

As the backup capacitor 320 current is usually lower than that required to maintain the camera memory after the battery is removed and left out of the camera for a period exceeding seventeen minutes, the camera constructed according to the present invention is designed to clear its memory when this situation occurs.

The initialization operation is intended to move the lens from the zoom range, where the zoom code is a relative code, through the wide extremity section to the absolute code section so as to restart the count for the amount of the lens movement from the absolute code section.

Figure 12:
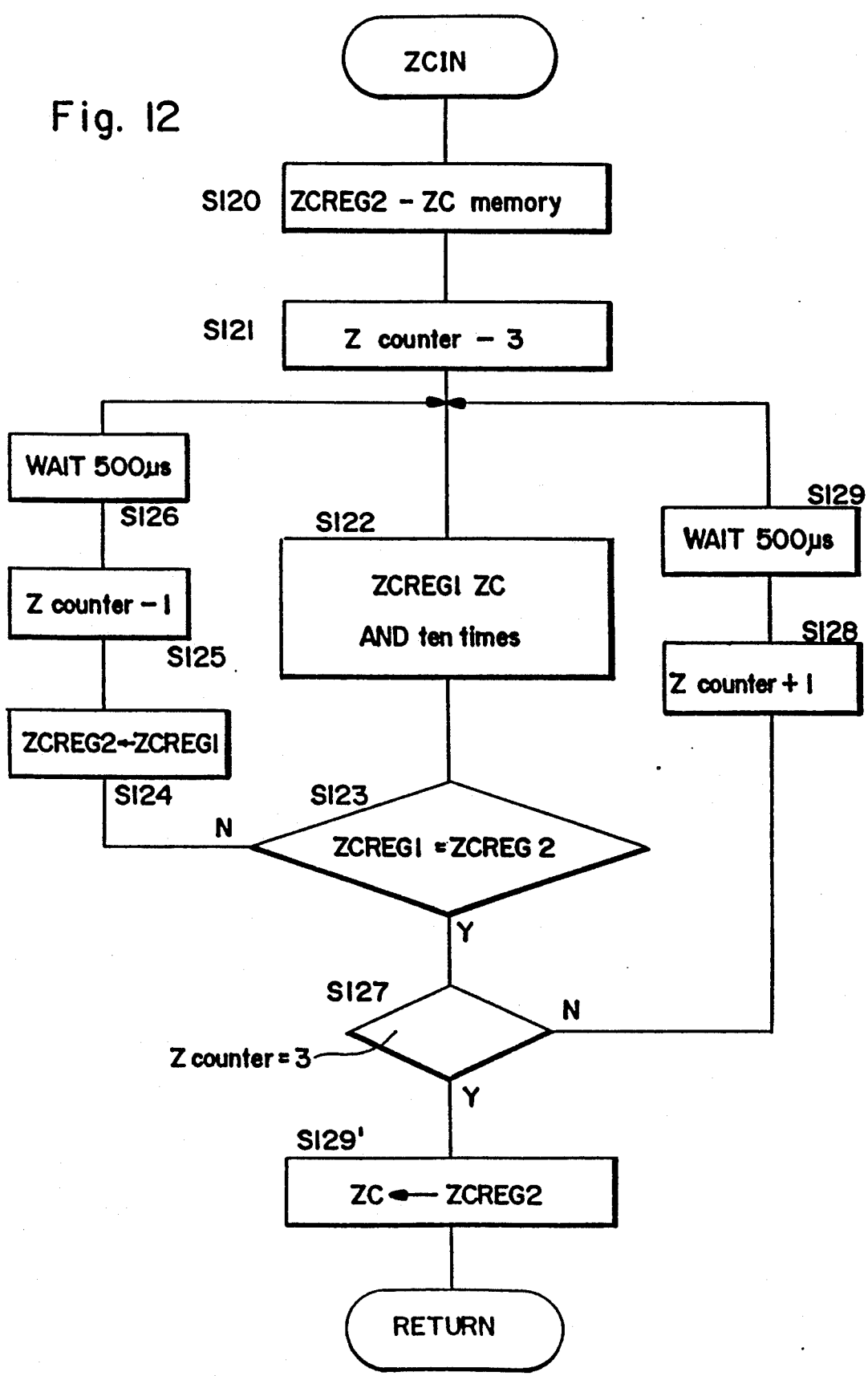
FIG. 12 illustrates a software flowchart diagram for a ZOOM CODE INPUT subroutine that is called by the POSITION CODE INITIALIZATION subroutine of FIG. 11.

Accordingly, the first instruction that is executed (step 101) is to input the zoom code ZC based upon the conductive condition of the brushes that are in contact with the code plate. This is accomplished by calling a ZOOM CODE INITIALIZATION (ZC IN) subroutine, which is illustrated in FIG. 12.

In step 102, the position code POS is tentatively set according to the input zoom code ZC. In addition, the change estimation values ZC FOW and ZC REV of the zoom code and tentative zoom code are stored in the camera's memory.

As shown in Table 1, the fifteen-step position code POS is obtained from a three-bit eight-step zoom code ZC. Accordingly, the position code POS is determined from the particular relationship of the zoom code ZC values to the position code POS values. Specifically, the "absolute" values of the zoom code ZC ("0", "1", "2", and "3") correspond in a one-to-one relationship with position code POS values of "$0_H$", "$1_H$", "$D_H$", and "$E_H$" and the "relative" code ZC values ("4", "5", "6", and "7") correspond in a multiple-to-one relationship with POS values of "$2_H$"–"$C_H$".

In the relative code section, position code POS equalling "$3_H$", "$7_H$" or "$B_H$" corresponds to a zoom code ZC of "4"; POS equalling "$2_H$", "$6_H$", or "$A_H$" corresponds to a zoom code ZC of "5"; POS equalling "$4_H$", "$8_H$", or "$C_H$" corresponds to a zoom code ZC of "6"; and POS equalling "$5_H$" or "$9_H$" corresponds to a zoom code ZC of "7". The temporary setting of the position code POS forcibly sets the zoom code to "4", "5", "6" or "7", corresponding to the relative code "$B_H$", "$A_H$", "$C_H$" or "$9_H$", respectively. When the photographing lens is in the range of POS equals "$2_H$"–"$8_H$", the value different from that for the actual lens position is set.

The zoom code value, which is supposed to change when the lens zooms to the tele or the wide extremity, is set for a change estimation value ZC FOW and ZC REV, respectively. However, this value is rewritten, together with the change of the position code POS in the CODE CHECK subroutine.

In step 102 of this subroutine, when the zoom code input in step 101 is set to "5", the position code POS is tentatively set to "$A_H$" and as a result, ZC FOW is set to "4" and ZC REV is set to "7".

In step 103, the output of terminal ZC2 is checked to determine if it is equal to 0. As shown in Table 1, the output of terminal ZC2 becomes 0 when the zoom code ZC is an absolute code. In the present instance, the temporary setting of the position code POS is correctly set. Thus, the subroutine sets the POS flag $F_{POS}$ to 1 and then returns to the MAIN program.

When the output of terminal ZC2 is 1, the zoom code ZC is the relative code and the temporarily set position code POS may not coincide with the actual position of the lens. Therefore, the zoom motor is rotated in the reverse direction (step 105) to move the lens into the absolute code section adjacent the wide extremity.

In step 106, the indication prohibition flag $F_{NODSP}$ is set to 1. This flag is used to determine if the focal length of the lens should be indicated when the CODE CHECK subroutine (to be discussed below) is executed. When this flag is set to 1, an incorrect focal length indication, which occurs when the temporarily set position code POS does not coincide with the actual photographing lens position, is prohibited from being displayed on the LCD panel. This flag is also used for the WIDE subroutine, which will also be discussed below.

In step 107, a CODE CHECK (CODE CHK) subroutine (see FIG. 13) is called to verify the position code. Processing loops through steps 107 and 108 until the position code POS is equal to "$1_H$". When the position code POS is equal to "$1_H$", step 109 is executed so as to introduce a delay period of $t_1$ ms before the zoom motor is activated to rotate in the forward direction so as to eliminate backlash of the mechanical system.

Thereafter, the CODE CHECK subroutine is re-run (step 111), a plurality of times if necessary, until the position code POS is equal to "$2_H$" (step 112). When the position code is equal to "$2_H$", the indication prohibition flag $F_{NODSP}$ is set to 0 (step 113) and the zoom motor is stopped in step 114.

Finally, the position code flag $F_{POS}$ and wide extremity flag $F_{WIDE}$ are set to 1 (steps 115 and 116) prior to returning to the MAIN program.

ZOOM CODE INPUT (ZC IN) Subroutine

FIG. 12 shows the ZOOM CODE INPUT subroutine that is performed in the POSITION CODE INITIALIZATION subroutine and the CODE CHECK subroutine.

This subroutine improves the reliability of the zoom code that is detected by the interfacing of the brush terminals ZC0, ZC1 and ZC2 with the code plate. The outputs of the brushes are compared by repeating the input of the zoom code ten times. When the results coincide three times, the zoom code for these results are defined.

When considering the contact relationship between the code plate and the brush terminals, an OFF (signal level "1") signal may be detected due to a momentary separation of a terminal, when the position should really be an ON (signal level "0") signal. Therefore, the detection results are electrically AND'ed together and the particular terminal is considered as being conductive if it is detected as conductive at least once in every ten tests. This prevents a brush terminal from being incorrectly read due to the momentary separation of a terminal with the code plate.

When this subroutine is called, the zoom code ZC stored in REGISTER 2, i.e., ZCREG2, of the memory is read and a Z counter is set to "3". Then, the AND'ed result obtained by inputting the zoom code ten times is stored in REGISTER 1, ACREG1, (steps 120–122). The value of REGISTER 1 is then compared with that of REGISTER 2 (step 123). If the two registers are different, the value of REGISTER 1 is moved to REGISTER 2 in step 124.

In steps 124–126, the Z counter is set to "1" and the subroutine is placed in a standby mode for 500 microseconds (us) before another zoom code is inputted. When the detection result of this cycle is the same as that of the previous cycle, REGISTER 2 becomes equal to REGISTER 1. Therefore, the Z counter is examined (step 127) to decide if it is equal to "3". When the Z counter is not equal to "3", it is incremented by "1" (step 128) and processing returns to step 122 after a pause of 500 us.

When the Z counter is equal to "3" (in step 12&), meaning that REGISTER 1 has been equal to REGISTER 2 for three successive cycles of steps 122 and 123 after the zoom code ZC has shown different values from the zoom code memory, the value of REGISTER 2 is defined as the zoom code ZC (step 129') and processing returns to the point from which ZC IN subroutine was called.

CODE CHECK (CODE CHK) Subroutine

Figure 13:
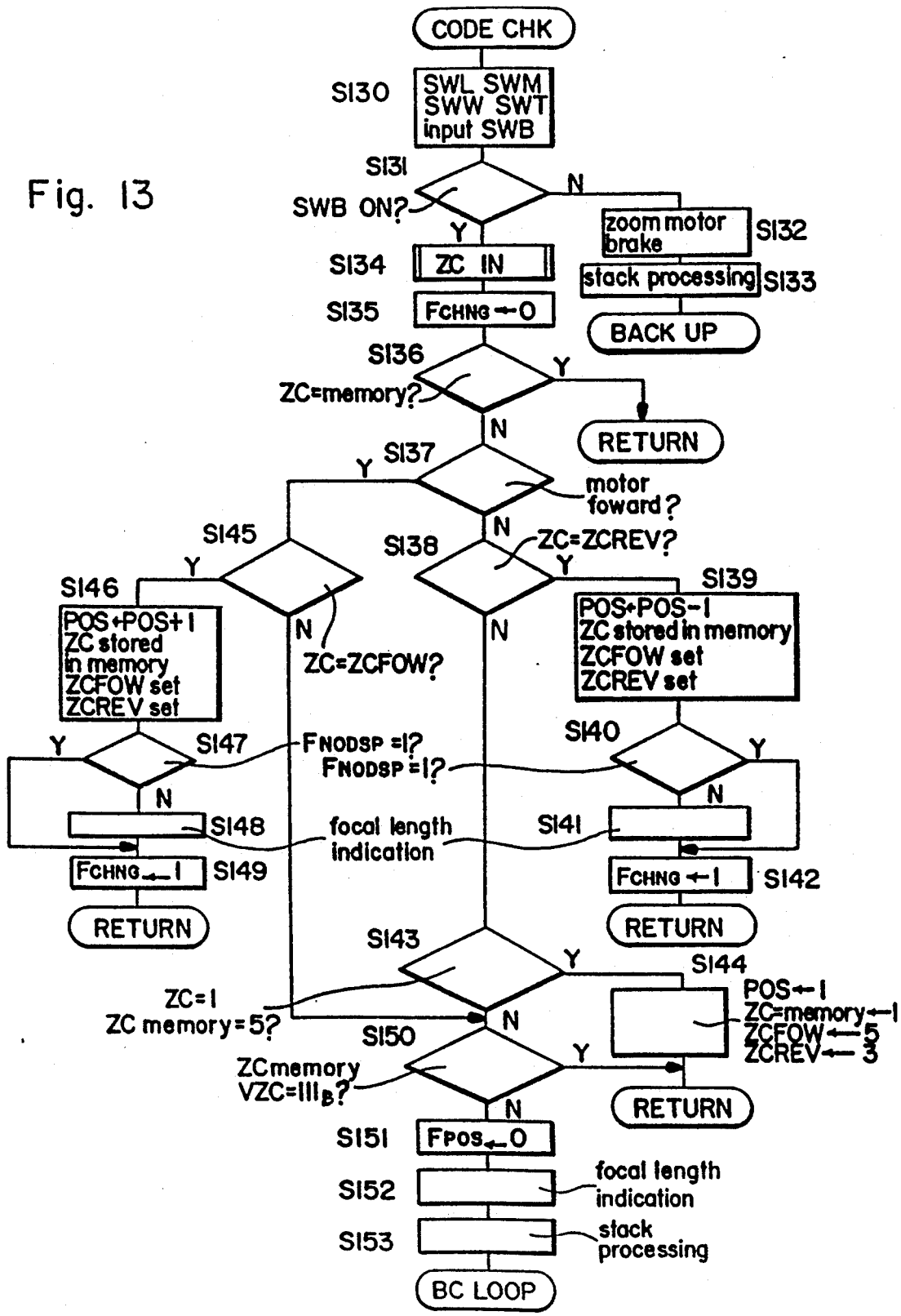
FIG. 13 illustrates a software flowchart diagram of a CODE CHECK subroutine that is called by the POSITION CODE INITIALIZATION subroutine of FIG. 11.

FIG. 13 illustrates the CODE CHECK subroutine which changes the position code POS according to the zoom code ZC, which itself changes following a zooming operation. This subroutine is frequently used in the zoom-related processing shown in FIGS. 14–17, in addition to the above-mentioned POSITION CODE INITIALIZATION subroutine.

In step 130, data relating to the lock switch SWL, macro switch SWM, battery switch SWB, wide switch SWW and tele switch SWT are inputted. In step 131, the status of the battery switch SWB is determined. IF this switch is OFF, the brake is applied to the zoom motor (step 132), register stack processing of the CPU 100 is performed (step 133) and processing diverges to the BACKUP instructions, shown in FIG. 18.

When the battery switch is ON, the zoom code ZC is inputted by executing the above-described ZOOM CODE INPUT subroutine (step 134). Thereafter, a code change flag $F_{CHNG}$ is cleared and set to 0 (step 135) prior to comparing the content of the zoom code ZC and the zoom code stored in memory (step 136). The code change flag $F_{CHNG}$ is used only for this CODE CHECK subroutine to determine whether the position code POS has been rewritten in the zoom relates processing.

If the zoom code is equal to the value stored in memory, the subroutine exits, returning to the point from which it was called. However, as the zoom motor rotates, the zoom code value becomes different from that stored in memory. When the zoom code is different from that stored in memory, it is necessary to decide if the zoom motor is rotating in the forward direction (step 137).

When the zoom motor is rotating in the reverse direction, it is determined whether the changed zoom code ZC coincides with the change estimation value ZC REV (step 138). When this CODE CHECK subroutine is called in the zoom operations shown in FIGS. 14-17, the changed zoom code normally coincides with the changed estimation value. Accordingly, in step 139, the value "$1_H$" is subtracted from the position code POS, the zoom code stored in memory is rewritten to the value obtained after the zoom lens has moved and the change estimation values ZC FOW and ZC REV are reset to correspond to the position code POS obtained after the subtraction is performed. The value of the indication prohibition flag $F_{NODSP}$ is then examined to determine if it has been set to 1. If this flag has been set to a value of 0, the focal length of the lens is indicated on the display panel (step 141). When the value of the prohibition flag is set to 1, step 141 is skipped. Regardless of whether the focal length of the lens is displayed or not, the code change flag $F_{CHNG}$ is the set to 1 in step 142 before the subroutine returns to where it was called.

However, when the CODE CHECK subroutine is called in step 107 of the POSITION CODE INITIALIZATION subroutine (FIG. 11), the zoom code after the lens has moved may be different from the change estimation value. In the same way as that for the above-mentioned example, when the temporarily set POS is "$A_H$", ZC REV is "7", ZC FOW is "4", while when the actual lens position before changing is POS equals "$2_H$", the zoom code ZC after the lens moves becomes equal to "1" for a change code estimation ZC REV of "7". As a result, the two are not equal and processing advances from step 138 to step 143. In step 143, the zoom code ZC after changing is tested to determine if it is equal to "1" while the zoom code before changing is equal to 5. If the comparison for the two are affirmative, processing advances to step 144, where the camera concludes that the lens has moved from a position code POS of "$2_H$" to a position code POS of "$1_H$". As a result, the position code POS is forcibly set to "$1_H$", and stored in memory, ZC FOW is set to "5" and ZC REV is set to "3". Thereafter, control returns to the point from which the subroutine was called.

Due to the above operation, if there is an error in the temporarily set position code, it is corrected.

Returning to step 137, if it is determined that the zoom motor is rotating in the forward direction, the subroutine proceeds to step 145, where it is decided whether the zoom code ZC after the lens has moved is equal to the change estimation value ZC FOW. If they are the same, the position code POS is increased by "$1_H$", the zoom code is stored in memory, and the change estimation codes ZC FOW and ZC REV are set (step 146). For example, if the lens is moved to a point where the position code POS is equal to "$4_H$", ZC FOW will be equal to "7" and ZC REV will be equal to "4". Then, the value of the indication prohibition flag $F_{NODSP}$ is examined to determine if it has been set to 1. If this flag has been set to a value of 0, the focal length of the lens is indicated on the display panel (step 148). When the value of the prohibition flag is set to 1, step 148 is skipped. Regardless of whether the focal length of the lens is displayed or not, the code change flag $F_{CHNG}$ is the set to 1 in step 149 before the subroutine returns to where it was called.

It is not always determined in step 136 that the zoom code stored in memory is different from the zoom code inputted in step 134 when the lens zooms by the change caused by actually switching the zoom code, as mentioned above. Namely, it is supposed that even though the lens is actually in the position which has the same position code bit, which should be 0, is detected as 1 due to a brush not contacting the code plate. This separation of the brush from the code plate can occur due to a camera vibration or the existence of dust on the code plate, to name a few causes. Thus, the zoom code input does not agree with the value stored in memory. In this case, the zoom code ZC does not agree with the change estimation value ZC REV and ZC FOW and the test performed in step 143 generates a negative result.

Therefore, the zoom code input in step 134 is electrically OR'ed to reverse the logic of the zoom code stored in the memory. This reversed value is tested to determine if it is equal to "$111_{binary}$" (step 150). Because an electrical OR'ing operation is performed for the reverse and positive logic of two codes detected in the position where the same POS values are obtained, the result always becomes equal to "$111_{binary}$", even if a bit, which should be 0, is interpreted as a 1 and the judgment in step 150 becomes affirmative.

For example, when the zoom code stored in memory is the normal value "$001_{binary}$" at the position where POS equals "$7_H$" and an incorrect code "$011_{binary}$" is detected because terminal ZC1, which should be conductive, becomes off, "$111_{binary}$" is obtained by electrically OR'ing for the reverse logic of the value in memory "$110_{binary}$" and the code "$011_{binary}$". This prevents an erroneous position code POS reading when a brush terminal, that should be detected as ON is detected as OFF.

According to the present invention, any change in the zoom code due to the separation of a brush from the code plate is not considered as resulting in a change in the position code but, rather, is handled as an erroneous reading of the position code. The construction of a camera system as described herein makes it possible to produce a more accurate lens position detecting system while also preventing inaccurate exposure operations.

When the zoom code becomes an abnormal value, due to a cause other than the above-mentioned described momentary brush terminal separation situation, steps 151-153 are executed. In these steps, the POS flag $F_{POS}$ is set to 0 in step 151, the focal length of the lens is indicated on the display panel and CPU register stack processing is performed. Then, processing diverges to a series of instructions (shown in FIG. 19) to execute a BAD CHECK (BC LOOP) operation.

As an example, assume the camera has a memorized zoom code of "$011_{binary}$". This yields a reverse code of "$110_{binary}$". Further, assume a new code is inputted, having a value of "$110_{binary}$". Electrically OR'ing the reverse code with the new inputted code produces a value "$110_{binary}$". Because the electrical OR'ing operation did not equal "$111_{binary}$", processing goes to the BAD CHECK LOOP (BC LOOP) Operation. Thus, when the position code equals "$7_H$", but the data indicates the lens is at the point where the position code POS equals "$0_H$", processing diverges to the BAD CHECK LOOP (BC LOOP) Operation.

ZOOM REVERSE ROTATION (ZMREV) Subroutine

Figure 14:
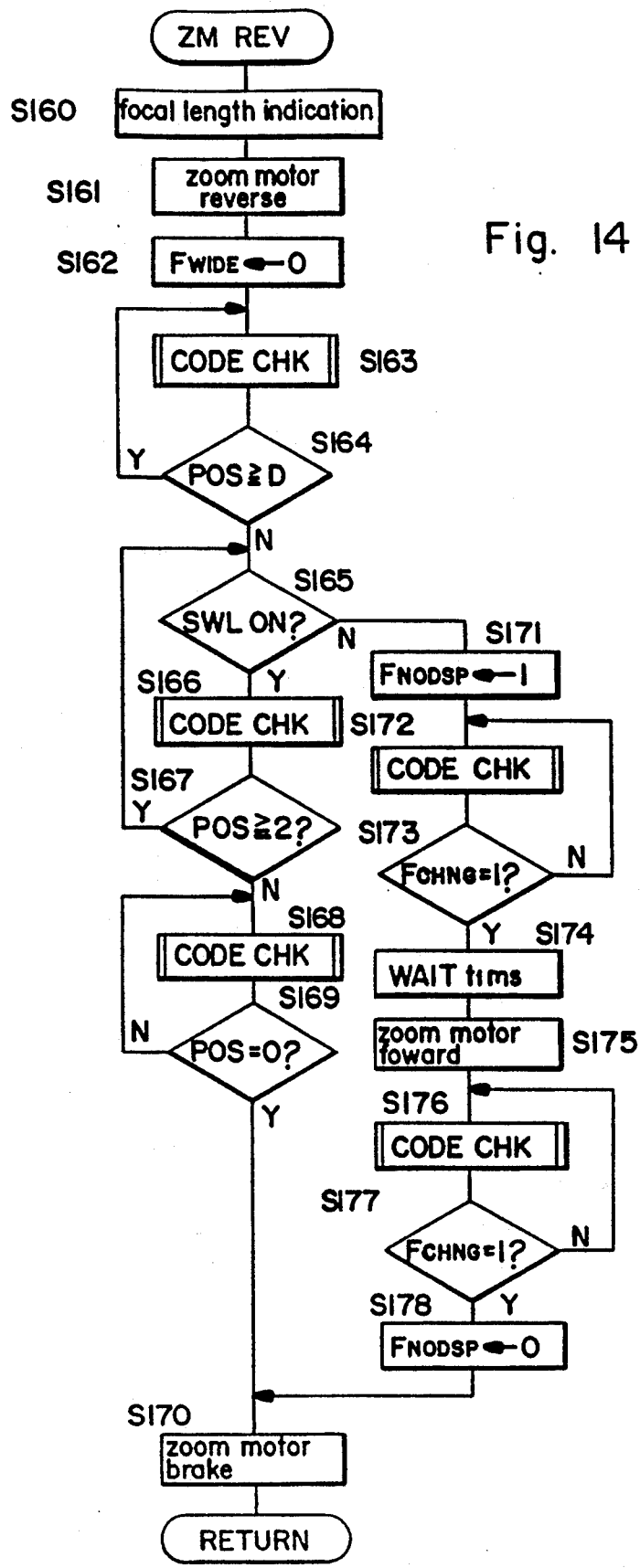
FIG. 14 illustrates a software flowchart diagram of a ZOOM REVERSE ROTATION subroutine that is called by the MAIN program shown in FIGS. 9 and 10.

FIG. 14 illustrates the flowchart for the ZOOM MOTOR REVERSE ROTATION subroutine which is called in step 22 of the MAIN program. This subroutine pulls the lens into the lock position when the lock switch SWL is ON, when the lock switch is set to OFF in the zoom range during an operation to pull in the lens, and the operation which returns the lens from the macro position to the zoom range when the macro switch is set to OFF. To stop the lens in the zoom range, a forward rotation operation is included to remove any possible backlash.

When this subroutine is called, the focal length of the lens is indicated on the LCD panel as the lens is rotated in the reverse direction (steps 160 and 161). Thereafter, wide extremity flag $F_{WIDE}$ is cleared and reset to 0.

The ZMREV subroutine calls the CODE CHK subroutine to obtain the position code of the lens (step 163). The position code POS is then tested to determine whether it is greater than or equal to "$D_H$". Until the position code is at least equal to "$D_H$", processing loops between steps 163 and 164. When the position code becomes greater than or equal to "$D_H$", the lens is in the zoom range or in the lock position and processing continues to step 165.

In step 165, the lock switch SWL is checked to determine if it is set to ON. If this switch is ON, processing goes to the CODE CHK subroutine step 166). The position code POS is then checked to determine if it is greater than or equal to "$2_H$". When the position code is greater than or equal to "$2_H$", the lens is in the zoom range. Thus, processing loops between steps 165-167. When the position code POS becomes smaller than "$2_H$", the execution of the loop is terminated and processing proceeds to step 168.

In step 168, the CODE CHK subroutine is recalled. Thereafter, the position code POS is checked to determine if it is equal to "$0_H$". Until the position code is "$0_H$", a loop is executed between the operation of executing the CODE CHK subroutine and testing the position code (steps 168 and 169). Once the position code is "$0_H$", step 170 is executed to apply a zoom motor brake to stop the movement of the lens. Control then returns to the MAIN program.

However, when the lock switch SWL is detected as being OFF in step 130 of the CODE CHECK subroutine (that was called in step 166 of the present subroutine), while the lens is judged to be in the zoom range in step 167, the position of the lock switch SWL in step 165 will be judged to be OFF. Accordingly, processing will proceed to steps 171-178.

When the lock switch SWL is determined as being OFF in step 165, the indication prohibition flag $F_{NODSP}$ is set to 1 (step 171). The CODE CHK subroutine is then executed (step 172), after which the code change flag $F_{CHNG}$ tested (in step 173) to determine if it has been set to 1 (in step 139 of the CODE CHECK subroutine). Until the code change flag is set to 1, processing loops through steps 172 and 173. After it is determined that the code change flag $F_{CHNG}$ has been set to 1, that is, the position code POS has been renewed, processing pauses for $t_1$ ms (step 174) before rotating the zoom motor in a forward direction in step 175.

When the position code POS is renewed in the loop of steps 176 and 177, the indication prohibition flag $F_{NODSP}$ is cleared in step 178. The zoom motor brake is then applied (step 170) and control returns to the point from which this subroutine was called. The stop position of the lens in this operation has twelve steps, shown by circles in FIG. 26.

Figure 26:
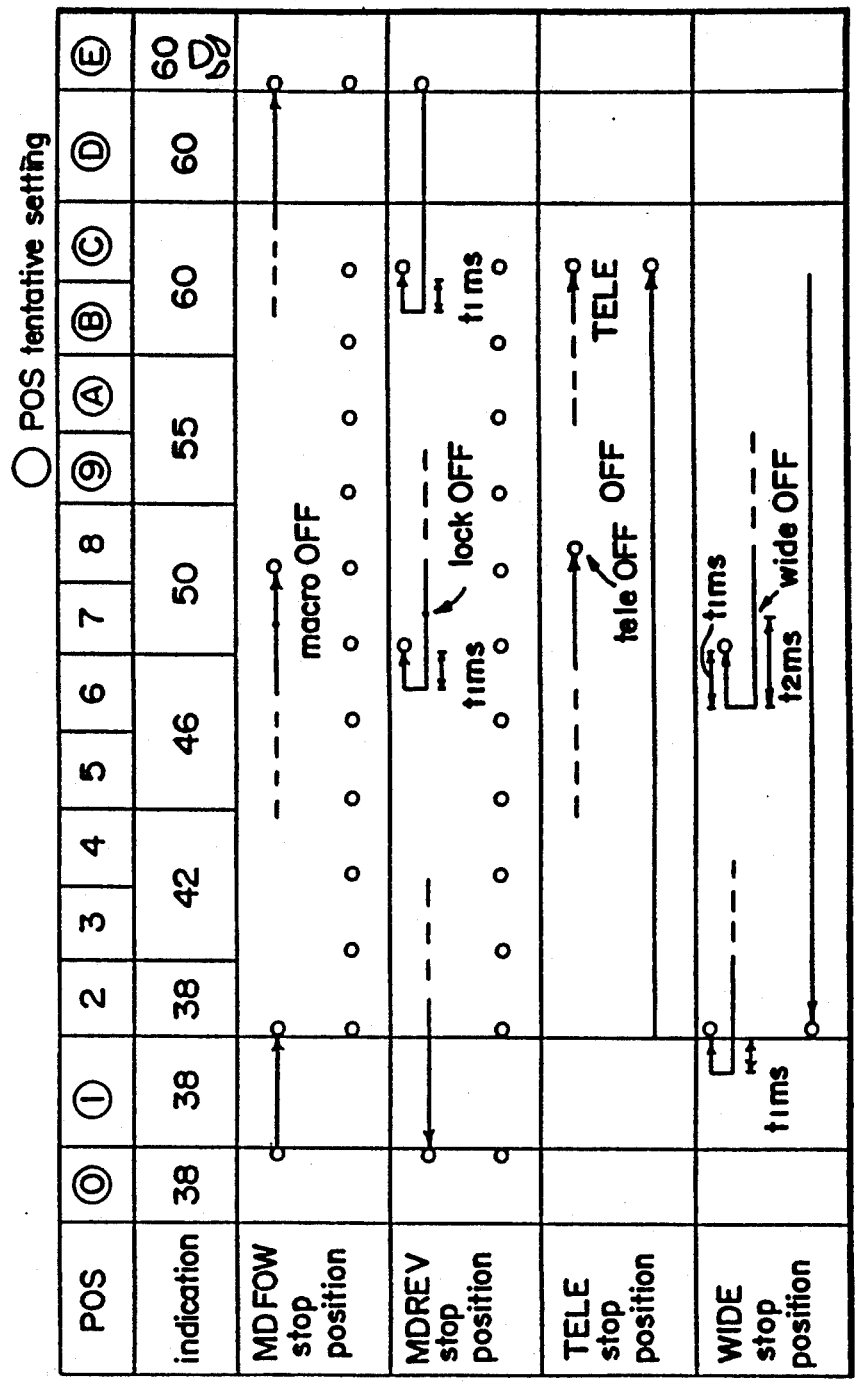
FIG. 26 graphically illustrates the zooming operation of the lens system used with the camera that is constructed according to the present invention.

In the ZOOM MOTOR REVERSE subroutine, the zoom motor is stopped at the point where the position code POS is renewed by rotating the zoom motor forward after the motor has once passed the boundary section of a position code POS. This cancels any possible backlash that may occur. For example, as shown in FIG. 26, when the lock switch SWL is changed from ON to OFF at the position where POS equals "$7_H$" and the focal length indication is not prohibited, the value "46 mm" is indicated on the display panel. When the zoom motor causes the lens to enter the area where POS equals "$6_H$", the display is changed to indicate "50 mm" when it enters the area of POS equals "$7_H$". This may give a user the impression that the camera is malfunctioning by switching to the tele range just before the stop operation, despite the fact that the operation shifts the focal length of the lens to the wide extremity. Therefore, to prevent such a misconception, the indication prohibition flag $F_{NODSP}$ is set to 0 (step 178) so that the focal length indication of the lens is shown again at the point when the zoom motor stops rotating.

When this subroutine is called in step 22 of the MAIN program, the focal length indication is maintained on the display for a period of one second, in response to the indication counter SCANT being set to "8" in step 29.

ZOOM FORWARD ROTATION (ZMFOW) Subroutine

Figure 15:
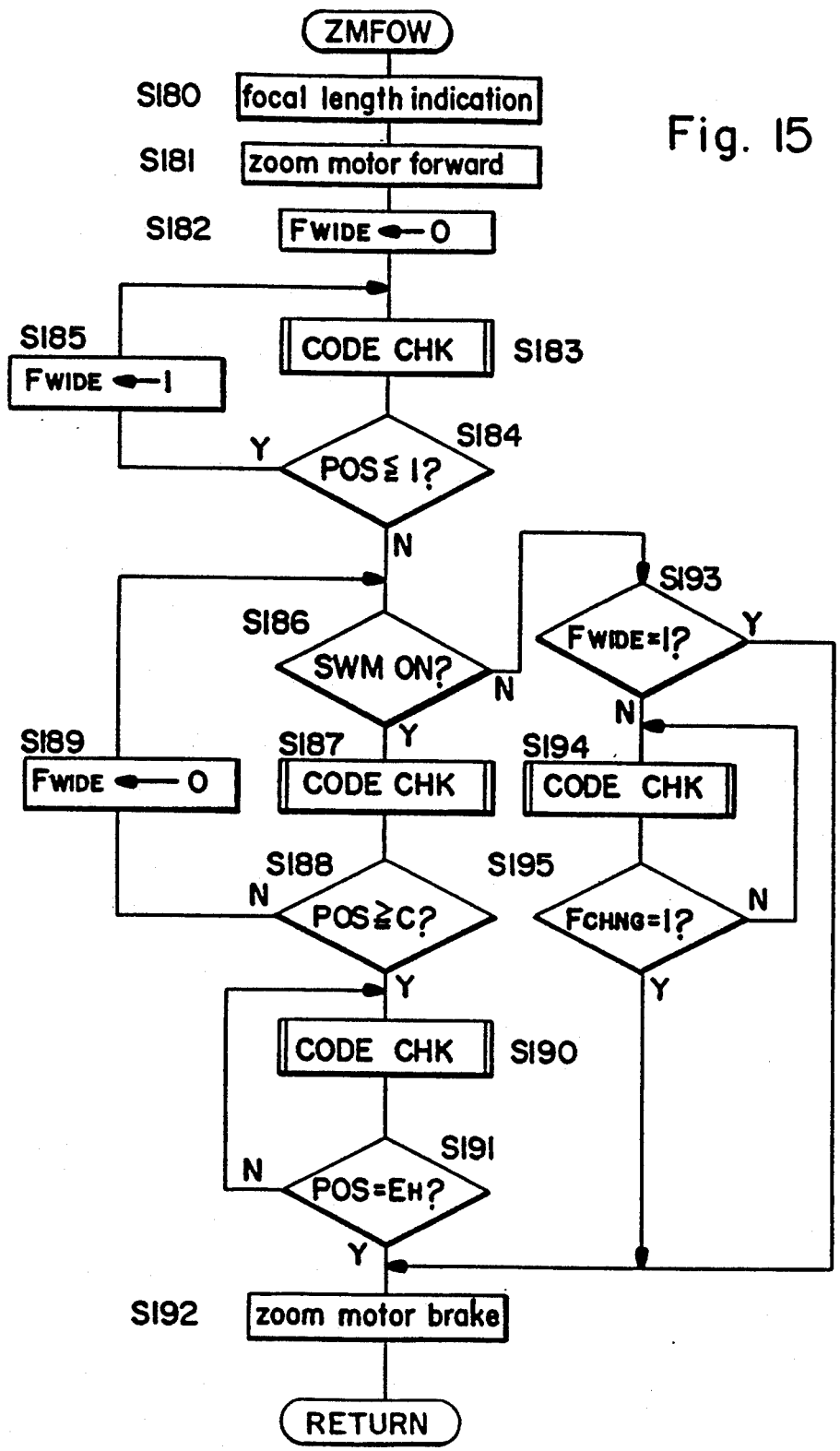
FIG. 15 illustrates a software flowchart diagram of a ZOOM FORWARD ROTATION subroutine that is called by the MAIN program shown in FIGS. 9 and 10.

FIG. 15 shows the flowchart of the ZOOM MOTOR FORWARD ROTATION subroutine, which is called in step 26 of the MAIN program. This subroutine prescribes the operation that occurs when the lock switch SWL is changed from ON to OFF, the macro switch SWM is changed from OFF to ON and then the macro switch SWM is set to OFF before the lens reaches the macro extremity.

When the ZOOM MOTOR FORWARD ROTATION subroutine is called, the focal length of the lens is indicated on the LCD display. In addition, the wide extremity flag $F_{WIDE}$ is cleared and set to 0, while the zoom motor starts to rotate the lens in a forward direction (steps 180-182).

The CODE CHECK subroutine is performed and a determination is made as to whether the position code POS is less than or equal to "$1_H$" (steps 183 and 184). If the position code is equal to "$0_H$" or "$1_H$", the lens is in a position between the wide extremity of the zoom range and the lock position. To permit the motor in the forward rotation to pass the wide extremity or stop at the wide extremity, the wide extremity flag $F_{WIDE}$ is set to 1 in step 185. Processing then loops back to step 183.

The camera constructed according to the present invention is designed so that backlash from the gear system is removed and the stop position of the lens in the wide extremity is set just after the position code POS switches from "$1_H$" to "$2_H$". For instance, the lens is not always positioned at the wide extremity of the focal length (i.e., 38 mm) even when the position code POS is set to "$2_H$". It cannot always be determined if the lens is in the wide extremity by only examining the position code POS. That is the reason for the setting of the wide extremity flag $F_{WIDE}$.

If the position code POS becomes greater than "$1_H$", according to the movement of the lens to the wide extremity, or the position code POS is already greater than "$1_H$" at the time that this subroutine is called, the macro switch SWM is checked to determine if it has been set to ON (step 186).

When the macro switch SWM is ON, processing advances to step 187, so that the lens is moved to the macro extremity where the position code POS is "$E_H$". When the value of the position code obtained from the CODE CHECK subroutine called in step 187 is determined to be less than "$C_H$" (step 188), that is, the lens is in the zoom range, processing goes to step 190 to set the wide flag $F_{WIDE}$ to 0, before looping back to step 186. Thus, as long as the position code is less than $C_H$, a loop comprising steps 186-189 is formed.

At some point, the position code will be greater than or equal to "$C_H$". When this occurs, process breaks out of the loop and goes to step 190, which repeats the CODE CHK subroutine (steps 190 and 191) until the position code becomes equal to "$E_H$". When this occurs, the zoom motor brake is applied (step 192) and processing returns to the point just after from which this subroutine was called.

When the macro switch SWM is determined to be OFF (in step 186), or it is set to OFF while the lens is in the zoom range, the wide extremity flag $F_{WIDE}$ is tested (step 193) to determine its status.

As noted above, the wide extremity flag $F_{WIDE}$ has been set to 1 in step 185 and processing advances to step 186 just after the position code POS switched from "$1_H$" to "$2_H$", that is, the lens is in the wide extremity. In this case, the zoom motor is stopped in step 192, the lens being set to the wide extremity and the subroutine ends.

However, when the wide extremity flag $F_{WIDE}$ is 0 in step 193, processing loops through steps 194 and 195 until the position code POS is switched in step 195 as detecting the result obtained from the CODE CHECK subroutine called in step 194. When the position code POS changes, as indicated by the code change flag $F_{CHNG}$ being set to 1, the zoom motor brake is applied in step 192 and the subroutine ends.

There are twelve stop positions performed by this subroutine for the lens which are marked by circles in FIG. 26.

For example, when the lens is in the lock position and the lock switch is set to OFF so as to call this subroutine, the stop position is set to the point where the position code POS switches from "$1_H$" to "$2_H$", that is, the wide extremity. When the macro switch is changed from ON to OFF in the range of POS equals "$7_H$", the lens stops at the point where the position code POS switches from "$7_H$" to "$8_H$".

ZOOM WIDE (WIDE) Subroutine

Figure 16:
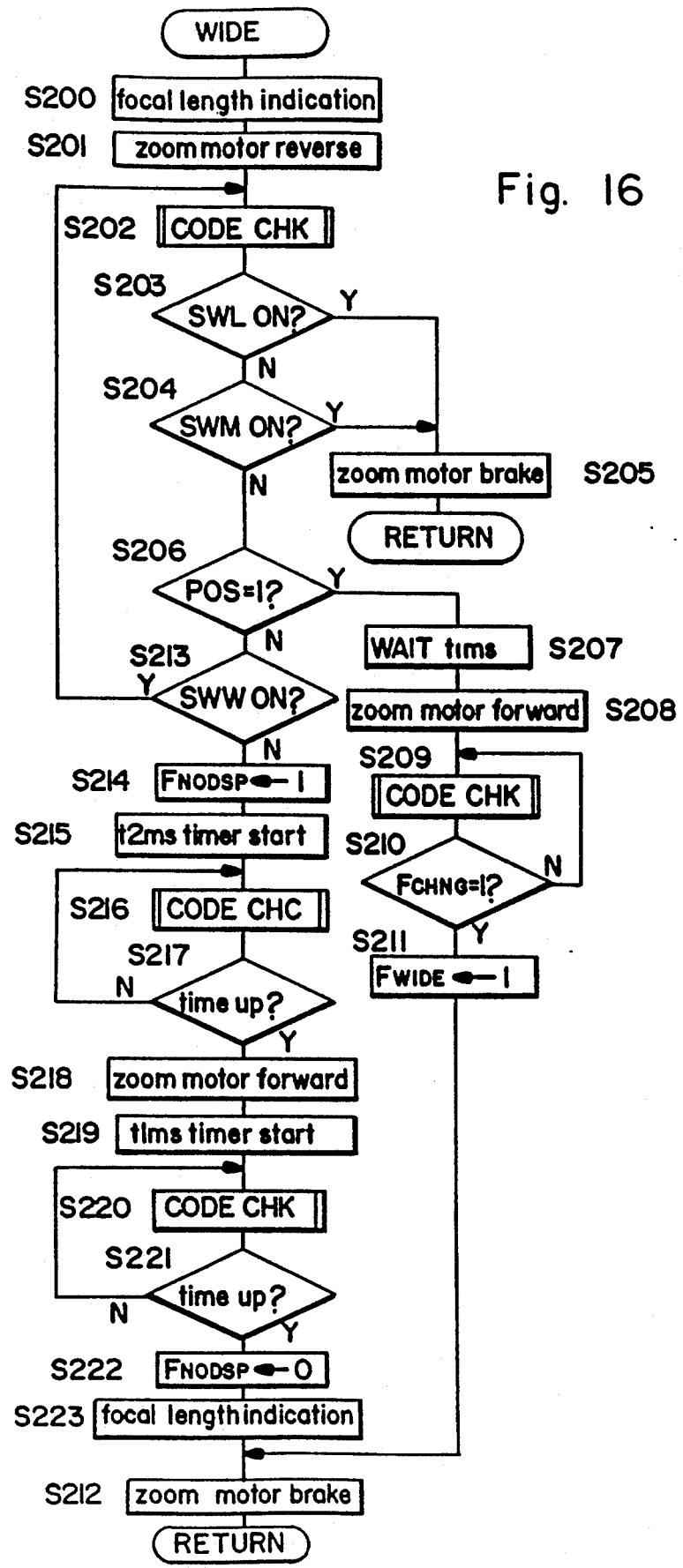
FIG. 16 illustrates a software flowchart diagram for a ZOOM WIDE subroutine that is called by the MAIN program shown in FIGS. 9 and 10.

FIG. 16 illustrates the flowchart of the ZOOM WIDE subroutine that is called by setting the zoom wide switch SWW to ON when the lens is in the zoom mode and does not reach the wide extremity. The operations to shift the focal length of the lens to the wide extremity are similar to the operations performed in the above-described ZOOM MOTOR REVERSE ROTATION subroutine. However, in the WIDE subroutine, the lens can stop at any desired position in its travel range.

When the WIDE subroutine is invoked, the focal length of the lens is indicated on the LCD display panel (step 200) and the zoom motor is caused to start rotating in the reverse direction (step 201). Thereafter, the CODE CHECK subroutine is executed and the status of the lock switch SWL, macro switch SWM, wide switch SWW and position code POS are checked. If either the lock switch SWL or the macro switch SWM is ON (steps 203 and 204), the zoom motor brake is applied and processing returns to the MAIN program. When both switches are OFF, the position code POS is checked to determine if it is equal to "$1_H$" in step 206, which indicates that the lens is in a stop prohibition area between the lock position and the zoom range. If the lens is in the stop prohibition area, the zoom motor is rotated forward (step 208) after having paused for a period of $t_1$ ms, as shown in FIG. 26. The subroutine waits until the position code POS switches from a value of "$1_H$" to "$2_H$" in steps 209 and 210. When the position code changes, as indicated by the status of the code change flag $F_{CHNG}$, the wide extremity flag $F_{WIDE}$ is set to 1 (step 211), the zoom motor brake is applied (step 212) and the subroutine ends. In this case, the lens is set to the wide extremity.

When the position code POS, tested in step 206, does not equal "$1_H$", the status of the wide switch SWW is checked in step 213. If the wide switch SWW is set to ON, processing loops back to step 202. Thus, in this case, a loop is formed involving steps 202-213 until the lens reached the wide extremity.

When the wide switch is set to OFF, as determined in step 213, the indication prohibition flap $F_{NODSP}$ is set to 1 (step 214) and a timer is started to count a period of $t_2$ ms (step 215). Then, the position code POS is obtained by executing the CODE CHK subroutine in step 216. If the time period has not reached $t_2$ ms (step 217), processing jumps back to step 216. When the time period $t_2$ ms is reached, the zoom motor is started to rotate in the forward direction (step 218) to move the lens to the tele range. In step 219, the $t_1$ ms timer is restarted and the CODE CHK subroutine is rerun. Then, the CODE CHK subroutine is executed and the timer is checked to see if the time period $t_1$ ms has been reached. If the time period has not been reached, processing jumps back to step 220 to re-execute the CODE CHK subroutine. When the time period $t_1$ ms has been reached, processing advances to step 222.

The time periods for the two timers are selected such that $t_1$ is less than $t_2$, as shown in FIG. 26. The time period $t_1$ corresponds to the time that is required to eliminate backlash of the mechanical system, while the time period $t_2$ corresponds to the an arbitrary value that is larger than $t_1$. If the time period $t_2$ is shorter than $t_1$, the lens would stop at a point closer to the tele extremity than is desired.

In step 222, the indication prohibition flag $F_{NODSP}$ is cleared and set to 0. The purpose of this flag setting was explained in the ZOOM MOTOR REVERSE ROTATION subroutine. Then, the focal length of the lens is displayed on the LCD display panel, the zoom motor brake is applied and the subroutine returns to the MAIN program.

ZOOM TELE (TELE) Subroutine

Figure 17:
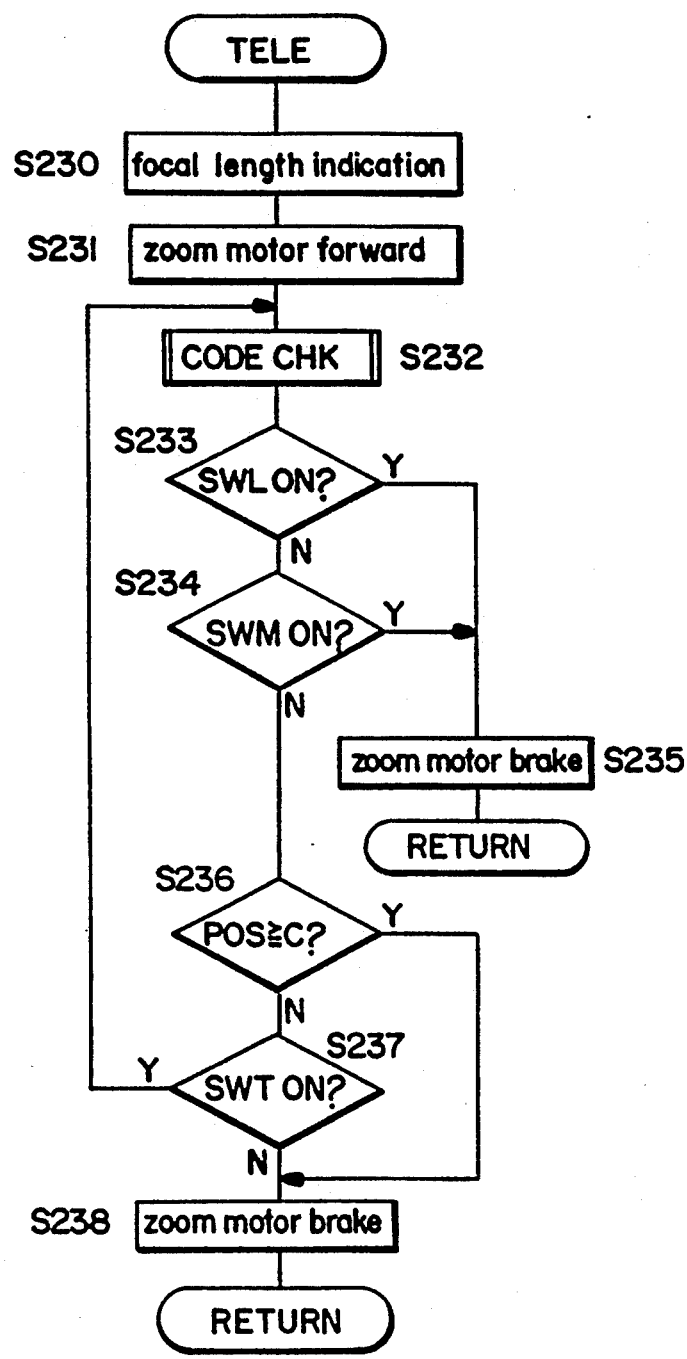
FIG. 17 illustrates a software flowchart diagram for ZOOM TELE subroutine that is called by the MAIN program shown in FIGS. 9 and 10.

FIG. 17 shows the flowchart of the TELE subroutine, which is called in step 38 of the MAIN program. This subroutine is called by setting the tele switch SWT to ON when the lens is in the zoom range and the position code POS is not equal to "$C_H$". The operation of activating the zoom motor so that it rotates in a forward direction to move the lens to the tele extremity is similar to the operation performed in the above-described ZOOM MOTOR FORWARD ROTATION subroutine. It is the same as the WIDE subroutine in that the lens can stop at any desired position in its travel range.

When the TELE subroutine is called, the focal length of the lens is indicated on the LCD display panel and the zoom motor starts to rotate in a forward direction. The CODE CHK subroutine is called in step 232, and the status of the lock switch SWL, the macro switch SWM, the tele switch SWT and the position code POS are checked. If either the lock switch or the macro switch (steps 233 and 234) are ON, processing advances to step 235, which applies the zoom motor brake and returns to the point just after where the subroutine was called.

When the lock switch and the macro switch are both OFF, the position code POS is examined (in step 236) to determine whether it is greater than or equal to "$C_H$". If the position code is less than "$C_H$", the tele switch is checked to determine if it is still ON (step 237). When the position code POS is greater than or equal to "$C_H$", the test that is performed on the tele switch is skipped, because the lens has reached the tele extremity. Thus, processing jumps to step 238, so as to apply the zoom motor brake and return to the MAIN program.

However, if the position code is less than "$C_H$", meaning that the tele switch is OFF, processing loops back to step 232. The subroutine stays in the loop comprising steps 232–237 while the tele switch SWT is ON, until the lens reaches the tele extremity. When the tele switch SWT is set to OFF (step 237), as shown in FIG. 26, the zoom motor brake is applied (step 238) and control returns to the MAIN program.

BACKUP Operation

Figure 18:
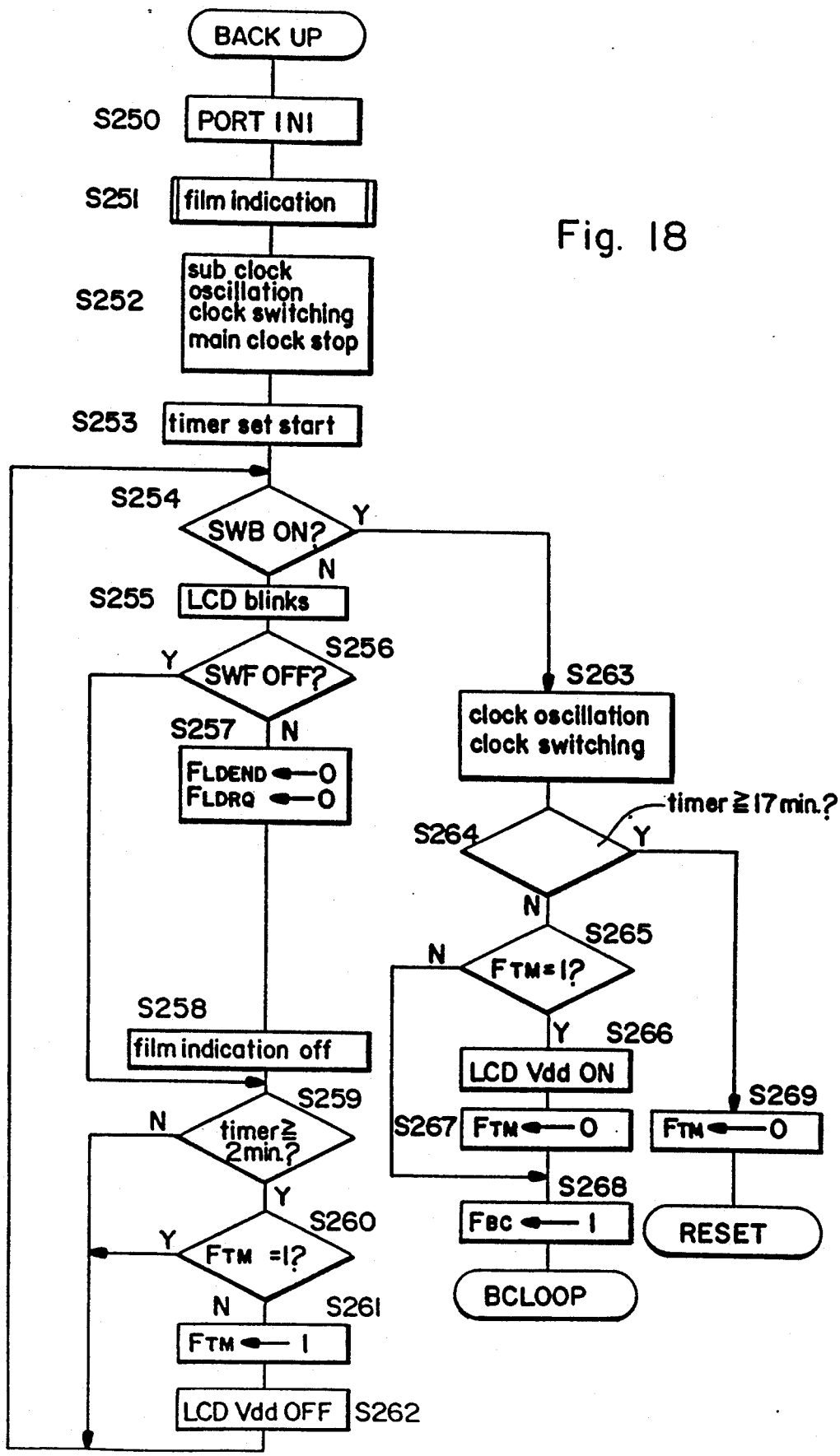
FIG. 18 illustrates a software flowchart diagram for a BACKUP routine that diverges from the MAIN program shown in FIGS. 9 and 10.

FIG. 18 illustrates the series of instructions that are executed to perform a BACKUP operation. This operation is performed by diverging from steps 6 and 57 of the MAIN program, as well as from an BAD CODE LOOP (BC LOOP) operation and the RESET operation. These instructions are performed to maintain data in the memory for a fixed period of time by powering the main CPU with electrical current supplied from the backup capacitor 320 when the battery 300 is removed or is depleted. When the camera goes into the BACKUP operation, all functions that require a large amount of electrical power are suspended so that the data in the memory can be retained for as long as possible.

When the BACKUP operation begins, all inputs with the exception of the lock switch SWL, macro switch SWM, battery switch SWB and film switch SWF are ignored in order to minimize electric power consumption. This is accomplished by switching the ports on the CPU 100 from an input mode to an output mode by a PORT INITIALIZATION subroutine in step 250. Thus, only information for the above-noted four switches will be detected.

In step 251, an indication of the frame to which the film is advanced is displayed on the LCD display panel. Then, the clock rate of the microprocessor is switched to a lower frequency. The operating speed of the camera is reduced so as to lower the power requirements of the camera circuitry. As is generally known, the faster an electrical component is operated, the more current that component usually requires. For instance, when a microprocessor is operated at a 6 MHz clock rate, the microprocessor may draw 200 uA of current. If that same microprocessor is operated with a 8 MHz clock rate, the microprocessor will operate approximately 33 percent quicker than at the 6 MHz speed, but it may require 300 uA of current. Thus, one technique for reducing power consumption of an electrical circuit is to reduce its clock rate and this is accomplished by running the PORT INITIALIZATION subroutine.

Next, a timer is started (step 253). This timer is used to erase the film frame indication on the display panel and also to determine the memory setting of several switches. In step 254, the battery switch SWB is tested to determine whether it is set to ON. If the switch is set to OFF, the film indication on the LCD display panel starts to blink when the battery is removed (step 255). The film switch SWF is then checked in step 256 to determine if it is set to OFF. If this switch is ON, loading request flag $F_{FDRQ}$ and loading end flag $F_{LDEND}$ are cleared and set to 0 (step 257), the film frame indication on the display panel is erased (step 258) and processing proceeds to step 259.

If the film switch SWF is OFF, steps 257 and 258 are skipped, meaning that the processing goes from step 256 to step 259. At step 259, the timer is checked to determine whether a period of at least two minutes has passed since the timer was started. If less than two minutes has passed, processing jumps back to step 254. When the time period is greater than or equal to two minutes, processing goes to step 260, wherein it is determined if the timer flag $F_{TM}$ is set to 1.

The timer flag $F_{TM}$ is initially set to 0. When step 259 indicates that at least two minutes has passed since the timer was started, processing goes from step 259 to step 260. However, at this time, the timer flag will be equal to 0. Thus, step 261 is executed, which forces the timer flag $F_{TM}$ to be set to 1. In step 262, the LCD display panel is deactivated to conserve additional electrical power. Then, processing jumps back to step 254. The BACKUP operation stays in the loop of steps 254–260 until the battery switch SWB is set to ON.

If the timer test in step 259 indicates that less than two minutes has passed since the timer was started, steps 261 and 262 are skipped. Thus, when electrical power to the camera is removed, the LCD display panel will continue to indicate a display for a period of two minutes. After the two minute period, the display panel will be shut off.

When a battery is installed in the camera, as indicated by the battery switch being ON instep 254, processing comes out of the above-mentioned loop, the clock rate is switched back to its normal rate (step 263) and it is determined whether a time period of seventeen or more minutes have passed since the timer was set in step 264.

If less than seventeen minutes have passed, the timer flag $F_{TM}$ is examined to determine whether it is set to 1 (step 265). If the flag is set to 1, power for the LCD display panel (which was turned OFF in step 262) is reapplied (step 266) and the timer flag $F_{TM}$ is cleared and set to 0 in step 267. Thereafter, backup flag $F_{BC}$ is set to 1 in step 268 and processing diverges to the BAD CODE LOOP (BC LOOP) operation to perform error processing.

When the timer flag $F_{TM}$ is set to 0, steps 266 and 267 are skipped. Consequently, the LCD display panel is not reactivated. Instead, processing goes from step 265 to step 268.

When it is determined that more than seventeen minutes have passed since the timer was started, the timer flag $F_{TM}$ is cleared and set to 0 in step 269 and processing diverges to the series of instructions that perform the RESET operation.

BAD CODE LOOP (BC LOOP) Operation

Figure 19:
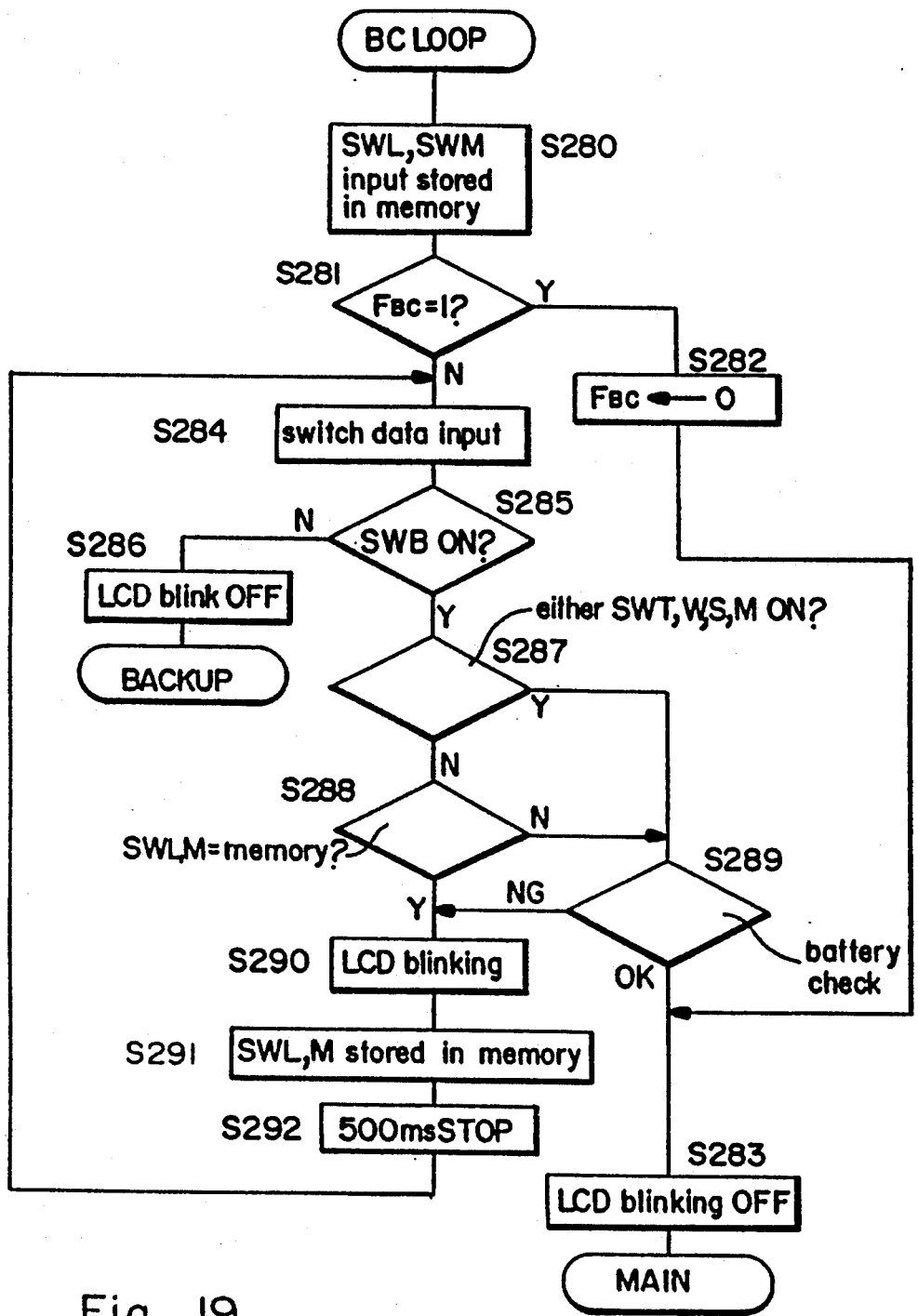
FIG. 19 illustrates a software flowchart diagram for a BAD CHECK CODE LOOP routine that diverges from the CODE CHECK subroutine of FIG. 13 and the BACKUP routine of FIG. 18.

FIG. 19 shows the flow of the series of instructions that perform error processing. These instructions are executed by diverging from the CODE CHECK subroutine or the BACKUP operation.

When the BC LOOP starts, data for the lock switch SWL and macro switch SWM are inputted and stored in memory (step 280). Then, the back up flag $F_{BC}$ is tested to determine whether it is set to 1. That is, a determination is made as to whether the error operation is diverging from the BACKUP operation (step 281). When the backup flag is set to 1, it is reset to 0 in step 282. Afterward, the LCD display panel is switched to OFF (step 283) and processing diverges back to the MAIN program.

When the BC LOOP is executed after the CODE CHECK subroutine, the test performed in step 281 will be negative. Thus step 284 is processed, in which switch data is inputted. Based upon this input, the battery switch SWB is tested to determine if it is ON. When the battery is removed, processing goes to step 286, wherein the LCD display panel is shut down and processing advances to the BACKUP operation.

When the battery switch is determined to be ON, the tele switch SWT, wide switch SWW and photometry switch SWS are examined (step 287). If at least one of these switches is set to ON, processing advances to step 289.

Alternatively, if all three switches are OFF, step 288 is checked to determine whether the setting of lock and macro switches (SWL and SWM) are different from their values stored in the memory. If these switch settings differs from what was stored in the memory, processing advances to step 289.

In step 289, the voltage of the battery is checked. If the battery voltage is more than a predetermined value, the battery is considered as being good. Thus, the blinking of the LCD display panel becomes OFF step 283) prior to diverging to the MAIN program. The MAIN program will then determine what information should be displayed on the LCD display panel.

When (1) the tele switch SWT, wide switch SWW and photometry switch SWS are all OFF and the setting of the lock switch SWL and macro switch SWM are the same as the values stored in the memory for the respective switches (steps 287 and 288), or (2) the battery is judged as being no good (step 289), the LCD display panel blinks ON in step 290. The setting of the lock switch SWL and macro switch SWM are stored in memory (step 291) and a 500 ms pause is introduced (step 292) prior to the BC LOOP jumping back to step 284, so as to loop through steps 284–292 until a good battery is placed in the camera.

RESET Operation

Figure 20:
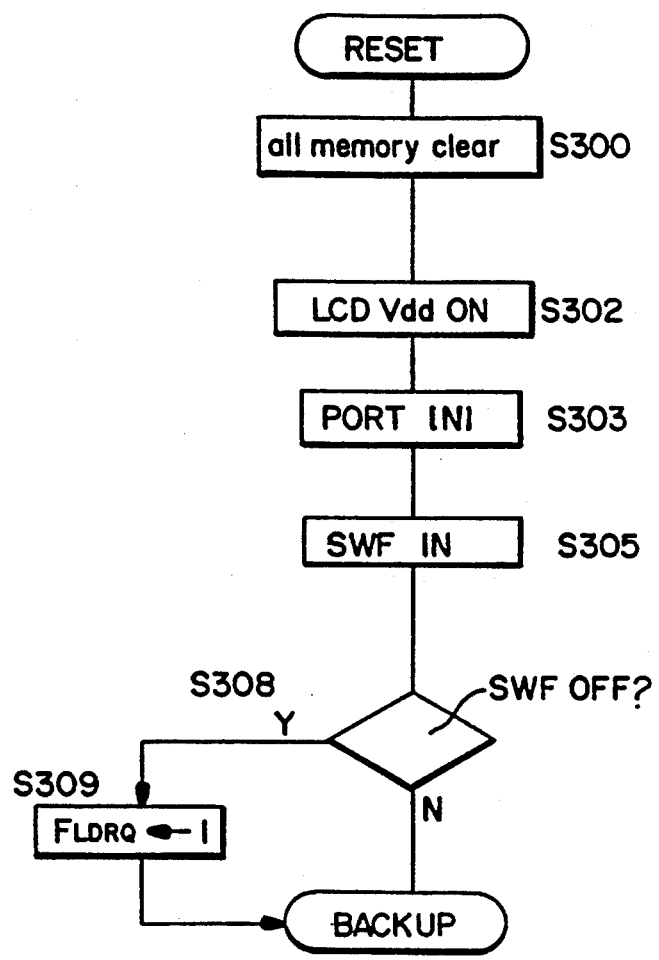
FIG. 20 illustrates a software flowchart diagram for a RESET routine that is initiated upon initial power-up and also diverges from the BACKUP routine shown in FIG. 18.

FIG. 20 illustrates the series of instructions that are executed when the RESET operation is performed. This operation is executed at the time of a reset-start or when processing diverges from the BACKUP operation. The RESET operation diverges from the BACKUP operation when more than seventeen minutes have passed since a battery was removed from the camera or a battery in the camera fails. The RESET operation is performed because the capacitor 330 is only intended to retain the contents of the memory for approximately seventeen minutes. After seventeen minutes, the data stored in the memory may be inaccurate or may not be reliably read back.

First, all memory locations and flags are cleared in step 300. Thus, the position code flag $F_{POS}$ is also cleared so that the POSITION CODE INITIALIZATION subroutine is called when the MAIN program starts. Thereafter, power is applied to the LCD display panel and the PORT INITIALIZATION subroutine (discussed above) is called (steps 302 and 303). This subroutine sets all ports on the CPU 100 (except for the lock switch SWL, macro switch SWM, battery switch SWB and film switch SWF) to the output mode.

The status of the film switch SWF is inputted in step 305, after checked in step 308 to determine whether it is OFF. If the film switch is OFF, film loading becomes possible. Therefore, the film load request flag $F_{LDRQ}$ is set to 1 in step 309 and the RESET operation diverges to the BACKUP operation.

However, if the film switch is set to ON, the film load flag $F_{LDRQ}$ is not set. That is, step 309 is skipped when the film switch SWF is OFF. Thereafter, processing diverges to the BACKUP operation.

FILM INDICATION Operation

Figure 21:
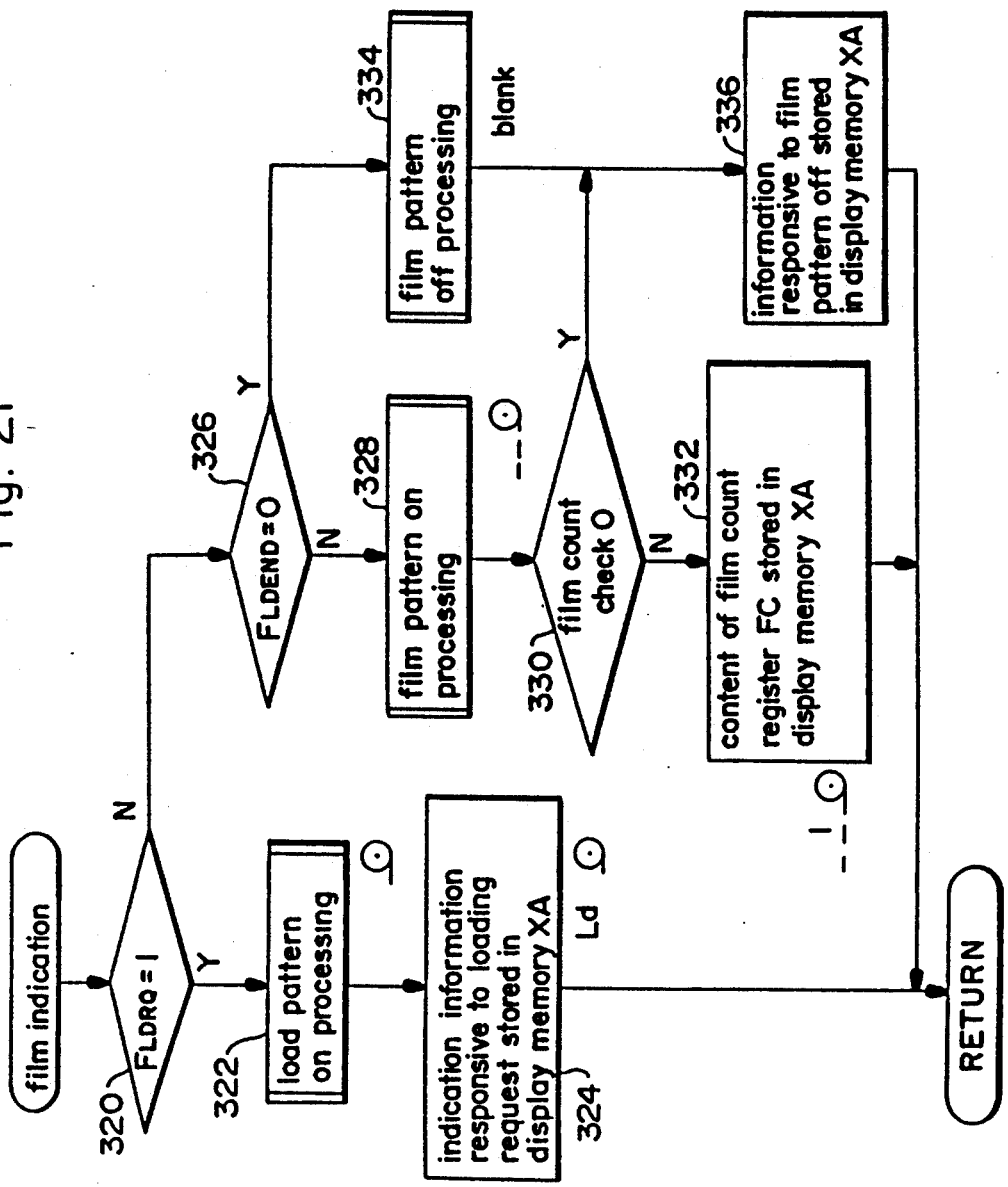
FIG. 21 illustrates a software flowchart diagram for a FILM INDICATION subroutine that is called by the MAIN program of FIGS. 9 and 10.

The series of instructions to perform the FILM INDICATION operation are shown in FIG. 21. These instructions are executed by diverging from the MAIN program, the BACKUP operation, the LOAD operation and the LOCK operation.

At step 320, flag $F_{LDRQ}$ is examined to determine whether the register has been set to 1. Flag $F_{LDRQ}$ is set to 1 when the back cover of the camera is brought from an open position to a closed position, the film is not completely loaded and the film loading indicator has not been requested. When it has been set to 1, a film load request pattern $L_d$ is created, in response to the loading request in display memory XA, and displayed on the liquid crystal display panel of the camera (steps 322 and 324), the flow operation is completed and control returns to the point just after where the FILM INDICATION operation diverged from.

However, if the film load indication flag $F_{LDRQ}$ is set to 0, processing advances to step 326, where the film load end flag $F_{LDEND}$ is checked. If the flag is set to 1, a FILM PATTERN ON subroutine (step 328) is called. This subroutine performs a film count $F_c$ check. When $F_c$ is not equal to "0", step 332 is executed to display on the LCD display panel the number of pictures that have been taken and store the content of the film counter $F_c$ in display memory XA, before returning to the point from which this operation diverged.

If $F_{LDRQ}$ equals 0 (in step 320) and $F_{LDEND}$ equals 0 (in step 326), processing goes to step 334 to call a FILM PATTERN OFF subroutine. Information corresponding to the FILM PATTERN OFF is stored in the display memory XA (step 336) and the LCD display panel is turned off. The FILM INDICATION operation then returns to where it diverged from.

If the film count $F_c$ check in step 330 is equal to "0", processing proceeds to step 336, which was described above, and then returns to the point from which the operation diverged.

LOAD Operation and WIND PULSE CHANGE Subroutine

Figure 22:
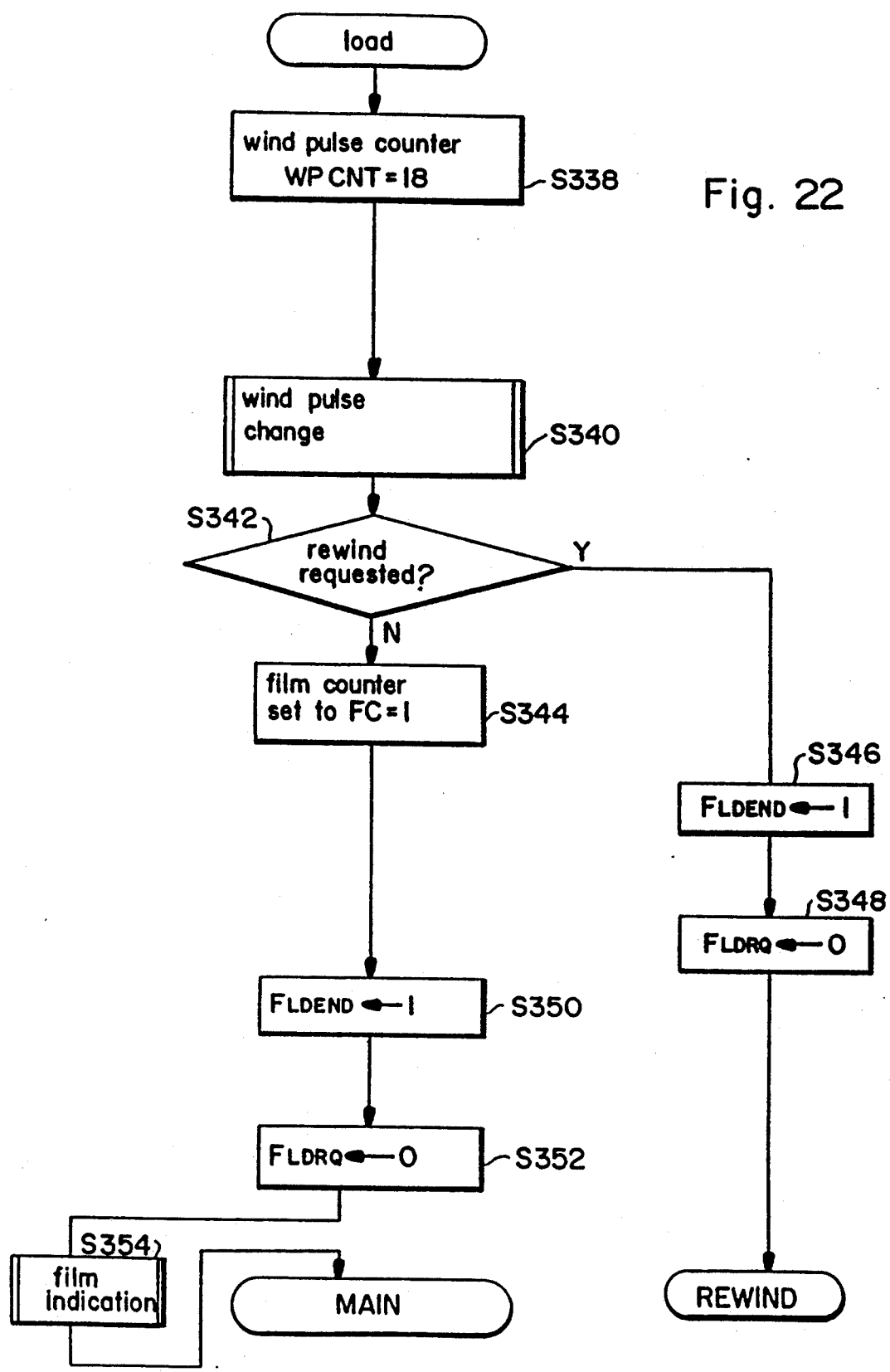
FIG. 22 illustrates a flowchart for a series of instructions to perform a LOAD operation, this operation diverging from the MAIN program.
Figure 23:
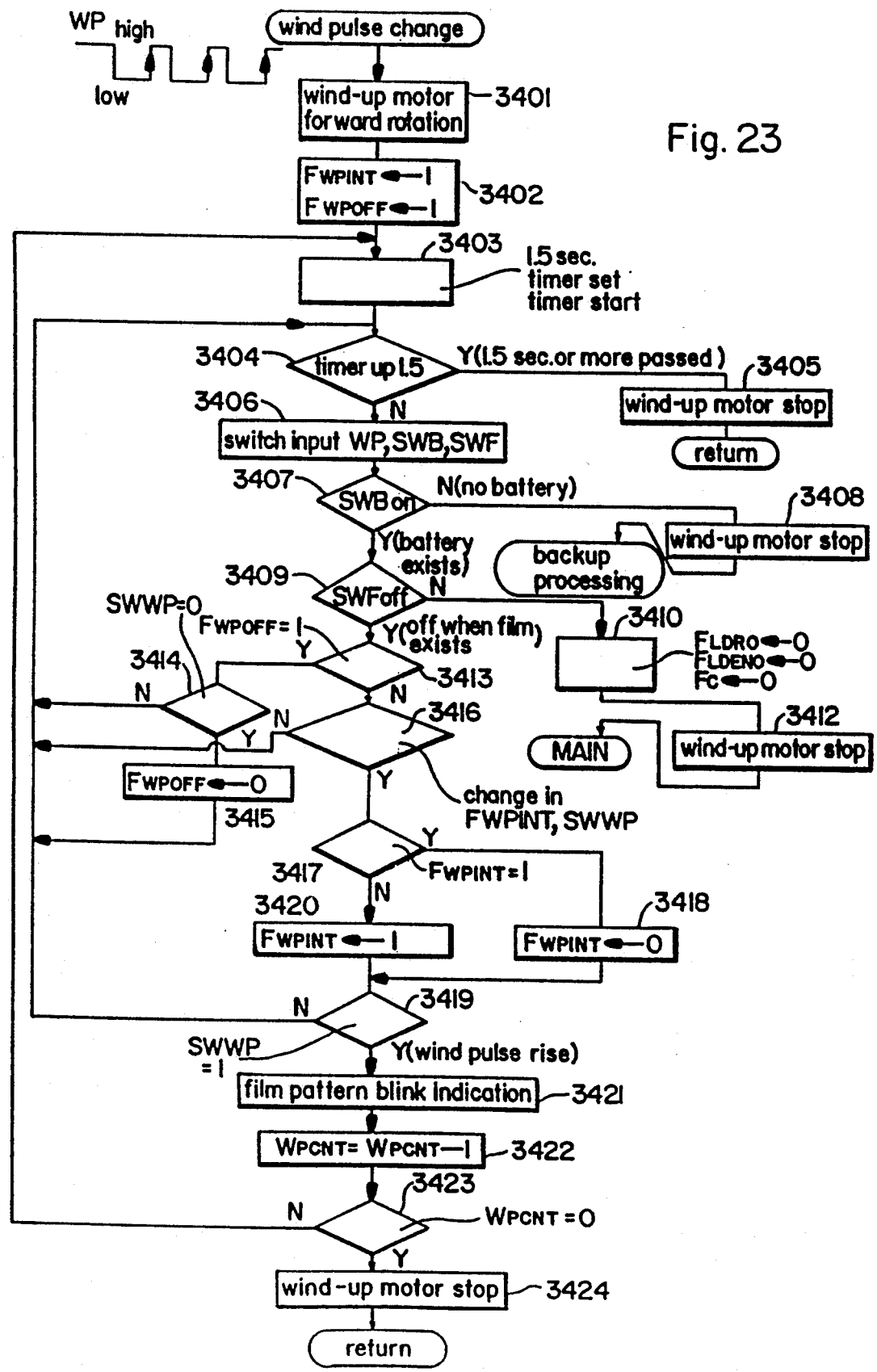
FIG. 23 illustrates the instructions for a WIND PULSE CHANGE subroutine which is called by the LOAD operation.

The following discussion is directed to the LOAD operation and WIND PULSE CHANGE subroutine, which are interrelated. The flowchart diagram for the series of instructions that comprise the LOAD operation is illustrated in FIG. 22. This operation automatically winds the film that a user inserts into the camera to the correct location so as to permit the taking of a photograph. The operation is performed when there is a change in the setting of the lock switch SWL, the macro switch SWM and when the release switch is set from OFF to ON, assuming that the loading request flag $F_{LDRQ}$ has been set to 1 in the MAIN program.

First, a wind pulse counter WPCNT is set to "18" in step 338. This count corresponds to the winding of four and one-half frames of the film. A WIND PULSE CHANGE subroutine (step 340) then takes place in accordance with the WIND PULSE CHANGE subroutine, a film advance (wind-up) motor starts a forward rotation in step 3401. Initialization flag $F_{WPINT}$ and wind pulse off flag $F_{WPOFF}$ are then set to 1 in step 3402.

In step 3403, a 1.5-second timer is set and started. The 1.5 second-timer is used to examine whether or not the film should be rewound. If it is determined that the wind pulse counter WPCNT is not equal to "0" in the WIND PULSE CHANGE subroutine (FIG. 23), to be described below, a return flag is set in step 3404, so that the forward rotation of the wind-up motor is brought to a stop in step 3405, even if 1.5 seconds or more have elapsed after the forward rotation of the wind-up motor or the increase in the wind pulse. Processing then returns to the LOAD operation. This example is for the initial film loading stage, in which the film normally advances within 1.5 seconds before the processing goes to step 3406. After switch data is inputted at step 3406, step 3407 examines whether a battery is in the camera. This test is made to determine whether the battery was removed during the advancing of the film. In such a case, processing diverges to the BACKUP operation after the forward rotation of the wind-up motor is brought to a stop in step 3408.

With a battery loaded in the camera, step 3409 is executed. This step checks to determine if the film switch SWF is OFF or ON. If the film switch SWF is ON, step 3410 is processed. This step sets flags $F_{LDRQ}$, $F_{LDEND}$ and film counter $F_c$ to "0", stops the forward rotation of the wind-up motor (step 3412) and then returns to the MAIN program. This operation is performed in case the back cover of the camera is opened during the film loading process (this process is known as a blank-shot film advancing operation).

If the back cover of the camera is kept closed, the film switch SWF remains OFF. Therefore, processing goes to step 3413, which determines if the wind pulse off flag $F_{WPOFF}$ equals 1. Since flag $F_{WPOFF}$ is initially 1, an affirmative answer is given to go to step 3414 to determine whether SWWP equals 0. SWWP equalling 0 corresponds to a low wind pulse $W_P$ level. If the wind pulse $W_P$ is not at a low level, processing returns to step 3404 to repeat the loop (comprising steps 3404, 3406, 3407, 3409, 3413 and 3414) until the wind pulse $W_P$ becomes low. Thereafter, the wind pulse $W_P$ is switched from a high level to a low level and step 3415 is executed to set the flag $F_{WPOFF}$ to 0. Processing then returns to step 3404, eventually returning to step 3413. Since flag $F_{WPOFF}$ will now be equal to 0, step 3416 will be executed to determine whether the flag $F_{WPINT}$ and SWWP have changed. Because flag $F_{WPINT}$ has been established in step 3402 to equal 1 and SWWP has been changed from 1 to 0, an affirmative answer is given to the test in step 3416. Thus, processing goes to step 3417. Since the flag $F_{WPINT}$ equals 1 in step 3417, processing goes to step 3418, where the flag $F_{WPINT}$ is set to 0. After the flag $F_{WPINT}$ has been set, the subroutine executes step 3419 to examine whether SWWP equals 1. If the wind pulse remains low, a negative result is obtained. Therefore, step 3404 is executed. Thus, processing loops through steps 3404, 3406, 3407, 3413 and 3416. When the flag $F_{WPINT}$ has been changed from 1 to 0 (in step 3416), SWWP remains equal to 0 so that processing goes back to 3404. In the meantime, the wind $W_P$ is switched from a low level to a high level. This means that a change has taken place both in the flag $F_{WPINT}$ and SWWP in step 3416. Therefore, step 3417 is processed. Since flag $F_{WPINT}$ equals 0 in step 3417, processing goes to step 3420, wherein flag $F_{WPINT}$ is set to 1. Then, step 3419 is executed, wherein the wind pulse is switched from a low level to a high level and SWWP is set to 1 so that a FILM PATTERN BLINK INDICATION subroutine is performed in step 3421. The FILM PATTERN BLINK INDICATION subroutine illuminates the film pattern in the LCD display panel when the wind pulse is switched from a low level to a high level. This causes the liquid crystal display panel to show a display that corresponds to the actual advancing of the blank-shot film. After executing the subroutine in step 3421, "1" is subtracted from the wind pulse counter WPCNT (step 3422), so that the content of Wind pulse counter WPCNT becomes equal to "17". Step 3423 then examines whether the wind pulse counter WPCNT equals "0". If the wind pulse counter WPCNT is not equal to "0", the WIND PULSE CHANGE subroutine returns to step 3403, where the processing mentioned earlier is repeated. That is, in the WIND PULSE CHANGE subroutine, the content of the wind pulse counter WPCNT is subtracted one by one upon every rise of the wind pulse $W_P$. When the wind pulse counter WPCNT reaches "0", the forward rotation of the film advance motor is stopped (step 3424), a flag is set for the non-execution of a REWIND operation and the processing goes to step 342 of the LOADING operation.

Step 342 determines whether the REWIND subroutine should be performed. When step 3423 of the WIND PULSE CHANGE subroutine is executed, a negative answer is given regarding whether to proceed to step 344, while if processing goes through step 3404, an affirmative answer is given to go to steps 346 and 348. In steps 346 and 348, $F_{LDEND}$ is set to 1 and $F_{LDRQ}$ is set to 0 for the REWIND operation. In steps 344, 350 and 352, the film counter $F_c$ is set to "1", $F_{LDEND}$ is set to 1 and $F_{LDRQ}$ is set to 0. Then, the FILM INDICATION operation (step 354), which was previously described, is performed.

REWIND Operation

Figure 24:
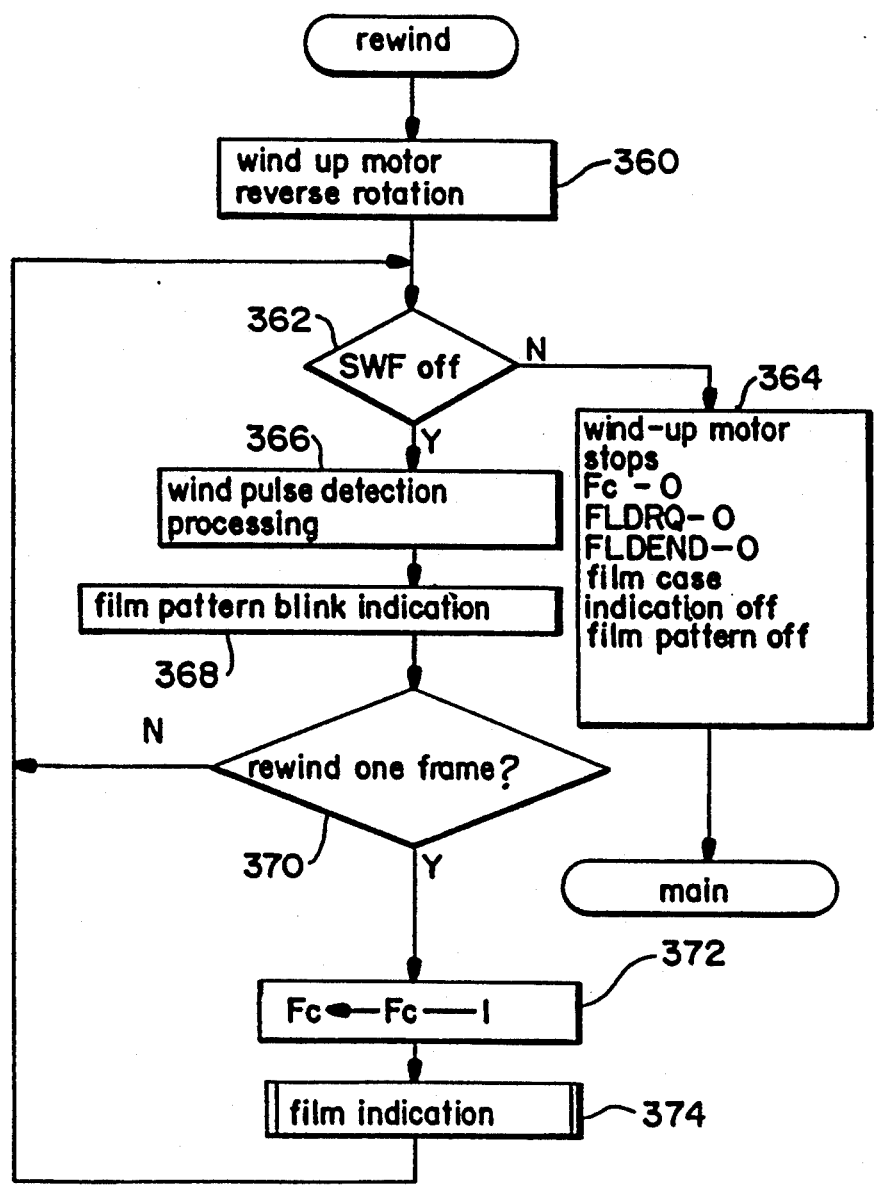
FIG. 24 illustrates a software flowchart diagram for a REWIND routine that diverges from the MAIN program shown in FIGS. 9 and 10 and the LOAD operation shown in FIG. 22.

FIG. 24 illustrates the flowchart of the REWIND operation which diverges from step 62 of the MAIN program and from the above-mentioned LOADING operation. This operation rewinds the film back into the patron when the last film frame has been exposed.

In step 360, the wind-up motor is started in a reverse rotation direction. Thereafter, step 362 is performed to determine whether the film loading detector switch SWF is off. This step functions to detect the stopping of the wind-up motor. When SWF is on, processing advances to step 364 to stop the reverse rotation of the wind-up motor, set $F_c$, $F_{LDRQ}$ and $F_{LDEND}$ to 0, and turn off the film case indication and film pattern that are shown on the LCD display panel. Then, the subroutine returns to the beginning of the MAIN program. If $F_{LDRQ}$ and $F_{LDEND}$ equal 0, processing goes to the MAIN program and runs until it reaches the FILM INDICATION subroutine. Now, since $F_{LDRQ}$ equals 0 and $F_{LDEND}$ equals 0, step 320 (of the FILM INDICATION subroutine) gives a negative answer and step 326 gives an affirmative answer. In step 334, a FILM PATTERN OFF subroutine is executed, and information corresponding to the film pattern off is stored in the display memory XA (step 336), with the film indication area on the liquid crystal panel turned blank.

When the film switch SWF (in the REWIND operation) is off, processing goes to step 366, where a wind pulse detection operation is performed. This step detects the change of the wind pulse from a low level to a high level. Then, in step 368, a film pattern blink indication operation is executed. In the film pattern indication operation, the film pattern shown on the LCD display panel is turned-off at the time the wind pulse changes from a low level to a high level. Then, in step 370, a determination is made as to whether four wind pulse changes from low to high have occurred, indicating that one frame of the film has been rewound.

If step 370 indicates that one film frame has not been rewound, steps 362-370 are repeated. Thus, an indication corresponding to the film being rewound appears on the LCD display panel. If one frame of the film has been rewound (as indicated by the test performed in step 370), step 372 is performed.

In step 372, the content of the film counter $F_c$ is decreased by "1". Thereafter, the FILM INDICATION subroutine is called (in step 374) to indicate the frame number of the film on the LCD display panel. When the FILM INDICATION subroutine is completed, the REWIND operation jumps to step 362, looping through its instructions until SWF is turned ON.

LOCK Operation

Figure 25:
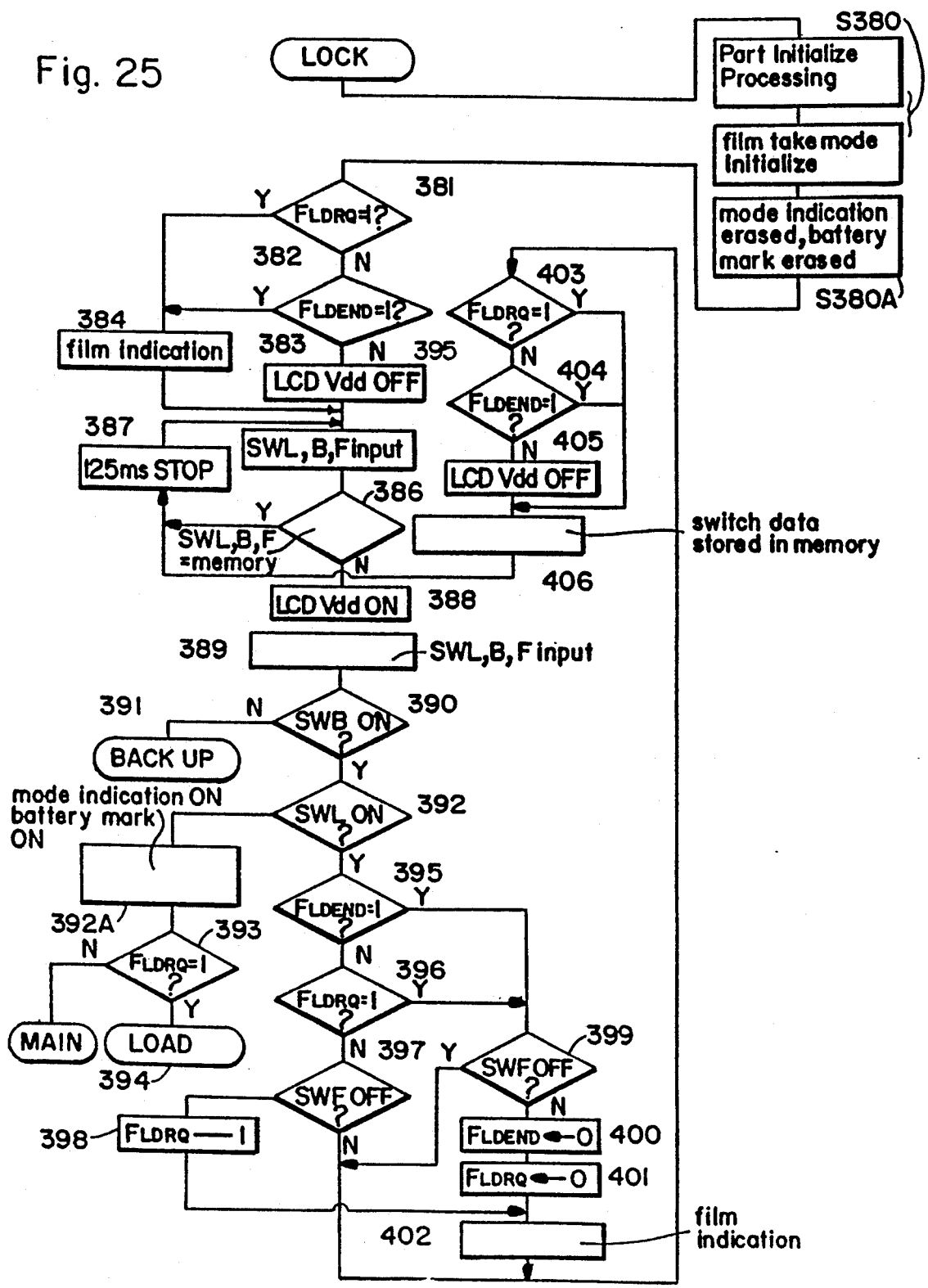
FIG. 25 illustrates a software flowchart diagram for a LOCK routine that diverges from the MAIN program shown in FIGS. 9 and 10.

FIG. 25 illustrates the flowchart of the LOCK operation which diverges from step 21 of the MAIN flow. This processing diverges when the lock switch is set to ON and the photographing lens is stored in the lock position.

In step 380, the port initializing operation is performed and the mode of the ports on the CPU 100 is switched from the input mode to the output mode, so as to conserve battery power, as was previously explained.

Then step 380A is executed to erase the mode indication and battery indication from the LCD display panel 32.

In step 381, the loading request flag $F_{LDRQ}$ checked to determine if it is set to 1. If this flag is set to 0, the loading end flag $F_{LDEND}$ is checked to determine if it is set to 1 in step 382. If both test results are negative, power to the LCD panel is removed. When either the loading end flag $F_{LDEND}$ or the loading request flag $F_{LDRQ}$ are set to 1, the FILM INDICATION subroutine of step 384 is called.

In step 385, data for the lock switch SWL, battery switch SWB and film switch SWF are inputted and examined to determine if the data that was inputted have changed from the data that is stored in memory (step 386). When there is no change, processing goes to step 387, looping through steps 385-387 (with a pause of 125 ms in step 347) until there is a change between the settings in memory and the actual switch settings. When there is a change, power is reapplied to the LCD panel in step 388.

Based upon the switch data input from step 389, step 390 determines if the battery switch SWB is ON. If this switch is OFF, processing diverges to the above-mentioned BACKUP operation (step 391), while if it is ON, the condition of the lock switch SWL is checked (step 392).

If the lock switch is OFF, processing of the LOCK operation does not have to continue. Thus, step 392A is performed. This step switches the mode indication and the battery indication on the LCD display 32 to ON. Then, step 393 is performed to determine if there is a request for loading of the film. If there is a request, processing diverges to the LOAD operation (step 394), which was previously described. If step 393 indicates that there has been no request to load film, processing diverges back to the MAIN program.

If step 392 indicates that the lock switch SWL is set to ON, processing goes to steps 395 and 396. Step 395 tests whether $F_{LDEND}$ is equal to 1, while step 396 tests whether $F_{LDRQ}$ is equal to 1. If the tests performed in either step 395 or step 396 is affirmative, a test is made (in step 399) to determine whether the film load detector switch SWF is set to OFF. However, if steps 395 and 396 are both negative, processing proceeds to step 397.

Steps 397 and 399 check whether the film loading detector switch SWF has been turned off. If the film loading detector switch SWF is determined to be OFF in step 397, processing goes to step 398, wherein $F_{LDRQ}$ is set to be equal to 1. Thereafter, the FILM INDICATION subroutine (step 402) is called. If the test performed in step 397 is negative or the test of step 399 is positive, processing goes to step 403. If step 399 results in a negative answer, $F_{LDEND}$ and $F_{LDRQ}$ are each set to 0 (steps 400 and 401) and the FILM INDICATION subroutine of step 402 is called. Thereafter, processing continues to step 403, where a check of $F_{LDRQ}$ is made.

In step 403 and step 404, if it is judged that both the loading request flag $F_{LDRQ}$ and the loading end flag $F_{LDEND}$ are set to 0, power to the LCD display panel is removed in step 405.

In step 406, the switch data that were inputted in step 389 are stored in memory and the processing advances to step 387. If one of the above-mentioned flags is set to 1, step 405 is skipped. Thus, electrical power continues to be supplied to the LCD display panel.

Thus, in the LOCK operation, when the status of the lock switch SWL, battery switch SWB and film switch SWF does not change, processing stays in the loop of steps 386-387. When there is a change in the status of the film switch SWF, only one cycle of the loop of steps 388-406 is performed. When the status of the lock switch SWL and the battery switch SWB change, processing exits these loops to advance to the next step in the routine.

DATA I/O Operation and MACRO TELE SHIFT (MT SIFT) Subroutine

Before describing the DATA I/O subroutine, illustrated in FIG. 27B, a description of the relationship of the distance measurement step, lens latch and focus position will be given. Reference for this discussion is made to FIG. 28.

Distance measurement steps are represented in increments from 1 to 36. As indicated in FIG. 28, the distances for these steps are listed on the right side of the distance measurement steps. For example, distance measurement step "1" corresponds to 5 m-∞ and distance measurement step "2" corresponds to 3.7-5 m. Also, as indicated in FIG. 28, in the zoom mode, lens latch steps are represented in steps of "1" and "3" to "19", corresponding to the distance measurement steps from "1" to "18" of the zoom lens 11. For example, for a distance measurement step of "1", the ideal focus position for a lens latch step of "1" is 9 m. The latch step of "1" allows one to take a photograph in an in-focus condition from a range of 5 m-∞. For a distance measurement step of "2", corresponding to a latch step of "3", the ideal focus position is 4 m. At latch step "3", a photograph can be taken at an in-focus condition having a range of 3.7 m-5 m.

The electronically controlled camera of the preferred embodiment is unable to take an in-focus photograph of a subject for distance measurement steps of "19" to "36" when the camera is in the zoom mode. In this situation, a release lock or short distance warning (to be mentioned below) is shown in the LCD panel 32. The user then switches from the zoom position SWZ to the macro position SWM, by manually operating the main switch 30, so that the camera is switched from the zoom mode to the macro mode.

In the macro mode, lens latch steps are set from "1" to "19", which corresponds to distance-measuring steps "16"–"36". As shown in FIG. 28, distance measurement steps "16" and "17" correspond to lens latch step "1" in the macro mode. The ideal focus position of macro lens latch step "1" is 0.96 m. Macro lens latch step "1" allows one to take an in-focus photograph in the range of 0.94 m to 1 m. Distance measurement step "18" corresponds to macro lens latch step "2". The ideal focus position for macro lens latch step "2" is the same as that for lens latch step "19" in the zoom mode. This permits one to take an in-focus photograph in the range of 0.90 m to 0.94 m.

Distance measurement steps "16" to "18" overlap, as shown in FIG. 28, so that in-focus photographing is possible in both the zoom and macro modes at those steps. That is, the long distance side of the macro mode and the short distance side of the zoom mode are overlapped in the range from the boundary on the long distance side in the focus range in the macro mode (1 m) to the boundary on the short distance side in the focus range in the zoom mode (0.9 m). This avoids a situation wherein photographing cannot be performed in the macro mode because of fluctuations in distance measurements when photographing by manually operating the main switch 30 to switch to the macro mode in response to a warning that the taking of an in-focus photograph is impossible in the zoom mode.

In the preferred embodiment of the camera of the present invention, distance measurement step "36" corresponds to lens latch step "19" of the macro mode. In this case, only the short distance warning is given and the release lock is not performed.

In the macro mode, distance measurements from "1" to "15" correspond to lens latch steps "1" and "3"–"16", performing a MACRO-TELE SHIFT subroutine (MT SIFT subroutine), to be discussed below. For example, in the macro mode, when a distance measurement of "1" is obtained, the zoom lens 11 is operated to shift the lens from the macro extremity to the tele extremity in the zoom range to correspond to lens latch step "1". The ideal focal length of lens latch step "1" is 9 m; a lens latch value of "1" permits an in-focus picture to be taken within a range of 5 m-∞.

Figure 29:
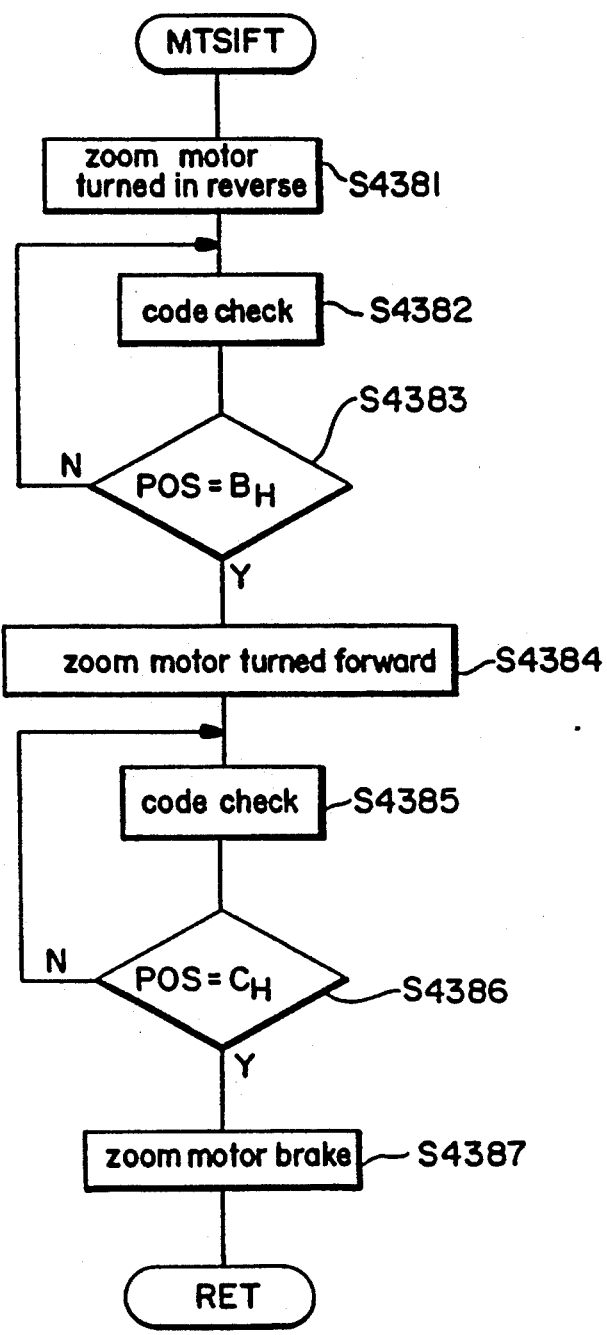
FIG. 29 illustrates a flowchart for a MACRO TELE SHIFT subroutine that is called by the DATA I/O operation of FIG. 27B.

A description of the MACRO-TELE SHIFT Subroutine (MT SIFT), will now be given, together with an explanation of the DATA I/O operation. Reference is made to FIGS. 27B and 29 for this discussion.

The first step performed in the DATA I/O subroutine (step 420), is the conversion of the DX code of the film loaded in the camera to an ISO SV sensitivity value. At step 422, the zoom code POS information of the zoom lens 11 is alpha-converted to yield an exposure operation for use in step 424. The resultant alpha value comprises an amount of variation in $F_{min}$ (full-open aperture F-number) of the zoom lens positioned at the specified focal length position, with respect to the $F_{min}$ of the zoom lens positioned at the wide extremity. At step 424, an exposure operation flag is set. In response to the completion of step 424, step 426 is executed to input distance measurement data from the CPU. Then, at step 428, a LENS LATCH (LL) subroutine is called.

Figure 27B:
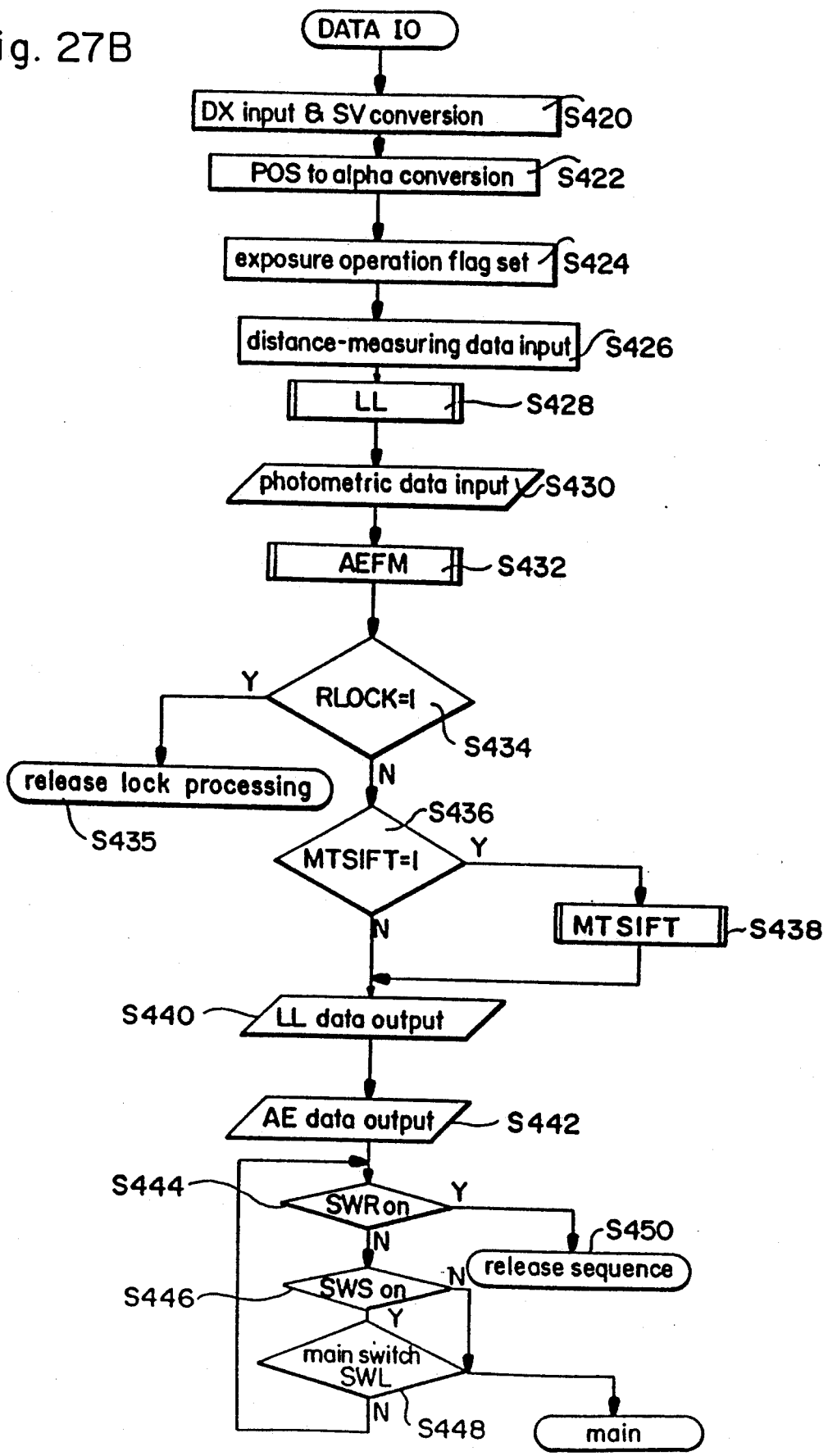
FIG. 27B illustrates a software flowchart for a series of instructions for a DATA I/O operation that diverges from the MAIN program shown in FIG. 27A.

After the LENS LATCH (LL) subroutine (see FIG. 30) is completed, step 430 of the DATA I/O subroutine of FIG. 27B is performed. In this step, photometry data information is input. Then, in step 432, an AUTO EXPOSURE CALCULATION AND FLASHMATIC CALCULATION (AEFM) subroutine is called. When the AEFM subroutine is completed, a test is performed to determine if the release lock flag $R_{LOCK}$ is set to 1 (step 434). If the result of the test is YES, processing diverges to a RELEASE LOCK PROCESSING operation, at step 435, to be described below.

If the result of the release lock flag test of step 434 is negative, step 436 is performed to determine whether the macro tele shift flag MT SIFT is equal to a value of 1. If MT SIFT equals 1, a macro tele shift processing MT SIFT subroutine is performed (step 438). This subroutine, illustrated in FIG. 29, starts a reverse rotation of the zoom motor 10 at step 4381. This permits the zoom lens to move towards the tele extremity. After this step has been completed, the position code POS is checked at step 4382 and, based upon the obtained code, a test is made at step 4383, as to whether the zoom lens is in the position where the position code POS equals "$B_H$". A loop between steps 4382 and 4383 occurs until the zoom lens is positioned such that the position code POS equals "$B_H$". When the zoom lens reaches the position where POS equals "$B_H$", the reverse rotation of the zoom motor 10 is stopped and a normal forward rotation of the zoom motor begins (step 4384). After step 4384 has executed, the position code POS is checked (step 4386) to determine if the zoom lens is at the point where the code is equal to "$C_H$". A loop between steps 4385 and 4386 occurs until the position code POS equals $C_H$. When the zoom lens is set to the specified position of the tele extremity, a zoom motor brake (step 4387) is applied to stop the rotation of the zoom motor. This completes the MACRO TELE SHIFT (MT SIFT) subroutine. Processing control then returns to step 440 of the DATA I/O operation.

To summarize, the MACRO TELE SHIFT (MT SIFT) subroutine of FIG. 29 functions as a switching method for changing the zoom lens 11 from the macro extremity to the tele extremity when the distance measurement information indicates an unusable range in the macro mode.

After the main CPU executes the MACRO TELE SHIFT (MT SIFT) subroutine, it performs steps 440 and 442, so as to produce lens latch data (LL data) and exposure data (AE data). These two steps are also performed if the result from the test in step 436 is negative (i.e., MT SIFT flag does not equal 1).

At step 444, a test is performed to determine whether the release switch SWR is set to on. If the release switch SWR is OFF, a test (in step 446) is made as to whether the photometry switch SWS is set to on. If the photometry switch SWS is ON, step 448 is executed to decide if the lock switch SWL is ON. If the lock switch SWL is OFF, the DATA I/O operation loops back to step 444, creating a release standby mode. That is, if the release switch SWR is OFF, the photometry switch SWS is off and the zoom switch SWZ or the macro switch SWM is ON, a release standby mode exits wherein steps 444 to 448 are constantly performed.

If the result of the test in step 446 indicates that the photometry switch SWS is set to OFF, or the result of the test in step 448 indicates that the lock switch SWL is ON, the DATA I/O operation diverges back to the start of the MAIN program.

If the test made in step 444 indicates that the release switch SWR is set to ON, step 450, wherein the computer program diverges to a RELEASE SEQUENCE operation, illustrated in FIG. 32 and discussed below.

LENS LATCH (LL) Subroutine

Figure 30:
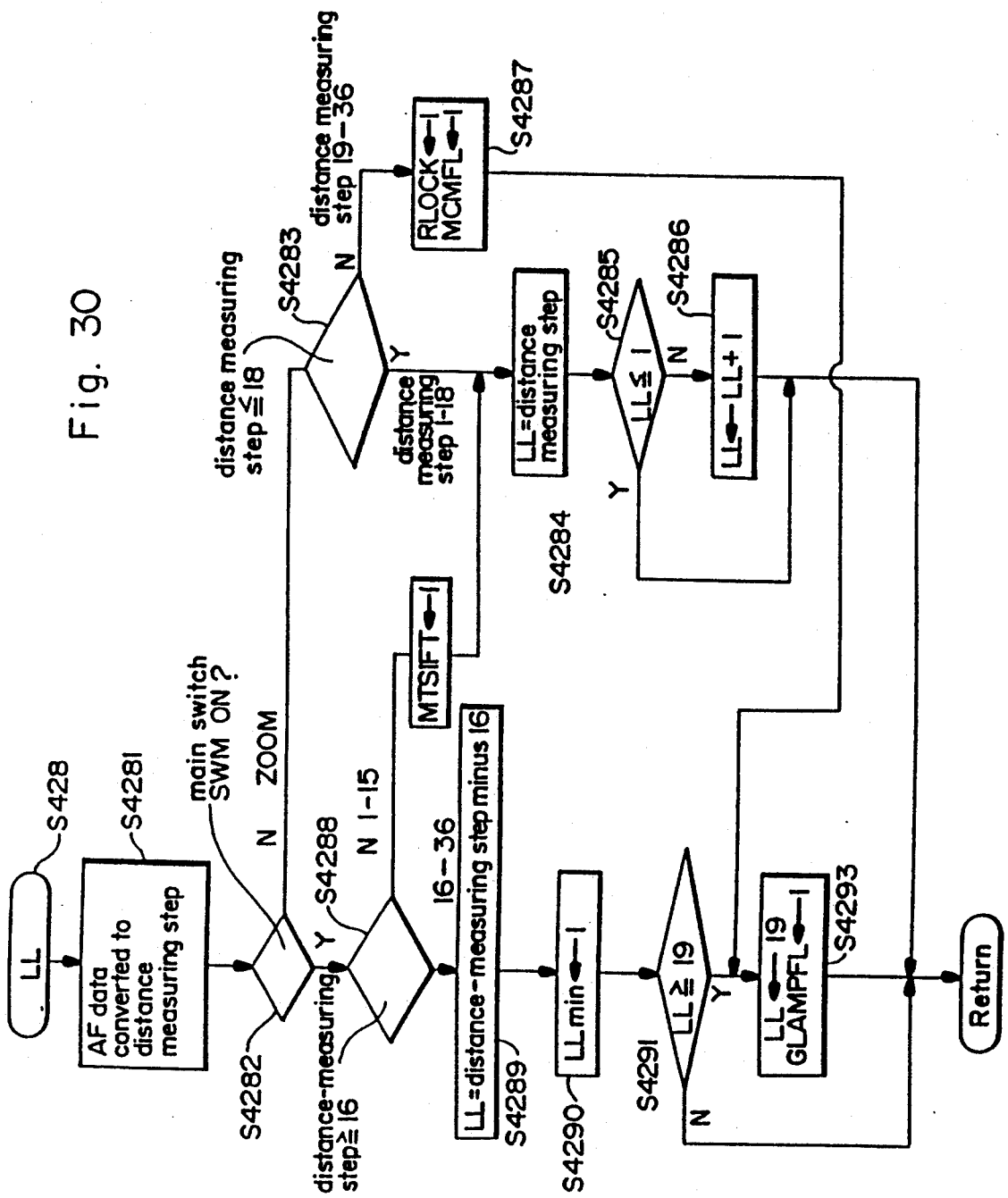
FIG. 30 illustrates a flowchart for a LENS LATCH subroutine that is called by the DATA I/O operation of FIG. 27B.

In the LL subroutine, shown in FIG. 30, distance measurement information (AF data) is converted to a distance measurement step (AF step) in step 4281. The distance measurement step is restricted to a minimum value $AF_{min}$ of 1 and a maximum value $AF_{max}$ of 36. Thereafter, step 4282 is performed, wherein a determination is made as to whether the macro switch SWM is turned ON. When the macro switch SWM is not ON, the LL subroutine concludes that zoom switch SWM is ON and performs step 4283. In step 4283, the subroutine decides if the distance measurement step is less than or equal to "18". If an affirmative answer is obtained, an in-focus photograph can be taken in the zoom mode. Accordingly, step 4284 is executed to perform the necessary processing to provisionally set the distance measurement step value as the lens latch step LL. The software routine then continues to step 4285, where a determination is made as to whether the lens latch step LL is less than or equal to "1". When LL is less than or equal to "1", the LL subroutine is terminated and processing returns to the DATA I/O flow operation. When LL is greater than "1", the lens latch step LL is increased by "1" (in step 4286). The processing returns to the DATA I/O operation. Therefore, for example, when the distance measurement step equals "2", a lens latch step of "3" is set. As previously discussed and shown in FIG. 28, each distance measurement step "1 to 18" corresponds to a respective lens latch step of "1, 3 to 19".

When the distance measurement step (AF step) is equal to or greater than "19" in step 4283, step 4287 is executed so as to set a macro mark blink flag 2MCMFL to 1, which causes a macro mark that is displayed on the LCD display panel to blink. In addition, a release lock flag $R_{LOCK}$ is set to 1. Step 4287 is performed because when the distance measurement step is in the range of "19 to 36" while the camera is in the zoom mode, it is impossible to take an in-focus picture. Thus, it is necessary to make the macro mark blink as a warning aid to the user of the camera to turn ON the macro switch SWM, and set the release lock, so as to prevent the taking of an out-of-focus photograph. The LL subroutine then proceeds to step 4293, which will discussed below.

When the macro switch SWM is ON in step 4282, the LL subroutine proceeds to step 4288, to determine whether the distance measurement step is greater than or equal to "16". If it is determined that it is greater than or equal to "16", step 4289 is performed, wherein "16" is subtracted from the distance measurement step. Then, step 4290 is performed, wherein the minimum value of lens latch step $LL_{min}$ is set to "1". This step prevents $LL_{min}$ from being set to "0" when a lens latch step corresponding to a distance measurement step of "16" occurs.

After executing step 4290, the software subroutine proceeds to step 4291 to decide whether LL is greater than or equal to "19". If LL is greater than or equal to "19", LL is set equal to "19" in step 4293. In addition, a green lamp flag GLAMPFL is set to 1 so as to cause the green lamp Gd, located on the back of the camera body 1, to blink. The blinking green lamp alerts the photographer that the subject is too close to the camera for a satisfactory picture. The LL subroutine is then completed and processing returns to the DATA I/O operation. In the macro mode, processing to set the flag for the release lock is not performed so that photographing is possible, even if a subject is too close.

If the distance measurement step is less than "16" in step 4288, step 4292 is performed to set macro tele shift flag MT SIFT to 1. Then, steps 4284 to 4286 are performed in the manner described above for these steps. That is, the distance measurement step is provisionally set to the lens latch step LL and a test is made at step 4285 to determine if LL is less than or equal to "1". If LL is less than or equal to "1", the LL subroutine is terminated and processing returns to the DATA I/O subroutine. When the lens latch step LL is greater than "1", LL is incremented by "1" at step 4286, the LL operation subroutine is terminated, and processing of the DATA I/O operation continues. Therefore, for example, when the distance measurement step equals "2", a lens latch step of "3" is set. Thus, lens latch steps from "1" and "3"-"16" will correspond to each value of the distance measurement step "1-15", as shown in FIG. 28.

RELEASE LOCK PROCESSING Subroutine

Figure 31:
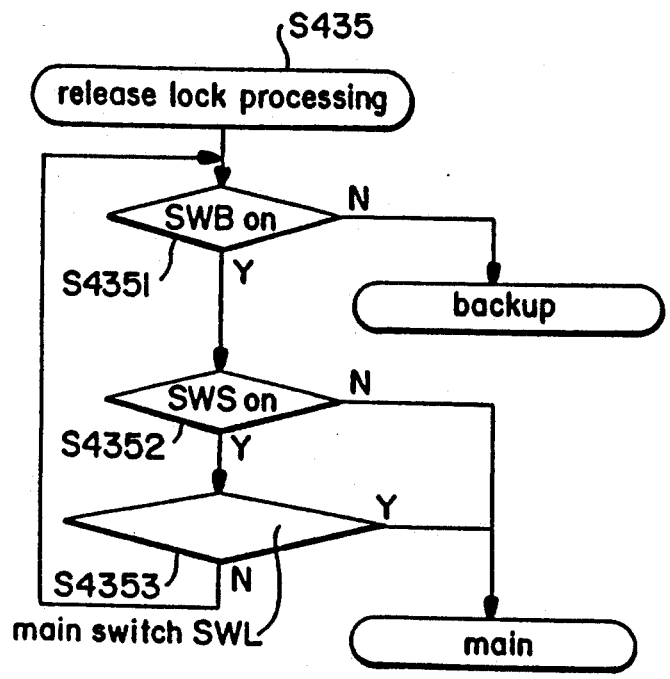
FIG. 31 illustrates a flowchart for a series of instructions for a RELEASE LOCK PROCESSING operation that diverges from the DATA I/O operation shown in FIG. 27B.

The RELEASE LOCK PROCESSING subroutine is illustrated in FIG. 31. In this subroutine, a determination is made as to whether the battery switch SWB is on (step 4351), and if it is, step 4532 is executed to determine whether the photometry switch SWS is on. An affirmative determination results in a test being made (at step 4353) as to whether the lock position SWL is ON. If the lock position SWL is OFF, the subroutine loops back to step 4531. Therefore, if the battery switch SWB is ON, the photometry switch SWS is ON and the lock switch SWL is OFF, the RELEASE LOCK PROCESSING subroutine performs a continuous loop between steps 4351 and 4353, until one of these three conditions changes. That is, the loop is terminated by either setting the battery switch SWB to OFF, setting the photometry switch to OFF, or by setting the lock switch SWL to ON.

When the battery switch SWB is turned OFF, processing diverges to the BACKUP operation, shown in FIG. 18 and discussed above. When the photometry switch SWS is set to OFF, or the lock switch is set to ON, processing returns to the MAIN program.

RELEASE SEQUENCE Operation

Figure 32:
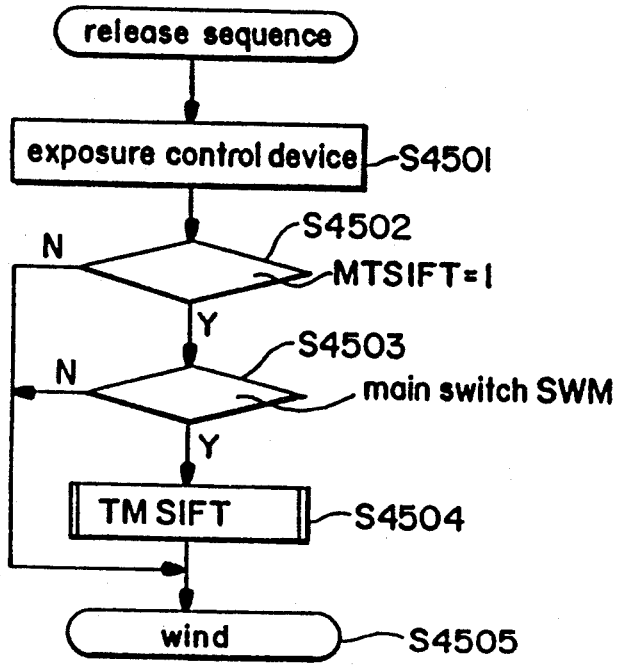
FIG. 32 illustrates a series of instructions for a RELEASE SEQUENCE operation that diverges from the DATA I/O operation of FIG. 27B.

FIG. 32 illustrates the set of instructions that comprise the RELEASE SEQUENCE OPERATION. This operation diverges from step 450 of the DATA I/O operation, discussed above.

In the RELEASE SEQUENCE Operation, an exposure control is obtained in step 4501, which includes activating the shutter of the camera. Step 4502 is then executed to determine whether the macro tele shift flag MT SIFT is set to 1. If MT SIFT equals 1, step 4503 is executed to decide if the macro switch SWM is ON.

If the macro switch SWM is ON, step 4504 is performed, which executes a TELE MACRO SHIFT (TM SIFT) subroutine. The TM SIFT subroutine is the reverse of the MT SIFT subroutine explained in connection with FIGS. 27B and 29; hence, a further explanation of the specific operation of the TM SIFT subroutine is not given. When the macro switch SWM is ON, the TM SIFT subroutine operates to return the zoom lens 11 to the macro position, after a photograph has been taken in the zoom position. When the TELE MACRO SHIFT subroutine TM SIFT is completed, processing diverges to a WIND operation (step 4505), to advance the film. The WIND operation is shown in FIG. 32 and is discussed below.

If the macro tele shift flag MT SIFT test that was performed in step 4502 is not equal to 1, the test for determining whether the macro switch SWM is ON (step 4503) and the TM SIFT subroutine (step 4504) are not performed. Rather, the RELEASE SEQUENCE operation jumps to step 4505 to diverge to the WIND operation.

WIND Operation

Figure 33:
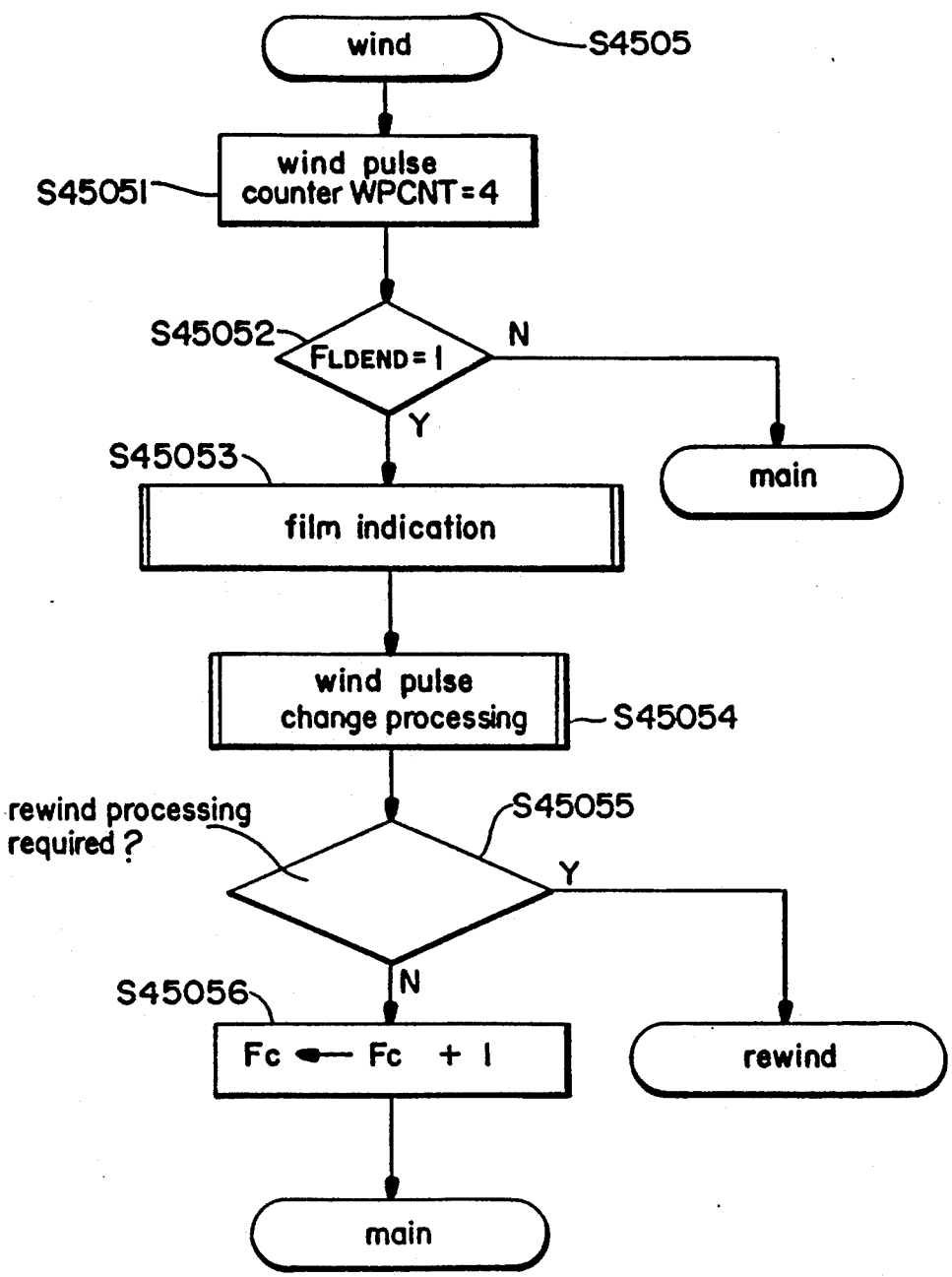
FIG. 33 illustrates a series of instructions that form a WIND operation which diverges from the RELEASE SEQUENCE operation of FIG. 32.

The WIND operation is shown in FIG. 33. In the WIND operation, the wind pulse counter WPCNT is set to be equal to "4" (step 45051). A count of "4" corresponds to one film frame in the preferred embodiment of the invention. In step 45052, a check is made to see if $F_{LDEND}$ is equal to 1. Since loading is not finished when $F_{LDEND}$ equals 0, processing exits the WIND operation and returns to the start of the MAIN program. If $F_{LDEND}$ equals 1, the FILM INDICATION subroutine, shown in FIG. 21 is called. The number of pictures taken before the winding operation is indicated (step 45053), and the WIND PULSE CHANGE subroutine (shown in FIG. is called in step 45054. After the execution of the WIND PULSE CHANGE subroutine to advance the film by one frame, a determination is made at step 45055 as to whether a REWIND operation should take place. If the determination is affirmative, processing diverges to the REWIND operation shown in FIG. 24. If no rewind operation is to be performed, processing goes to step 45056 where the film counter $F_c$ is increased by "1". Processing then returns to the start of the MAIN program. Thus, the LCD display panel increments its display by one, showing that another picture has been taken (i.e., the display changes, for instance, from showing the number "1" to showing the number "2").

Operation of the Strobe Unit

Figure 34:
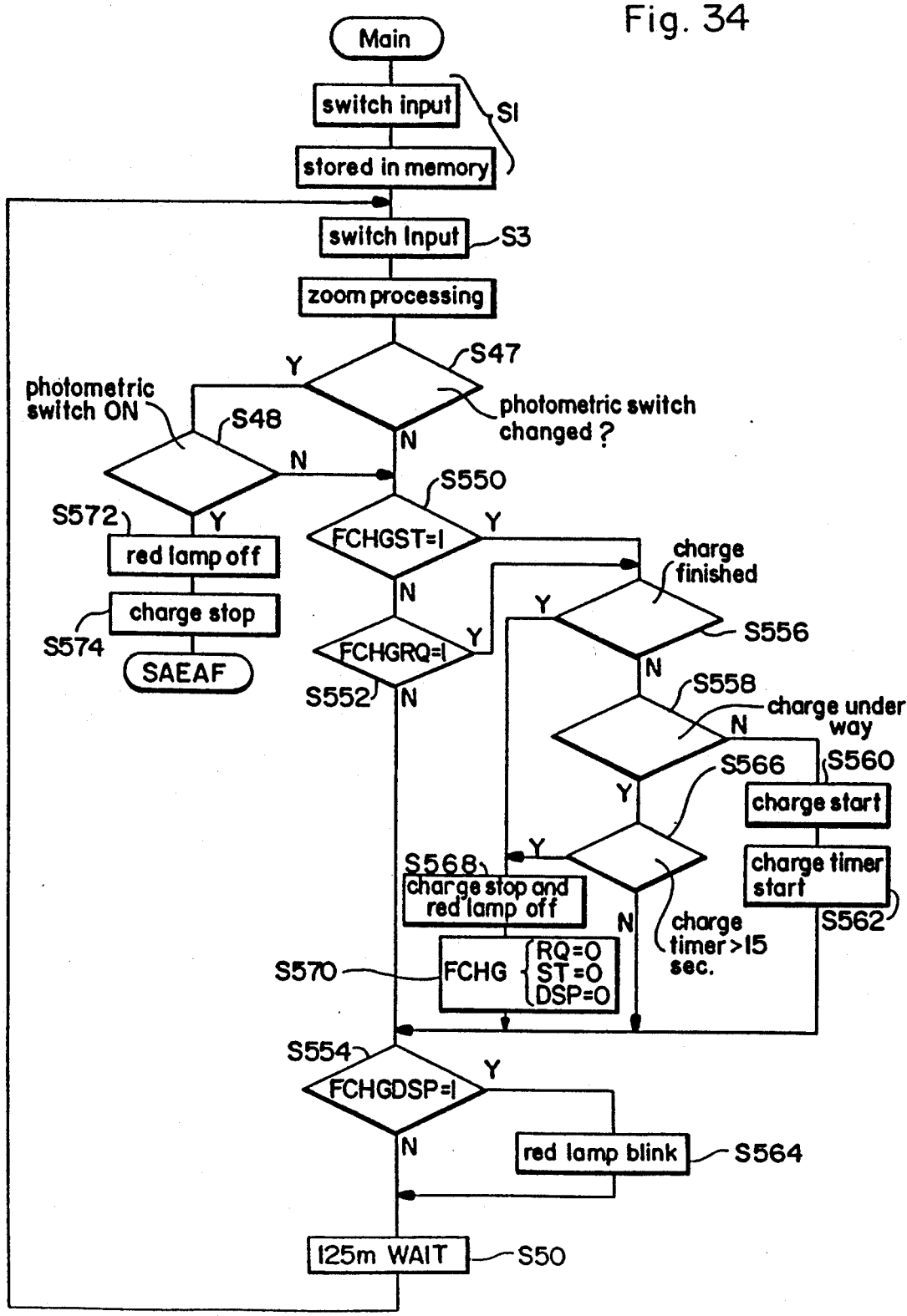
FIG. 34 illustrates a summary of the instructions shown in the MAIN program illustrated in FIGS. 9 and 10 with additional instructions added to illustrate the steps involved in a strobe charging operation for a strobe built into the camera constructed according to the present invention.

The operation of the strobe unit will be explained with reference to FIGS. 34–37. FIG. 34 represents the MAIN program of the camera constructed according to the present invention, as depicted in FIGS. 9 and 10 above. FIG. 34 has been condensed so as to emphasize the instructions that are related to the operation of the strobe 22. Instruction steps that correspond to instructions illustrated in the flowchart of FIGS. 9 and 10 have been assigned the same step number in FIG. 34 to more easily explain how the steps pertaining to the operation of the strobe are interfaced with the MAIN program shown in FIGS. 9 and 10. However, it is to be understood that the camera constructed according to the present invention has only one MAIN program which contains all the relevant instructions for the operation of the camera.

When the MAIN program (as depicted in FIGS. 9 and 10) is started, the input conditions of the tele switch SWT, wide switch SWW, release switch SWR, photometric switch SWS and lock switch SWL are read and their conditions are stored in a memory (step 1, which is also shown in FIG. 34). When the main switch 30 is moved to the ZOOM position (or MACRO position) from the LOCK position, processing is transferred from the LOCK operation (described above and shown in FIG. 25) back to the MAIN program that is shown in FIG. 34. At this time, charging flag FCHGST is set to 1, while charging flags FCHGRQ and FCHGDSP are set to 0 before pausing for a period of 125 ms (step 50) before jumping back to step 3. At step 3, the input conditions of switches are re-read. The MAIN program calls the zoom subroutines (which were discussed above) to move the zoom lens to a location that matches the switch settings and then returns to the MAIN program, wherein the zoom subroutines are carried out once more. This time, when the positions of the main switch and the zoom lens match, processing goes to step 47.

At step 47, the input condition of the photometric switch SWS stored in memory and the input condition of photometric switch SWS that was read at step 3 are compared. When there are no differences, processing goes to step 550, which checks whether flag FCHGST equals 1. As noted above, when processing is transferred to the MAIN program, the value 1 is set for flag FCHGST. Therefore, processing goes to step 556 to determine whether the strobe capacitor charging is completed. As the strobe capacitor has not yet been charged, processing is transferred to step 556 to determine whether the strobe capacitor is being charged. If the strobe capacitor is not being charged, processing goes to step 560 to start charging the strobe capacitor (steps 560 and 562).

At step 554, the charging flag FCHGDSP is checked to determine if it is set to 1. When this flag has been set to 1, the red lamp indicator Rd will blink (step 564) and processing is transferred to step 50 for the 125 ms pause before jumping to step 3. When flag FCHGDSP is set to 0 in step 554, processing proceeds to step 50 without causing the red lamp indicator Rd to blink. When there are no variations in the input conditions of the tele switch SWT, wide switch SWW, release switch SWR, photometric switch SWS and lock switch SWL, the strobe capacitor is charged in the loop 3 to 550, 556, 558, 566, 554, 50 and 3.

If the charging of the battery is not completed within 15 seconds, step 566 will direct processing to step 568. This will stop the charging of the strobe capacitor and turn off the red lamp indicator Rd. Eventually, the routine will loop back to step S3.

When the charging of the strobe capacitor is completed, processing proceeds from step 556 to step 568. The charging of the strobe capacitor is stopped and the red lamp indicator Rd is turned OFF at step 568. Processing then continues to step 570, wherein flags FCHGST, FCHGRQ and FCHGDSP are each reset to 0. After the charging of the strobe capacitor is completed, the processing of steps 3 to 50 is repeatedly carried out.

At this time, if the shutter button is depressed and the photometric switch SWS is ON, step 47 will judge that there is a change in the photometric switch SWS setting. Thus, processing goes to step 48 to determine whether the photometric switch SWS is ON. If the photometric switch SWS is OFF, processing goes back to step 550. When it is ON, the red lamp indicator Rd is turned off (step 572), the charging of the strobe capacitor is stopped (step 574), and processing diverges to a series of instructions that constitute a STROBE AUTOMATIC EXPOSURE/AUTOMATIC FOCUS (SAEAF) operation.

Figure 35:
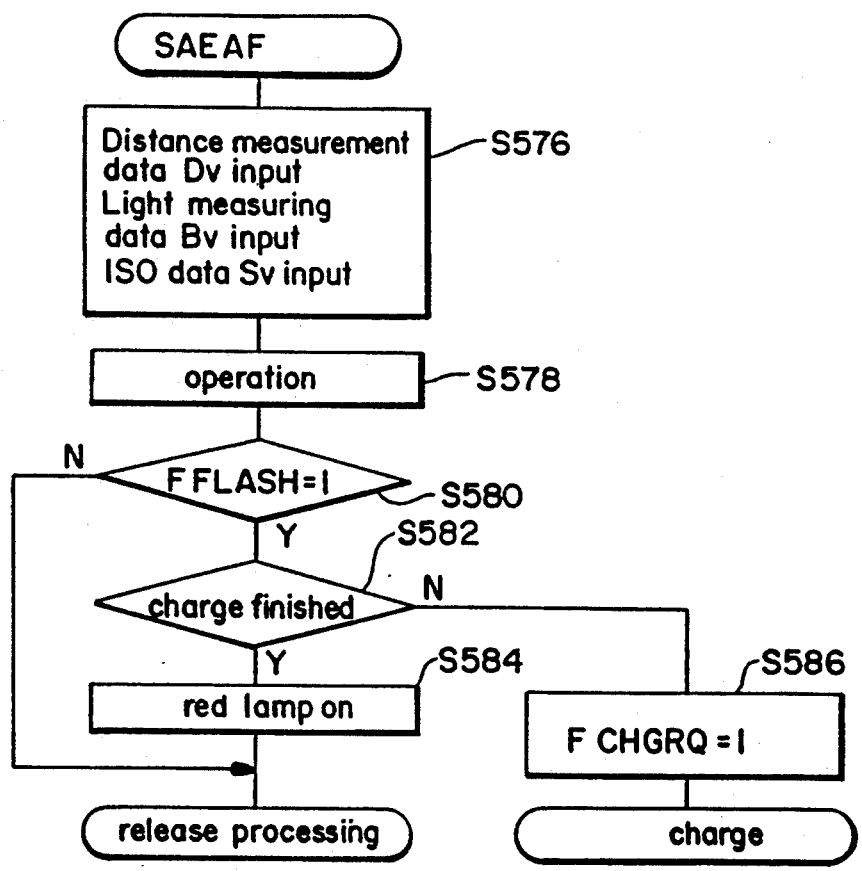
FIG. 35 illustrates the series of instructions that constitute a STROBE AUTOEXPOSURE/AUTOFOCUS operation that diverges from the MAIN program shown in FIG. 34.

In the SAEAF operation, illustrated in FIG. 35, distance finding data Dv, photometric data Bv and ISO data Sv are inputted (step 576). At step 578, an exposure value Ev is calculated by adding the photometric data Bv and the ISO data Sv. Also, a FLASHMATIC (FM) operation is executed using the exposure value Ev, distance finding data Dv and ISO data Sv. Thus, when it is necessary to use the strobe to obtain a properly illuminated photograph, flag FFLASH will be set to 1, while when the strobe is not required, flag FFLASH will be set to 0.

Figure 36:
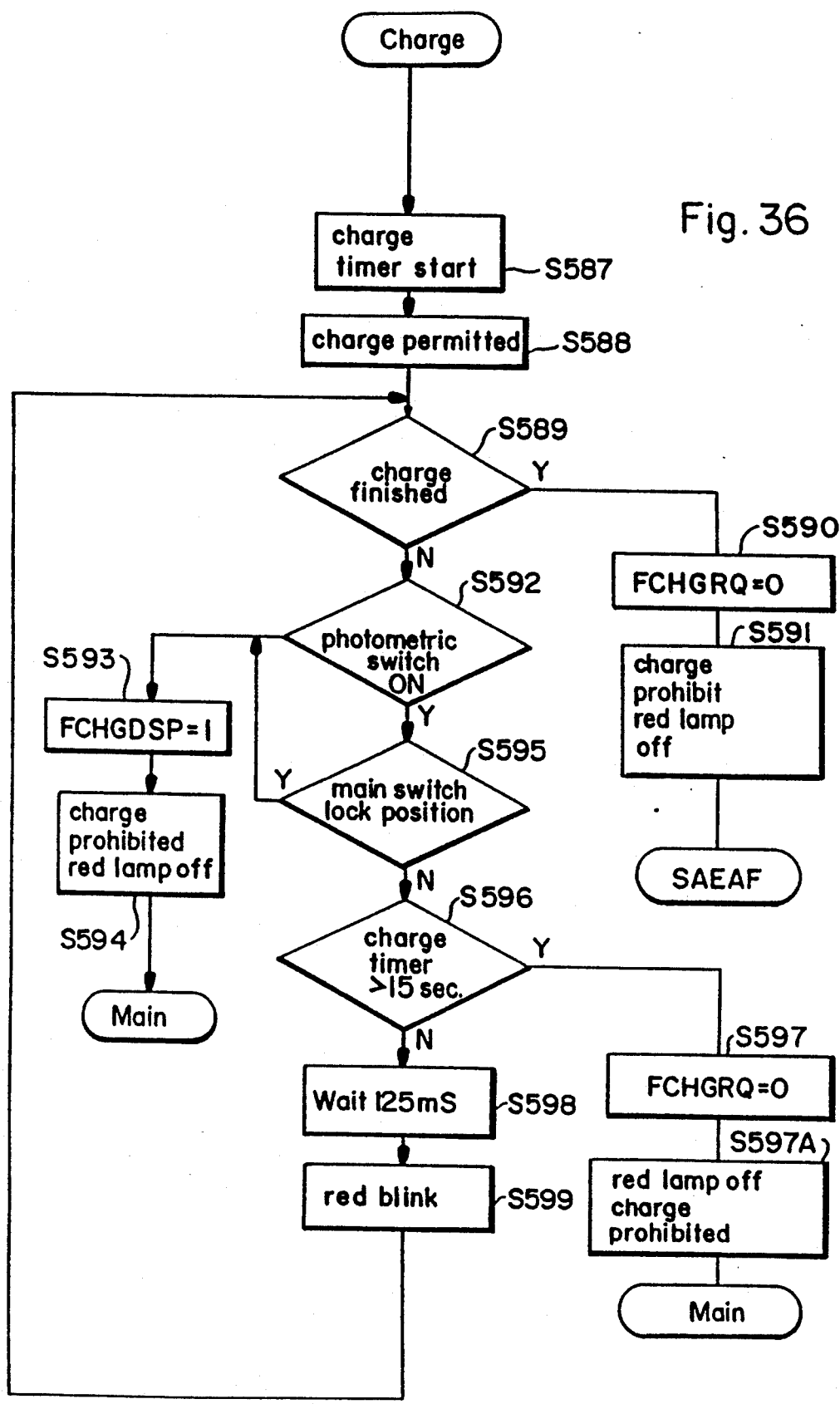
FIG. 36 illustrates the series of instructions that comprise a CHARGE operation that diverges from the MAIN program shown in FIG. 34.

At step 580, a test is made to determine whether flag FLASH equals 1, meaning that the strobe is required. If the use of the strobe flash is not necessary, processing diverges to a RELEASE PROCESSING operation, to be discussed below. When step 580 determines that the strobe flash is necessary, processing goes to step 582 to determine whether the strobe capacitor charging operation is completed. That is, a test is made to determine whether the use of the strobe flash is possible If it is possible to use the strobe, processing diverges to the RELEASE PROCESSING operation, after the red lamp indicator Rd is turned ON (step 584). The continuous illumination of the red lamp indicator Rd informs the photographer that the strobe will flash when the shutter release button is depressed. If it is not possible to fire the strobe, i.e., the strobe capacitor is not fully charged, processing diverges to a series of instructions that constitute a CHARGE operation, after setting flag FCHGRQ to 1 (step 586). The CHARGE operation is illustrated in FIG. 36.

When processing diverges to the CHARGE operation, a charging timer is started at step 587 and charging is permitted at step 588. Thereafter, step 589 checks whether the strobe capacitor charging is completed. When it is completed, processing goes to step 590, wherein flag FCHGRQ is set to 0, the charging of the strobe capacitor is inhibited and the red lamp indicator Rd is turned OFF (step 591). Processing then diverges back to the SAEAF operation, which was previously described.

When the charging of the strobe capacitor is not completed, processing goes to step 592 to determine whether the photometric switch SWS is ON. If the photometric switch SWS is OFF, processing goes to step 593 to set flag FCHGDSP to 1. The charging of the strobe capacitor is then inhibited and the red lamp indicator Rd is turned OFF (step 594). Processing then returns to the MAIN program listing of FIG. 34.

When processing returns to the MAIN program, it goes to step 564 to enable the blinking of the red lamp indicator Rd, because flag FCHGDSP was set to 1 at step 593. Afterwards, processing returns to step S3, after the 125 ms wait in step 50. Until the strobe capacitor is completely charged, the red lamp indicator Rd will blink, while processing goes through the loop comprising steps 3, 47, 550, 552, 556, 558, 566, 554, 564, 50 and 3. After the strobe capacitor charging operation is completed, the red lamp indicator Rd is turned off (step 568) and flags FCHGDSP, FCHGRQ and FCHGST are each set to 0 (step 570). Processing then goes to step 50.

If the shutter button is depressed and the photometric switch is set to ON when the strobe flash is needed but not ready to flash, the strobe capacitor will start charging. The red lamp indicator Rd will also start to blink while the capacitor is being charged.

If the photometric switch SWS is ON at step 592 in the CHARGE operation, processing goes to step 595 to check whether the lock switch SWL is ON. If it is, processing goes to step 593 so as to inhibit the charging of the strobe capacitor and turn off the red lamp indicator Rd (step 594), before returning to the MAIN program. If the main switch 30 is not in the LOCK position, processing goes to step 596, wherein a check is made to determine if the charge time exceeds 15 seconds. When the charge time exceeds 15 seconds, processing goes to step 597. If it does not exceed 15 seconds, processing goes to step 598.

At step 598, processing is suspended for 125 ms before the red lamp indicator Rd is activated to start blinking (step 599). When the photometric switch SWS is ON (meaning that a photographer intends to take a photograph), the red lamp indicator Rd blinks to inform the photographer that the strobe capacitor is being charged.

When the photometric switch SWS is set to OFF, processing is routed through steps 592, 593 and 594. In other words, the strobe capacitor is fully charged and the red lamp indicator Rd is turned OFF. Processing then diverges back to the MAIN program.

As long as the photometric switch SWS is ON, a program loop occurs between steps 589 and 599, so as to charge the strobe capacitor for a maximum of 15 seconds, or until the charging operation is complete, whichever comes first. This means that the strobe capacitor is charged via the instructions of the CHARGE operation while the shutter button is being depressed. On the other hand, when the shutter button is released, the charging of the strobe capacitor is carried out in response to the instructions of the MAIN program.

If the strobe capacitor charging is not completed within 15 seconds at step 596 of the CHARGE operation, processing goes to step 597 to set flag FCHGRQ to 0, turn off the red lamp indicator Rd and inhibit the charging of the strobe capacitor (step 597A) before diverging back to the MAIN program.

Figure 37:
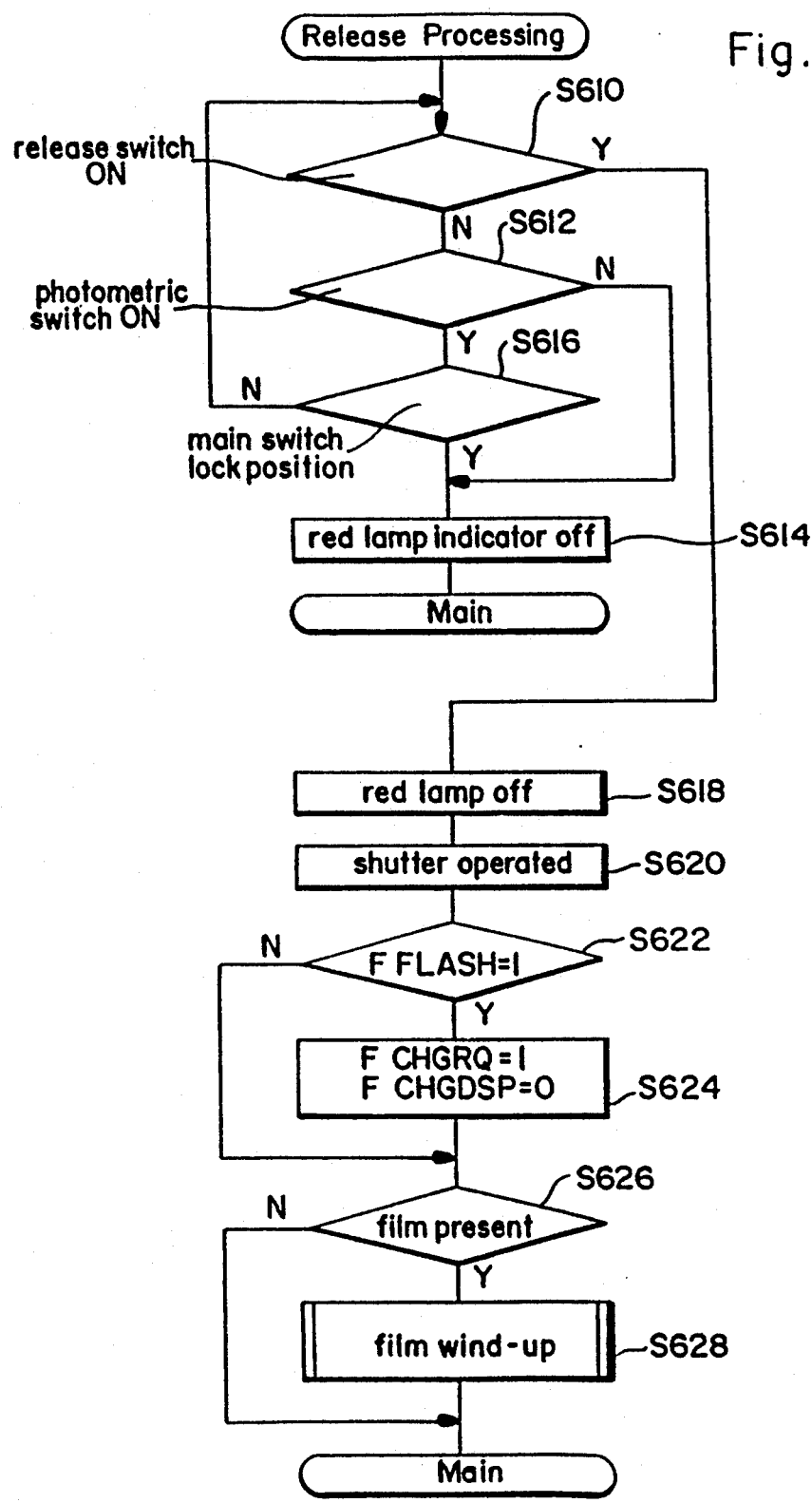
FIG. 37 illustrates a flowchart for a series of instructions for a RELEASE PROCESSING operation that diverges from the STROBE AUTOEXPOSURE/AUTOFOCUS operation shown in FIG. 35.

The RELEASE PROCESSING subroutine is illustrated in FIG. 37. In this subroutine, a determination is made in step 610, as to whether the release switch SWR is ON. When it is not ON, processing continues at step 612, which determines whether the photometric switch SWS is ON. If the photometric switch SWS is not ON, the red lamp indicator Rd is turned OFF at step 614 and processing returns to the MAIN program. However, if the photometric switch SWS is ON, processing goes to step 616, wherein a determination is made as to whether the lock switch SWL is ON. If the lock switch is not ON, the subroutine loops back to step 610. Therefore, if the release switch SWR is ON, the photometry switch SWS is ON and the lock switch SWL is OFF, the RELEASE PROCESSING subroutine performs a continuous loop between steps 610 and 616, until one of these three conditions change. That is, the loop is terminated by either setting the release switch SWR to OFF, setting the photometry switch SWS to OFF, or by turning the lock switch SWL to ON.

When the photometry switch SWS is set to OFF, or the lock switch SWL is ON, processing returns to the MAIN program.

When the release switch SWR is ON, the red lamp indicator Rd is turned OFF (step 618) and the shutter is released (step 620). Strobe 22 is then checked (in step 622) to determine whether it is ready to flash. If the strobe 22 is ready to flash (that is, Flag FLASH equals 1), processing proceeds to step 624, to set flags FCHGRQ to 1 and FCHGDSP to 0, so as to request charging of the battery for the next picture. In this sequence, because the photographer is not waiting to take a photo, flag FCHGDSP will be set to 0 and the red lamp indicator Rd will not light. Processing then goes to 626. If the strobe 22 is not ready to flash, processing goes from step 622 to step 626.

At step 626, it is determined if film is loaded in the camera. If film is loaded, processing goes to step 628 to execute the FILM WIND-UP subroutine to advance the film and then return to the MAIN program. If film is not loaded, the FILM WIND-UP subroutine is skipped and control returns to the MAIN program.

The operation of the charging of the strobe according the present invention provides the photographer with a clear indication as to the status of the charging process. This indication is shown to the photographer only when he attempts to take a photograph. When the photographer does not attempt to take a photograph, no charging status indication is shown, even if the charging of the flash is actually under way.

The present invention has been described with regard to a specific non-limiting preferred embodiment. It is to be understood that the present invention extends to all equivalents within the scope of the following claims.

What is claimed is:

1. A position detecting apparatus for detecting a position of a movable member relative to a reference position, said position detecting apparatus comprising:
   (a) a code information carrier having means associated therewith indicative of a plurality of relative codes and at least one absolute code representing a position of said movable member having a predetermined positional relation with said reference position, said at least one absolute code and said relative codes representing a code-change pattern of said code information carrier;
   (b) a code identifying device, operatively associated with said code information carrier, for movement relative thereto, and for identifying said codes;
   (c) means for recognizing changes of code information identified by said code identifying device as said movable member moves relative to said reference position;
   (d) code-check means for checking whether a respective one of said changes of code information coincides with said code-change pattern; and
   (e) means for discriminating whether said code identifying device has malfunctioned when said change of code information does not coincide with said code-change pattern, said change of code information being ignored when said discriminating means discriminates that said code identifying device has malfunctioned.

2. The position detecting apparatus according to claim 1, wherein said means for recognizing changes of code information comprises means for counting changes of code information.

3. The position detecting apparatus according to claim 1, wherein said code identifying device comprises a pick-up member and wherein said operative association of said code identifying device and said code information carrier comprises said pick-up member being in slidable contact with said code information carrier.

4. The position detecting apparatus according to claim 1, wherein said means for recognizing changes of code information comprises means for recognizing the position corresponding to each of said relative codes relative to the position corresponding to said absolute code.

5. The position detecting apparatus according to claim 1, further comprising means for assigning a value of a position code, which is indicative of a predetermined position of said movable member with respect to said reference position, in response to changes recognized by said means for recognizing changes of code information during movement of said movable member.

6. The position detecting apparatus according to claim 5, wherein said means for recognizing changes of code information comprises means (i) for temporarily storing an estimated predetermined code value and (ii) for determining whether the value of a code identified by said code identifying device, after said value is changed during movement of said movable member, coincides with said estimated code value, wherein said means for assigning a value of a position code assigns a position code value when said changed code value coincides with said estimated code value.

7. The position detecting apparatus according to claim 6, comprising means for displaying any of a plurality of predetermined positions of said movable member with respect to said reference position; means for inhibiting operation of said means for displaying when said changed code value does not coincide with said estimated code value; means for determining, if said changed code value does not coincide with said estimated code value, whether said changed code value is said absolute code; and means for assigning a position code value which is indicative of a particular position of said movable member with respect to said reference position if said changed code value is indicative of said absolute code.

8. The position detecting apparatus according to claim 7, further comprising means for determining, if said changed code value is not indicative of said absolute code, and if said changed code value does not coincide with said estimated code value, thereby defining an error, whether said error is a result of a malfunction of said code identifying device.

9. A position detecting apparatus for detecting an actual position of a movable member relative to a reference position, said position detecting apparatus comprising a code information carrier having means associated therewith indicative of a plurality of relative codes, and means for detecting changes in said relative codes as said movable member moves relative to said reference position;
   code-check means for checking whether a respective one of said changes in said relative codes coincides with a code-change pattern of said code information carrier; and
   means for discriminating whether said code identifying device has malfunctioned when said change in said relative codes does not coincide with said code-change pattern, said change in said relative codes being ignored when said discriminating means discriminates that said code identifying device has malfunctioned.

10. A position detecting apparatus for detecting an actual position of a movable member relative to a reference position, said position detecting apparatus comprising:
   (a) a code information carrier, comprising:
      (i) means for indicating a plurality of relative codes, each of said relative codes comprising more than one bit; and
      (ii) means for indicating an absolute code representing a position that has a predetermined positional relation to said means for indicating said plurality of relative codes;
   (b) a code identifying device, operatively associated with said code information carrier, for movement relative thereto and for identifying one of said relative codes and said absolute code; and
   (c) means for recognizing changes of code information identified by said code identifying device as said movable member moves relative to said reference position so as to determine said actual position of said movable member;
   (d) code-check means for checking whether a respective one of said changes of code information coincides with a code-change pattern of said code information carrier; and
   (e) means for discriminating whether said code identifying device has malfunctioned when said change of code information does not coincide with said code-change pattern, said change of code information being ignored when said discriminating means discriminates that said code identifying device has malfunctioned.

11. The position detecting apparatus according to claim 10, wherein said means for indicating said plurality of relative codes has at least one boundary, and said means for indicating said absolute code is located proximate one boundary of said means for indicating said plurality of relative codes.

12. The position detecting apparatus according to claim 11, wherein said means for indicating said plurality of relative codes comprises a repeating pattern of code information in which at least one piece of code information is repeated a plurality of times on said code information carrier, said means for recognizing changes of code information comprising means for recognizing said actual position of said at least one piece of code information relative to said means for indicating said absolute code.

13. The position detecting apparatus according to claim 10, wherein said means for indicating said plurality of relative codes comprises a lengthwise extending series of relative codes having a first end and a second end, said means for indicating said absolute code comprising means located proximate said first end and said second end of said means for indicating said plurality of relative codes, for identifying a respective unique reference position of said movable member.

14. A position detecting arrangement for detecting an actual position of a movable member relative to a reference position, said position detecting device comprising:
   (a) a code information carrier having means associated therewith for indicating a plurality of relatives codes, each of said relative codes having more than one bit of information, and means indicative of at least one unique position having a predetermined positional relation to said means for indicating said plurality of relative codes;
   (b) a code identifying device operatively associated with said code information carrier for movement relative thereto for identifying one of said relative codes of said means for indicating said plurality of relative codes;
   (c) means for recognizing changes of code information identified by said code identifying device as said movable member moves relative to said reference position, thereby determining said actual position of said movable member with respect to said reference position,
   wherein either said code information carrier or said code identifying device is a relatively fixed member, thereby defining said reference position, the other of said code information carrier or said code identifying device being fixed for movement with said movable member for relative movement with respect to said relatively fixed member;
   (d) a memory for storing positional information obtained by said means for recognizing changes of code information;
   (e) means for determining whether said positional information stored in said memory is lost therefrom; and
   (f) means for moving said movable member to said unique position in case said positional information in said memory is lost therefrom.

15. A position detecting arrangement for detecting an actual position of a movable member relative to a reference position, said position detecting device comprising:
   (a) a code information carrier having means associated therewith for indicating a plurality of relative codes, each of said relative codes having more than one bit of information, and means indicative of at least one unique position having a predetermined positional relation to said means for indicating said plurality of relative codes;
   (b) a code identifying device operatively associated with said code information carrier for movement relative thereto for identifying one of said relative codes of said means for indicating said plurality of relative codes;

(c) means for recognizing changes of code information identified by said code identifying device as said movable member moves relative to said reference position, thereby determining said actual position of said movable member with respect to said reference position, wherein either said code information carrier or said code identifying device is a relatively fixed member, thereby defining said reference position, the other of said code information carrier or said code identifying device being fixed for movement with said movable member for relative movement with respect to said relatively fixed member;

(d) a memory for storing positional information obtained by said means for recognizing changes of code information;

(e) means for determining whether said positional information stored in said memory is lost therefrom; and (f) means for providing a warning indication in case said information in said memory is lost therefrom.

16. A position detecting arrangement for detecting an actual position of a movable member which moves in accordance with a variation of a focal length of a zoom lens of a camera, relative to a reference position which is predetermined on said camera, said position detecting arrangements having a code information carrier and a code identifying device, said code information carrier comprising (i) means for indicating a plurality of relative codes, each of said relative codes comprising more than one bit of information, and (ii) means for indicating at least one unique actual position from an absolute code having a predetermined positional relation to said means for indicating a plurality of relative codes;

said code identifying device being operatively associated with said code information carrier for movement relative thereto for identifying one of said relative codes of said means for indicating a plurality of relative codes;

said position detecting arrangement further comprising:

(a) means for recognizing changes of code information identified by said code identifying device as said zoom lens moves relative to said reference position, thereby determining said actual position of said zoom lens with respect to said reference position;

(b) a memory for storing positional information obtained by said means for recognizing changes of code information;

(c) means for determining whether said positional information stored in said memory is lost therefrom; and (d) a zoom motor operatively connected to a cam ring associated with said zoom lens for moving said zoom lens to said unique position in case said positional information in said memory is lost therefrom.

17. A position detecting arrangement for detecting an actual position of a movable member which moves in accordance with a variation of a focal length of a zoom lens of a camera, relative to a reference position which is predetermined on said camera, said position detecting arrangement having a code information carrier and a code identifying device, said code information carrier comprising (i) means for indicating a plurality of relative codes, each of said relative codes comprising more than one bit of information, and (ii) means for indicating at least one unique actual position from an absolute code, said unique actual position having a predetermined positional relation to said means for indicating a plurality of relative codes;

said code identifying device being operatively associated with said code information carrier for movement relative thereto for identifying one of said relative codes of said means for indicating a plurality of relative codes;

said position detecting arrangement further comprising:

(a) means for recognizing changes of code information identified by said code identifying device as said zoom lens moves relative to said reference position, thereby determining said actual position of said zoom lens with respect to said reference position;

(b) a memory for storing positional information obtained by said means for recognizing changes of code information;

(c) means for determining whether said positional information stored in said memory is lost therefrom; and (d) means for providing a warning indication in case said information in said memory is lost therefrom.

18. A power zoom unit for a camera, comprising:

(a) a zoom lens provided in an assembly for permitting a focal length variation of said zoom lens;

(b) a zoom motor;

(c) a cam ring operatively connecting said zoom lens and said zoom motor for enabling said zoom motor to effect a variation in a focal length of said zoom lens assembly by changing an actual position of said zoom lens with respect to a reference position;

(d) means for generating a zoom code, comprising:

(i) a code plate provided on said cam ring and having a plurality of electrically conductive relative zoom lens position identifying areas and at least one absolute zoom lens position identifying area identifying said reference position; and (ii) a plurality of brushes adapted to be fixedly mounted with respect to a body of said camera in sliding conductive contact with said code plate for generating a zoom lens code that is related to a position of said zoom lens;

(e) means for counting changes in said zoom code with respect to said reference position identified by said absolute zoom lens code and for storing said counted changes as a position code corresponding to a predetermined focal length of said zoom lens;

(f) switches for operating said zoom motor for driving said zoom lens in a predetermined manner;

(g) means for controlling said zoom motor in response to said position code and as a function of the state of each of said switches for operating said zoom motor;

(h) means for determining whether at least part of the positional information stored by said means for storing is absent from said means for storing; and (i) means for correcting said means for controlling said zoom motor by rotating said cam ring to move said zoom lens to said reference position in response to a determination that said position code is absent from said means for storing said counted changes.

19. A power zoom unit for a camera, comprising:
(a) a zoom lens provided in an assembly for permitting a focal length variation of said zoom lens;
(b) a zoom motor;
(c) a cam ring operatively connecting said zoom lens and said zoom motor for enabling said zoom motor to effect a variation in said focal length of said zoom lens assembly by changing a position of said zoom lens with respect to a reference position;
(d) means for generating a zoom code, comprising:
  (i) a code plate provided on said cam ring and having a plurality of electrically conductive relative zoom lens position identifying area and at least one absolute zoom lens position identifying area identifying said reference position; and
  (ii) a plurality of brushes adapted to be fixedly mounted with respect to a body of said camera in sliding conductive contact with said code plate for generating a zoom code that is related to a position of said zoom lens;
(e) means for counting changes in said zoom code with respect to said reference position identified by said absolute zoom lens position identifying area and for storing said counted changes as a position code corresponding to a predetermined focal length of said zoom lens;
(f) means for indicating said predetermined focal lengths incrementally in response to incremental changes being counted by said means for counting changes in said zoom code;
(g) code-check means for checking whether at a respective one of said changes in said zoom code coincides with a code-change pattern which is formed by said relative zoom lens position identifying areas and said absolute zoom lens position identifying area; and
(h) means for discriminating whether said means for generating a zoom code has malfunctioned when said change in said zoom code does not coincide with said code-change pattern, said change in said zoom code being ignored when said discriminating means discriminates that said code identifying device has malfunctioned.

20. A power zoom unit for a camera, comprising:
(a) a zoom lens provided in an assembly for permitting a focal length variation of said zoom lens;
(b) a zoom motor;
(c) a cam ring operatively connecting said zoom lens and said zoom motor for enabling said zoom motor to effect a variation in said focal length of said zoom lens assembly by changing a position of said zoom lens with respect to a reference position:
(d) means for generating a zoom code, comprising:
  (i) a code plate provided on said cam ring, said code plate having a plurality of electrically conductive relative zoom lens position identifying area that form a predetermined pattern along said code plate, said code plate having at least one absolute zoom lens position identifying area that identifies said reference position; and
  (ii) a plurality of brushes that are adapted to be fixedly mounted with respect to a body of said camera in sliding conductive contact with said code plate for generating a zoom lens code that is related to a position of said zoom lens;
(e) means for obtaining position codes which correspond to respective focal lengths of said zoom lens, based upon changes of said zoom lens codes;
(f) means for storing a pattern of changes of said zoom lens code as said position of said zoom lens is changed with respect to said reference position;
(g) means for determining whether said stored pattern of changes coincides with said predetermined pattern of relative zoom lens position identifying areas along said code plate;
(h) means responsible to said determining means for further determining whether, if said stored pattern of changes does not coincide with said predetermined pattern of relative zoom lens position identifying areas along said code plate, said changes are due to any of said plurality of brushes not being in sliding conductive contact with said code plate; and
(i) means for inhibiting obtaining of said position code from changes of said zoom lens codes, in response to said further determining means determining that said changes are due to any of said plurality of brushes not being in sliding conductive contact with said code plate.

21. A variable focal length lens camera comprising:
(a) a movable lens;
(b) a motor for driving said lens for movement through a plurality of positions in a first direction and in a second direction;
(c) means for displaying an indication of a position at which said lens is positioned corresponding to one of said plurality of positions;
(d) a code information carrier having a plurality of areas associated therewith which are indicative of a plurality of relative codes, each of said relative codes being indicative of at least one position of said lens;
(e) a code identifying device, operatively associated with said code information carrier for movement relative thereto, for identifying said relative codes of said plurality of areas;
(f) means for controlling said motor for moving said lens in said first direction and in said second direction, said motor controlling means further including means for moving said lens a predetermined amount in either said first direction or said second direction, upon a stopping of movement of said lens in another of said first direction or said second direction;
(g) means for inhibiting, for a predetermined amount of time, said means for displaying an indication of the position at which said lens is positioned upon an identification of one of said relative codes having crossed a boundary of one of said areas and an adjacent one of said areas before the stopping of said movement of said lens;
(h) means for identifying changes in said relative codes as said lens moves relative to said camera;
(i) code-check means for checking whether a respective one of said changes in said relative codes coincides with a code-change pattern formed on said code information carrier; and
(j) means for discriminating whether said code identifying device has malfunctioned when said change in said relative codes does not coincide with said code-change pattern, said change in said relative codes being ignored when said discriminating means discriminates that said code identifying device has malfunctioned.

22. A position detecting arrangement for detecting the position of a movable member relative to a reference position, said position detecting device comprising:
- a power source that includes a removable battery;
- a code information carrier having means associated therewith indicative of a plurality of codes, each of said codes comprising more than one bit of information, and means indicative of at least one unique position having a predetermined positional relation to said means indicative of a plurality of codes;
- a code identifying device being operatively associated with said code information carrier for movement relative thereto for identifying one of said codes of said means indicative of a plurality of relative codes of said code information carrier;
- means for recognizing changes of code information identified by said code identifing device as said movable member moves relative to said reference position, thereby determining the position of said movable member with respect to said reference position, wherein one of said code information carrier and said code identifying device is relatively fixed, thereby defining said reference position, and the other of said code information carrier and said code identifying device is fixed for movement with said movable member for relative movement with respect to said one;
- a memory for storing positional information obtained by said means for recognizing changes of code information;
- means for determining whether said positional information stored in said memory is lost therefrom by determining whether a predetermined time has elapsed after the removal of said battery; and
- means for moving said movable member to said unique position in case said positional information in said memory is lost therefrom.

23. A position detecting arrangement for detecting the position of a movable member relative to a reference position, said position detecting device comprising:
- a power source including a removable battery;
- a code information carrier having means associated therewith indicative of a plurality of codes, each of said codes comprising more than one bit of information, and means indicative of at least one unique position having a predetermined positional relation to said means indicative of a plurality of codes;
- a code identifying device being operatively associated with said code information carrier for movement relative thereto for identifying one of said codes of said means indicative of a plurality of relative codes of said code information carrier;
- means for recognizing changes of code information identified by said code identifing device as said movable member moves relative to said reference position, thereby determining the position of said movable member with respect to said reference position, wherein one of said code information carrier and said code identifying device is relatively fixed, thereby defining said reference position, and the other of said code information carrier and said code identifying device is fixed for movement with said movable member for relative movement with respect to said one;
- a memory for storing positional information obtained by said means for recognizing changes of code information;
- means for determining whether said positional information stored in said memory is lost therefrom by determining whether a predetermined time has elapsed after the removal of said battery; and
- means for providing a warning indication in case said information in said memory is lost therefrom.

24. A position detecting apparatus according to claim 1, wherein either said code information carrier or said code identifying device is a relatively fixed member so as to define said reference position, the other of said code information carrier or said code identifying device being fixed for movement with aid movable member for relative movement with respect to said relatively fixed member.

25. A position detecting apparatus according to claim 10, wherein either said code information carrier or said code identifying device is relatively fixed so as to define said reference position, the other of said code information carrier or said code identifying device being fixed for movement with said movable member for relative movement with respect to said one of said plurality of relative codes.

26. The position detecting apparatus according to claim 1, wherein the movement of said movable member relative to said reference position is identifiable in terms of incremental steps of movement, said apparatus further comprising means for indicating each of said incremental steps of movement of said movable member relative to said reference position.

27. The position detecting apparatus according to claim 9, wherein said apparatus detects a position of a zoom lens of a camera relative to a reference position, said camera having a cam ring which rotates so as to effect a variation in a focal length of said zoom lens.

28. The position detecting apparatus according to claim 1, wherein said movable member moves in accordance with a variation of a focal length of a zoom lens of a camera, and wherein said reference position is fixed with respect to said camera.

29. The position detecting apparatus according to claim 28, wherein the movement of said movable member relative to said reference position is identifiable in terms of incremental steps of movement, said apparatus further comprising means for indicating each of said incremental steps of movement of said movable member relative to said reference position.

30. A position detecting apparatus for detecting the position of a movable member relative to a reference position, said position detecting apparatus comprising:
- (a) a code information carrier having means associated therewith indicative of a plurality of relative codes and at least one absolute code, representing a position of said movable member having a predetermined positional relation to said reference position;
- (b) a code identifying device, operatively associated with said information carrier, for movement relative to said code information carrier, and for identifying said codes;
- (c) means for recognizing changes in codes identified by said code identifying device as said movable member moves relative to said reference position, thereby obtaining positional information representative of the position of said movable member with respect to said reference position;

(d) memory means for storing positional information obtained by said means for recognizing changes of code information;

(e) means for determining whether at least part of said positional information stored in said memory means is absent from said memory means; and (f) means for compensating for the absence of at least part of said positional information stored in said memory means.

31. The position detecting apparatus according to claim 30, wherein said means for compensating comprises means for moving said movable member to the position represented by said absolute code when there is an absence of positional information stored by said memory means as determined by said means for determining.

32. The position detecting apparatus according to claim 30, wherein said means for compensating comprises means for providing a warning indication when there is an absence of positional information stored by said memory means as determined by said means for determining.

33. A power zoom unit for a camera, comprising:
(a) a zoom lens provided in an assembly for permitting said focal length variation of said zoom lens;
(b) a zoom motor;
(c) a cam ring operatively connecting said zoom lens and said zoom motor for enabling said zoom motor to effect a variation in said focal length of said zoom lens assembly by changing a position of said zoom lens with respect to a reference position;
(d) means for generating a zoom code, comprising:
  (i) a code plate provided on said cam ring and having a plurality of electrically conductive relative zoom lens position identifying areas and at least one absolute zoom lens position identifying area identifying said reference position; and
  (ii) a plurality of brushes adapted to be fixedly mounted with respect to a body of said camera in sliding conductive contact with said code plate for generating a zoom code that is related to a position of said zoom lens;
(e) means for counting changes in said zoom code with respect to said reference position identified by said absolute zoom lens position identifying area and for storing said counted changes as a position code corresponding to a predetermined focal length of said zoom lens;
(f) means for indicating said predetermined focal length incrementally in response to incremental changes being counted by said means for counting changes in said zoom code;
(g) means for determining whether the positional information stored by said means for storing is absent from said means for storing; and
(h) means for compensating for the absence of at least part of said positional information stored by said means for storing.

34. The power zoom unit for a camera according to claim 19, wherein said means for compensating comprises means for moving said zoom lens to the position represented by said absolute zoom lens position identifying area when there is an absence of positional information stored by said means for storing as determined by said means for determining.

35. The power zoom unit for a camera according to claim 33, wherein said means for compensating comprises means for providing a warning indication when there is an absence of positional information stored by said means for storing as determined by said means for determining.

36. A position detecting apparatus for detecting a position of a movable member relative to a reference position, said position detecting apparatus comprising:

a code information carrier having means indicative of a plurality of relative codes and at least one absolute code representing a position of said movable member having a predetermined positional relation with said reference position, said at least one absolute code and said relative codes representing a code-change pattern of said code information carrier;

a code identifying device, operatively associated with said code information carrier, for movement relative thereto, and for identifying said codes;

detecting means for detecting a code change when an identified code has changed to a code expected in accordance with said code-change pattern;

counting means for counting the number of occurrences of code changes;

means for determining a position of said movable member as a function of said member of occurrences of code changes; and code-check means for determining, when said identified code is not equal to the expected code, whether said identified code is equal to a stored previously identified code, and for determining that said code identifying device has malfunctioned when said identified code does not coincide with said stored previously identified code.

37. The position detecting apparatus according to claim 36, wherein said counting means comprises means for decrementing or incrementing a numerical value in accordance with the direction of movement of said movable member.

38. The position detecting apparatus according to claim 36, wherein said identified code is ignored by said counting means when said determining means determines that said code identifying device has malfunctioned.

39. The position detecting apparatus according to claim 36, further comprising means for storing said identified code as said stored previously identified code.

40. The position detecting apparatus according to claim 36, further comprising means for representing said identified code and said stored previously identified code in terms of first and second binary codes, respectively, wherein said code-check comprises means for inverting one of said first and second binary codes and means for ORing the other of said first and second binary codes with the inverted binary code, whereby if a zero results from the OR operation, said identified code does not coincide with said stored previously identified code and the code identifying device is determined to have malfunctioned.

41. A position detecting apparatus for detecting a position of a movable member relative to a reference position, said position detecting apparatus comprising:

an information carrier having means indicative of a plurality of codes, each representing one or more positions of said movable member relative to said reference position, said codes representing a code-change pattern of said code information carrier;

a code identifying device, operatively associated with said code information carrier, for movement relative thereto, and for identifying said codes;

detecting means for detecting a code change when an identified code has changed to a code expected in accordance with said code-change pattern;

counting means for counting the number of occurrences of code changes;

means for determining a position of said movable member as a function of said number of occurrences of code changes; and code-check means for determining, when said identified code is not equal to the expected code, whether said identified code is equal to a stored previously identified code, and for determining that said code identifying device has malfunctioned when said identified code does not coincide with said stored previously identified code.

42. The position detecting apparatus according to claim 41, wherein said counting means comprises means for decrementing or incrementing a numerical value in accordance with the direction of movement of said movable member.

43. The position detecting apparatus according to claim 41 wherein said identified code is ignored by said counting means when said determining means determiens that said code identifying device has malfunctioned.

44. The position detecting apparatus according to claim 41, further comprising means for storing said identified code as said stored previously identified code.

45. The position detecting apparatus according to claim 41, further comprising means for representing said identified code and said stored previously identified code in terms of first and second binary codes, respectively, wherein said code-check comprises means for inverting one of said first and second binary codes and means for ORing the other of said first and second binary codes with the inverted binary code, whereby if a zero results from the OR operation, said identified code does not coincide with said stored previously identified code and the code identifying device is determined to have malfunctioned.

46. A position detecting apparatus for detecting a position of a movable member relative to a reference position, said position detecting apparatus comprising:

an information carrier having means indicative of a plurality of codes, each representing one or more positions of said movable member relative to said reference position, said codes representing a code-change pattern of said code information carrier;

a code identifying device, operatively associated with said code information carrier, for movement relative thereto, and for identifying said codes;

detecting means for detecting changes of code identified by said identifying device;

counting means for counting an occurrence of a change of code when an identified code is changed to a code expected in accordance with said code-change pattern; and code-check means for determining, when said identified code is not equal to the expected code, whether said identified code is equal to a stored previously identified code, and for determining that said code identifying device has malfunctioned when said identified code does not coincide with said stored previously identified code.

47. The position detecting apparatus according to claim 46, wherein said counting means comprises means for decrementing or incrementing a numerical value in accordance with the direction of movement of said movable member.

48. The position detecting apparatus according to claim 46, wherein said identified code is ignored by said counting means when said determining means determines that said code identifying device has malfunctioned.

49. The position detecting apparatus according to claim 46, further comprising means for storing said identified code as said stored previously identified code.

50. The position detecting apparatus according to claim 46, further comprising means for representing said identified code and said stored previously identified code in terms of first and second binary codes, respectively, wherein said code-check comprises means for inverting one of said first and second binary codes and means for ORing the other of said first and second binary codes with the inverted binary code, whereby if a zero results from the OR operation, said identified code does not coincide with said stored previously identified code and the code identifying device is determined to have malfunctioned.

* * * * *

UNITED STATES PATENT AND TRADEMARK OFFICE
CERTIFICATE OF CORRECTION

PATENT NO. : 5,257,053
DATED : October 26, 1993
INVENTOR(S) : T. KOBAYASHI et al.

It is certified that error appears in the above-indentified patent and that said Letters Patent is hereby corrected as shown below:

On the cover, in Item [75], "Inventors", line 2, change "Chiba" to ---Chiba-ken---.
On the cover, in Item [75], "Inventors", line 3, change "Tochigi" to ---Tochigi-ken---.
On the cover, in Item [75], "Inventors", line 3, change "Saitama" to ---Saitama-ken---.
At column 54, line 23 (claim 14, line 6) change "relatives" to ---relative---.
At column 55, line 30 (claim 16, line 6) change "arrangements" to ---arrangement---.
At column 57, line 15 (claim 19, line 13) change "area" to ---areas---.
At column 57, line 60 (claim 20, line 14) change "area" to ---areas---.
At column 60, line 15 (claim 24, line 6) change "aid" to --said --.

Signed and Sealed this

Sixteenth Day of April, 1996

Attest:

BRUCE LEHMAN

*Attesting Officer*            *Commissioner of Patents and Trademarks*